(12) United States Patent
Nagata et al.

(10) Patent No.: US 11,568,908 B2
(45) Date of Patent: Jan. 31, 2023

(54) SEMICONDUCTOR DEVICE FOR DETECTING FAILURE IN ADDRESS DECODER

(71) Applicant: RENESAS ELECTRONICS CORPORATION, Tokyo (JP)

(72) Inventors: Shunya Nagata, Tokyo (JP); Yoshikazu Saito, Tokyo (JP); Takeshi Hashizume, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 0 days.

(21) Appl. No.: 17/158,301

(22) Filed: Jan. 26, 2021

(65) Prior Publication Data
US 2021/0241808 A1    Aug. 5, 2021

(30) Foreign Application Priority Data

Feb. 3, 2020    (JP) .............................. JP2020-016356

(51) Int. Cl.
| | | |
|---|---|---|
| *G11C 8/10* | (2006.01) | |
| *G11C 7/06* | (2006.01) | |
| *G11C 7/18* | (2006.01) | |
| *G11C 8/08* | (2006.01) | |

(52) U.S. Cl.
CPC .................. *G11C 8/10* (2013.01); *G11C 7/06* (2013.01); *G11C 7/18* (2013.01); *G11C 8/08* (2013.01)

(58) Field of Classification Search
None
See application file for complete search history.

(56) References Cited

U.S. PATENT DOCUMENTS

| | | | | |
|---|---|---|---|---|
| 4,912,710 A | * | 3/1990 | Rolfe ..................... | G11C 29/02 714/824 |
| 2007/0002616 A1 | * | 1/2007 | Wuidart ................... | G11C 8/20 365/185.04 |
| 2009/0046524 A1 | | 2/2009 | Chu et al. | |
| 2010/0107006 A1 | | 4/2010 | Fey et al. | |
| 2016/0283339 A1 | | 9/2016 | Yamate et al. | |
| 2017/0040043 A1 | * | 2/2017 | Weiner ..................... | G11C 7/24 |
| 2018/0358106 A1 | * | 12/2018 | Fujiwara .............. | G11C 29/024 |
| 2019/0080765 A1 | * | 3/2019 | Fujiwara .................. | G11C 8/10 |

FOREIGN PATENT DOCUMENTS

JP    2016-184189 A    10/2016

OTHER PUBLICATIONS

Extended European Search Report issued in corresponding European Patent Application No. 21154726.0-1203, dated Oct. 8, 2021.

* cited by examiner

*Primary Examiner* — J. H. Hur
(74) *Attorney, Agent, or Firm* — McDermott Will & Emery LLP

(57) ABSTRACT

A semiconductor device includes a memory array arranged in a matrix, a plurality of word lines provided corresponding to memory cell rows, a word driver for driving one of the plurality of word lines, a plurality of row select lines connected to the word driver, and a row decoder for outputting a row select signal to the plurality of row select lines based on input row address information. According to the embodiment, the semiconductor device can detect a failure of the address decoder in a simple method.

5 Claims, 67 Drawing Sheets

FIG. 5

|  | RT | RB |
|---|---|---|
| WL[15] | 1111 | 0000 |
| WL[14] | 1110 | 0001 |
| WL[13] | 1101 | 0010 |
| WL[12] | 1100 | 0011 |
| WL[11] | 1011 | 0100 |
| WL[10] | 1010 | 0101 |
| WL[9] | 1001 | 0110 |
| WL[8] | 1000 | 0111 |
| WL[7] | 0111 | 1000 |
| WL[6] | 0110 | 1001 |
| WL[5] | 0101 | 1010 |
| WL[4] | 0100 | 1011 |
| WL[3] | 0011 | 1100 |
| WL[2] | 0010 | 1101 |
| WL[1] | 0001 | 1110 |
| WL[0] | 0000 | 1111 |

FIG. 6

|      | CT  | CB  |
|------|-----|-----|
| Y[7] | 111 | 000 |
| Y[6] | 110 | 001 |
| Y[5] | 101 | 010 |
| Y[4] | 100 | 011 |
| Y[3] | 011 | 100 |
| Y[2] | 010 | 101 |
| Y[1] | 001 | 110 |
| Y[0] | 000 | 111 |

FIG. 7

| | FLAG |
|---|---|
| Word Lines WL Not Selected or Column Selecting Lines Y Not Selected | H |
| Word Line Single Selected (Regular) and Column Selecting Line Y Single Selected (Regular) | L |
| Word Lines WL Multiple Selected or Column Selecting Line Y Multiple Selected | H |
| Miss-selected | H |

| | RFLG |
|---|---|
| Word Lines WL Not Selected | H |
| Word Line Single Selected (Regular) | L |
| Word Lines WL Multiple Selected | H |

(B)

| | CFLG |
|---|---|
| Column Selecting Lines Y Not Selected | H |
| Column Selecting Line Single Selected (Regular) | L |
| Column Selecting Lines Y Multiple Selected | H |

(C)

| | Input Address (Latched Data) | Output Address | Comparison Address | Comparison Result |
|---|---|---|---|---|
| Word Lines WL Not Selected or Column Selecting Lines Y Not Selected | True Address | Partially Inverted Address | True Address | Fail |
| Word Line Single Selected (Regular) and Column Selecting Line Y Single Selected (Regular) | True Address | True Address | True Address | Pass |
| Word Lines WL Multiple Selected or Column Selecting Line Y Multiple Selected | True Address | Partially Inverted Address | True Address | Fail |
| Miss-selected | False Address | False Address | True Address | Fail |

FIG. 27

| | Input Address (Latched Data) | Output Address | Comparison Address | Comparison Result |
|---|---|---|---|---|
| Word Lines WL Not Selected or Column Selecting Lines Y Not Selected | True Address | Partially Inverted Address | True Address | Fail |
| Word Line Single Selected (Regular) and Column Selecting Line Y Single Selected (Regular) | True Address | True Address | True Address | Pass |
| Word Lines WL Multiple Selected or Column Selecting Line Y Multiple Selected | True Address | Partially Inverted Address | True Address | Fail |
| Miss-selected | False Address | False Address | True Address | Fail |

FIG. 37

| | RDL0 CDL0 | RDL1 CDL1 |
|---|---|---|
| Word Lines WL Not Selected or Column Selecting Lines Y Not Selected | H | H |
| Word Line Single Selected (Regular) and Column Selecting Line Y Single Selected (Regular) | H | L |
| Word Lines WL Multiple Selected or Column Selecting Line Y Multiple Selected | L | L |

FIG. 39

| | FLAG |
|---|---|
| Word Lines WL Not Selected or Column Selecting Lines Y Not Selected | H |
| Word Line Single Selected (Regular) and Column Selecting Line Y Single Selected (Regular) | L |
| Word Lines WL Multiple Selected or Column Selecting Line Y Multiple Selected | H |

FIG. 44

| (A) | CBO |
|---|---|
| Column Selecting Lines Y Not Selected | Not 111 |
| Column Selecting Line Single Selected (Regular) | 111 |
| Column Selecting Lines Y Multiple Selected | Not 111 |

| (B) | NONE | MULTI |
|---|---|---|
| Word Lines WL Not Selected | H | L |
| Word Line Single Selected (Regular) | L | L |
| Word Lines WL Multiple Selected | L | H |

| (C) | FLAG |
|---|---|
| Word Lines WL Not Selected or Column Selecting Lines Y Not Selected | H |
| Word Line Single Selected (Regular) and Column Selecting Line Y Single Selected (Regular) | L |
| Word Lines WL Multiple Selected or Column Selecting Line Y Multiple Selected | H |

FIG. 53

| | PDL0 | PDL1 |
|---|---|---|
| Word Lines WL Not Selected or Column Selecting Lines Y Not Selected | L | L |
| Word Line Single Selected (Regular) and Column Selecting Line Y Single Selected (Regular) | H | L |
| Word Lines WL Multiple Selected or Column Selecting Line Y Multiple Selected | H | H |
| Miss-selected | L | L |

FIG. 55

| | FLAG |
|---|---|
| Word Lines WL Not Selected or Column Selecting Lines Y Not Selected | H |
| Word Line Single Selected (Regular) and Column Selecting Line Y Single Selected (Regular) | L |
| Word Lines WL Multiple Selected or Column Selecting Line Y Multiple Selected | H |
| Miss-selected | H |

SEMICONDUCTOR DEVICE FOR DETECTING FAILURE IN ADDRESS DECODER

CROSS-REFERENCE TO RELATED APPLICATIONS

The disclosure of Japanese Patent Application No. 2020-016356 filed on Feb. 3, 2020 including the specification, drawings and abstract is incorporated herein by reference in its entirety.

BACKGROUND

The present disclosure relates in particular to fault detection of address decoders.

Recently, there are troubles such as the word line is not activated due to the failure of the address decoder, or a plurality of word lines are selected in one time. In such cases, it is known to detect a failure by using ECC (Error Correction Code) circuits because some data that is not normal is read out.

However, while the ECC circuit is capable of fault detection for 1-bit detection, 2-bit detection, and the like, there is a problem that the detection capability for data of which all are unknown is low. In this respect, a method of improving the detection accuracy by reading data a plurality of times has been proposed. However, there is a problem that complicated work of multiple times of data reading is required.

In this regard, there are disclosed techniques below.

[PATENT DOCUMENT 1] Japanese Unexamined Patent Application Publication No. 2016-184189

SUMMARY

The present disclosure provides a semiconductor device capable of detecting a failure of an address decoder in a simple manner. Other problems and novel features will become apparent from the description of the specification and drawings.

According to one embodiment, a semiconductor device includes a memory array arranged in a matrix, a plurality of word lines provided corresponding to memory cell rows, a word driver for driving one of the plurality of word lines, a plurality of row select lines connected to the word driver, and a row decoder for outputting a row select signal to the plurality of row select lines based on input row address information. The semiconductor device includes a first row coder connected to a plurality of word lines and generating first row address information based on signal levels of the plurality of word lines, and a second row coder connected to the plurality of word lines and generating second row address information complementary to the first row address information based on signal levels of the plurality of word lines. The semiconductor device includes a first row determination circuit for outputting a first row determination signal based on the comparison result by comparing the first row address information and the second row address information.

According to one embodiment, the semiconductor device can detect a failure of the address decoder in a simple method.

BRIEF DESCRIPTION OF THE DRAWINGS

FIG. 5 is a diagram illustrating a relationship between the selection of the word line WL and the first row address information RT and the second row address information RB to be encoded.

FIG. 6 is a diagram illustrating a relationship between the first column address information CT and the second column address information CB to be encoded with the selection of the column selection line Y.

FIG. 7 is a diagram illustrating an anomaly of the row decoder 4 and the column decoder 10 according to the first embodiment.

FIG. 17 is a diagram illustrating an anomaly of the row decoder 4 and the column decoder 10 according to the second embodiment.

FIG. 27 is a diagram illustrating an anomaly of the row decoder 4 and the column decoder 10 according to the third embodiment.

FIG. 37 is a diagram illustrating a detection result of the decoder failure detection circuit 110 according to the fourth embodiment.

FIG. 39 is a diagram illustrating an anomaly of the row decoder 4 and the column decoder 10 according to the fourth embodiment.

FIG. 44 is a diagram illustrating an anomaly of the row decoder 4 and the column decoder 10 according to a modification of the fourth embodiment.

FIG. 53 is a diagram illustrating a detection result of the detection circuit 132 according to the fifth embodiment.

FIG. 55 is a diagram illustrating an anomaly of the row decoder 4 and the column decoder 10 according to the fifth embodiment.

DETAILED DESCRIPTION

Figure 1:
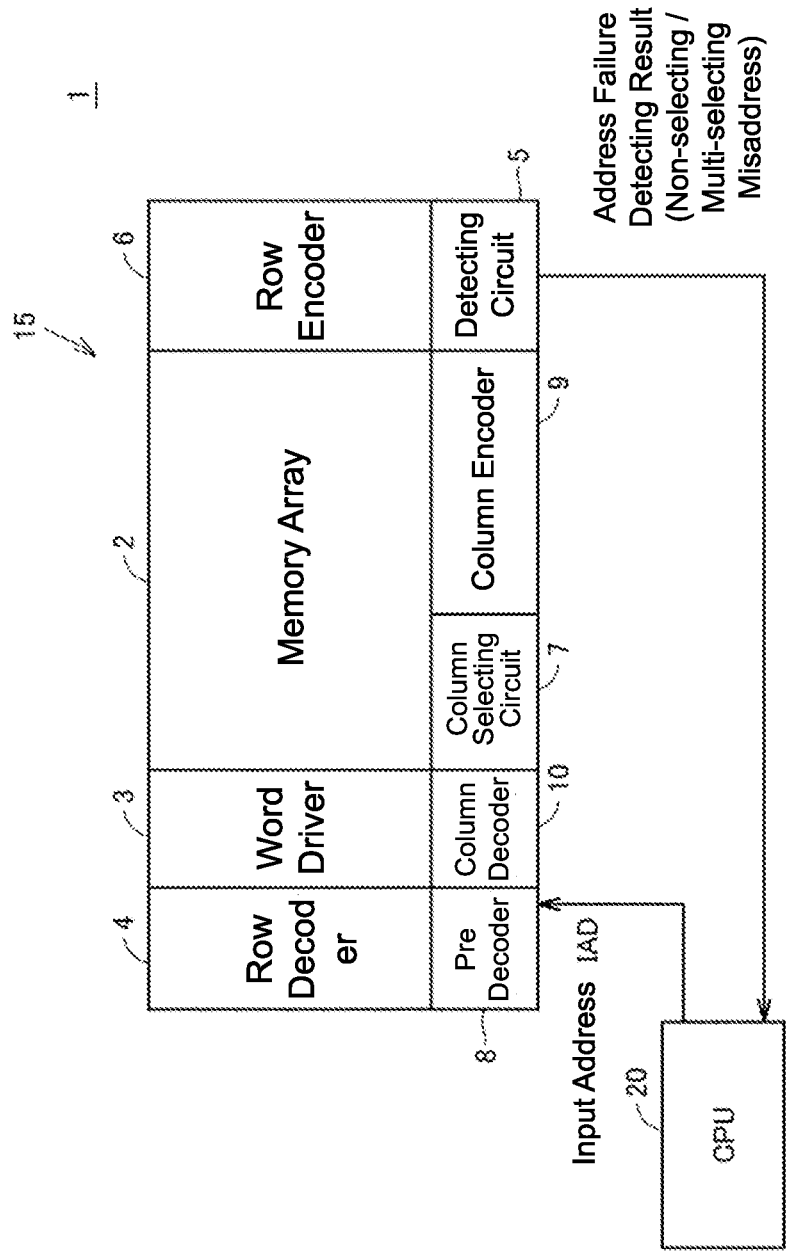
FIG. 1 is a diagram illustrating an outline of a semiconductor device 1 according to a first embodiment.

In the drawings, the same or corresponding components are denoted by the same reference numerals, and description thereof will not be repeated.

Embodiment 1

FIG. 1 is a diagram for explaining an outline of a semiconductor device 1 according to the first embodiment.

Referring to FIG. 1, a semiconductor device 1 includes a memory macro 15 and a CPU20.

CPU20 controls the memory macro 15 to acquire data stored in the memory macro 15.

The memory macro 15 includes a memory array 2, a word driver 3, a row decoder 4, a detection circuit 5, a row encoder 6, a column selection circuit 7, a pre-decoder 8, a column encoder 9, and a column decoder 10.

The memory array 2 includes a plurality of memory cells MC arranged in a matrix.

The memory array 2 includes a plurality of word lines WL provided corresponding to the memory cell rows, respectively, and a plurality of bit lines BL provided corresponding to the memory cell rows, respectively.

The word driver 3 drives one word line WL among a plurality of word lines WL provided respectively corresponding to the memory cell rows.

A plurality of row select lines RWL are provided between the row decoder 4 and the word driver 3.

The pre-decoder 8 decodes the input address information IAD and outputs it to the row decoder 4 and the column decoder 10 separately into the input row address information RAD and the input column address information CAD, respectively. As an example, in this example, the input row address information RAD of 4 bits is divided into the input row address information RAD of 7 bits and the input column address information CAD of 3 bits, and is output to the row decoder 4 and the column decoder 10, respectively.

The row decoder 4 outputs a row selection signal to a plurality of row selection lines RWL based on the input row address information RAD.

The word driver 3 selects the word line WL according to the low selection signal and rises to the "H" level.

Detection circuit 5 detects faults in row decoder 4 and column decoder 10.

The row encoder 6 is connected to a plurality of word lines WL, and encodes row address information on the basis of the rising edge of the selected word line WL.

The column selection circuit 7 selects one of the plurality of bit lines BL.

A plurality of column selection lines Y are provided between the column decoder 10 and the column selection circuit 7.

The column decoder 10 outputs a column selection signal to a plurality of column selection lines Y based on the input column address information CAD.

The column encoder 9 is connected to a plurality of column select lines Y, and encodes column address information based on the rising edge of the selected column select line Y.

Figure 2:
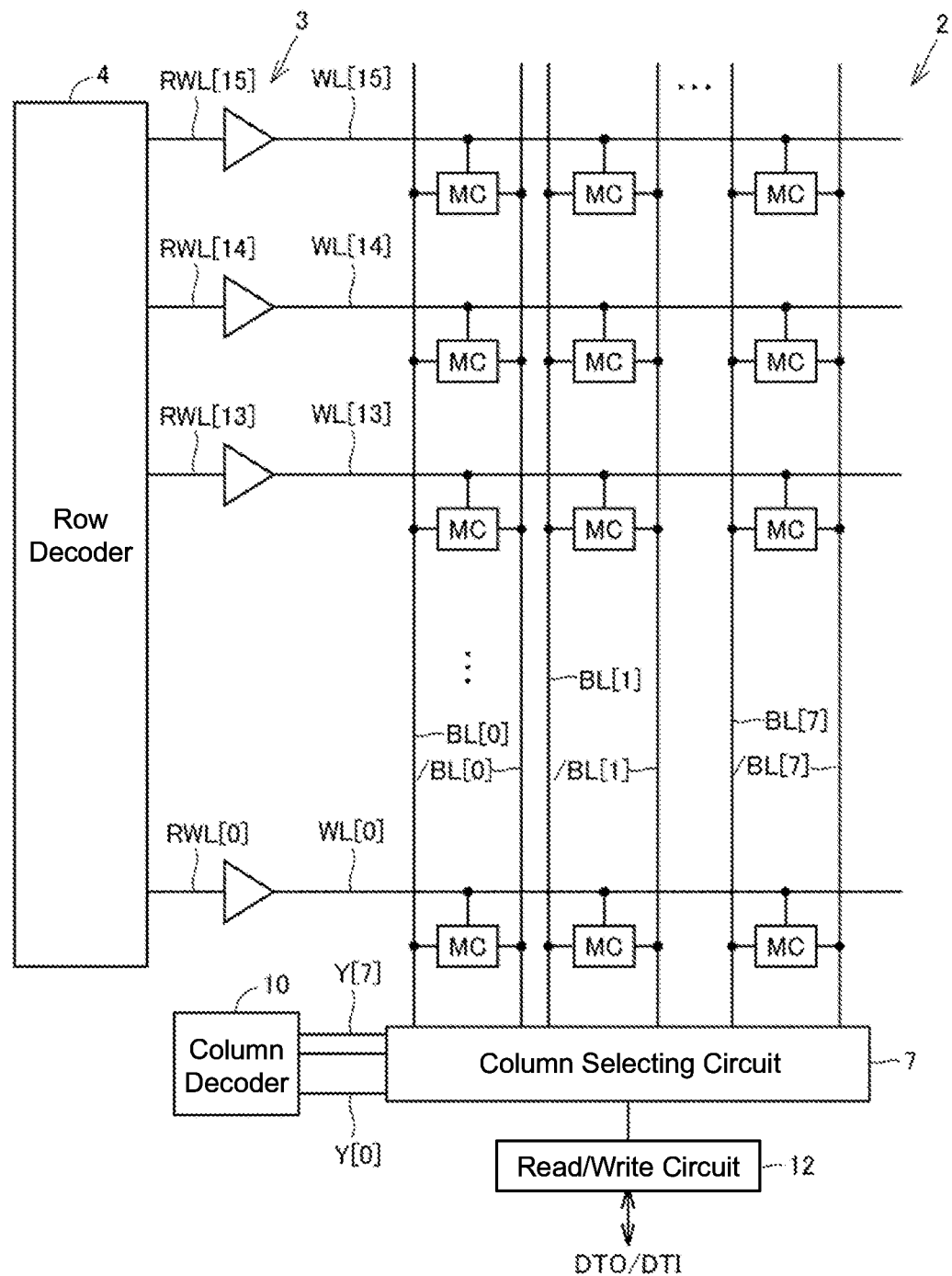
FIG. 2 is a diagram illustrating a memory array 2 and its peripheral circuits according to the first embodiment.

FIG. 2 is a diagram illustrating a memory array 2 and its peripheral circuits according to the first embodiment.

Referring to FIG. 2, the memory array 2 includes a plurality of memory cells MC arranged in a matrix, a plurality of word lines WL provided corresponding to each memory cell row, and a plurality of bit lines BL, /BL provided corresponding to each memory cell row.

In the present exemplary embodiment, word lines WL [0] to WL [15] are provided corresponding to the memory cell rows, respectively.

Bit lines BL[0] to BL[7] and complementary bit lines /BL[0] to /BL[7] are provided corresponding to the memory cell columns, respectively.

The row decoder 4 outputs a row selection signal to a plurality of row selection lines RWL[0] to RWL[15] based on the input row address information RAD.

The word driver 3 is connected to a plurality of row selection lines RWL[0] to RWL[15], and includes a driver unit for driving one word line WL among the plurality of word lines WL[0] to WL[15]. For example, when the row selection line RWL[0] is set to the "H" level, the word driver 3 selects the word line WL[0]. Specifically, the word line WL[0] is set to the "H" level. The same applies to other word lines WL.

The column decoder 10 outputs a column selection signal to a plurality of column selection lines Y[0] to Y[7] based on the input column address information CAD.

The column selection circuit 7 is connected to a plurality of column selection lines Y[0] to Y[7] to select one of the plurality of bit lines BL. Specifically, connecting the read circuit/write circuit 12 and the bit line BL. The read/write circuit 12 outputs a data signal read through the selected bit line BL as read data DTO at the time of data reading. The read/write circuit 12 writes the input write data DTI to the memory cell MC via the selected bit line BL at the time of data writing. Although 1-bit data reading and data writing are described in this example, the present invention is not limited to this, and it is of course possible to perform parallel reading and parallel writing of a plurality of bits (8 bits, 16 bits, etc.).

Figure 3:
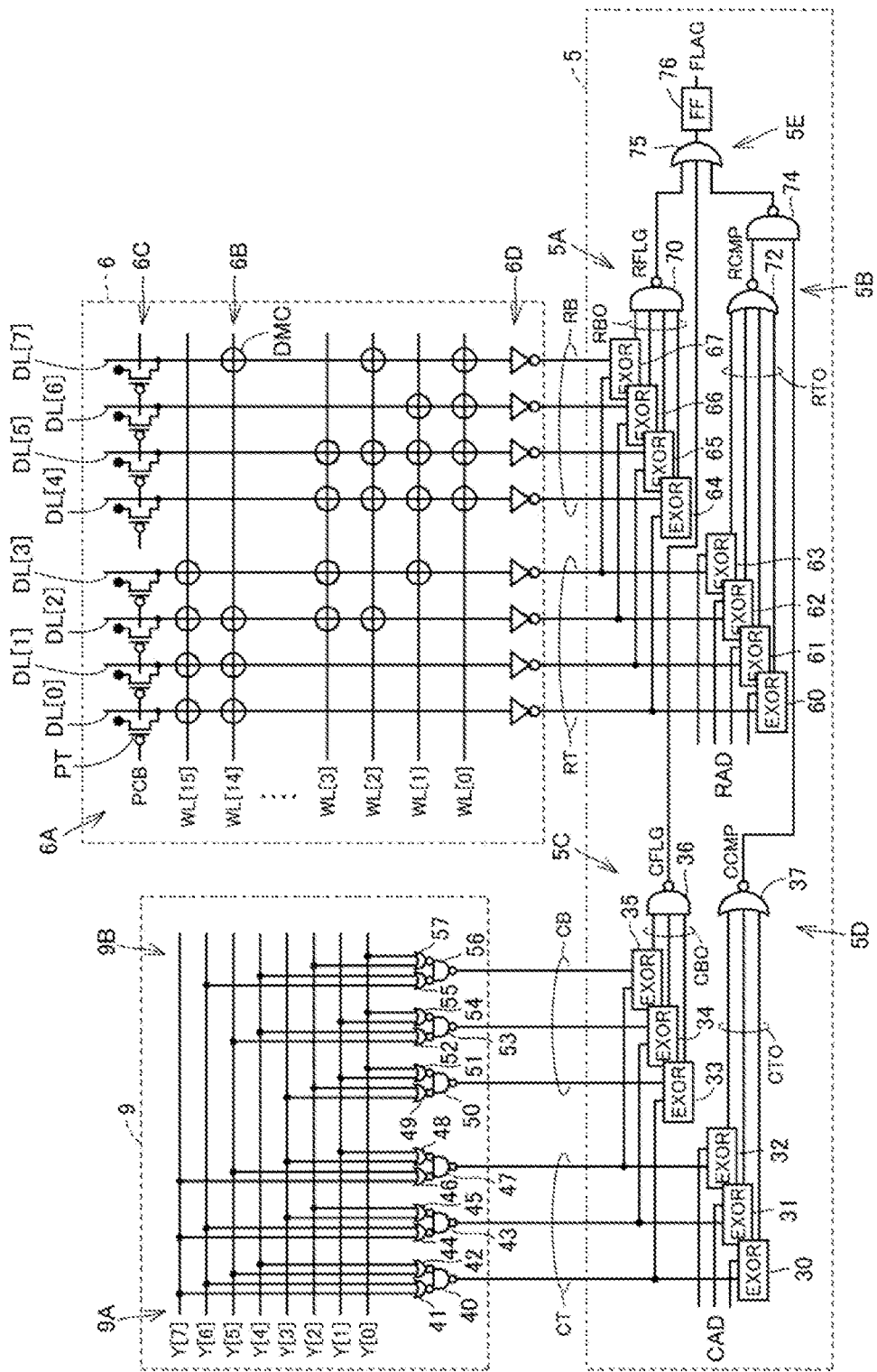
FIG. 3 is a diagram illustrating a circuit configuration of a detection circuit 5, a row encoder 6 and a column encoder 9 of the first embodiment.

FIG. 3 is a diagram illustrating a detection circuit 5 according to the first embodiment, the circuit configuration of the row encoder 6 and the column encoder 9.

Referring to FIG. 3, the row encoder 6 includes a first row encoder 6A, a second row encoder 6B, a precharge circuit 6C, and a driver circuit 6D.

The first row coder 6A includes a plurality of word lines WL[0] to WL[15], a plurality of data lines DL[0] to DL[3], and a plurality of dummy cells DMCs arranged in a predetermined first pattern in a matrix at positions where the word lines WL and the data lines DL intersect.

The second row coder 6B includes a plurality of word lines WL[0] to WL[15], a plurality of data lines DL[4] to DL[7], and a plurality of dummy cells DMCs arranged in a predetermined second pattern in a matrix.

The precharge circuit 6C is provided corresponding to a plurality of data lines DL[0] to DL[7] respectively, and includes a plurality of precharge transistors PT for precharging a plurality of data lines DL[0] to DL[7] to a predetermined voltage. The precharge transistor PT operates according to the control signal PCB, and precharges a plurality of data lines DL[0] to DL[7] to a predetermined voltage when the control signal PCB is at the "L" level.

The driver circuit 6D includes inverters provided corresponding to the plurality of data lines DL[0] to DL[7], respectively, and inverting and outputting data of the plurality of data lines DL[0] to DL[7].

Figure 4:
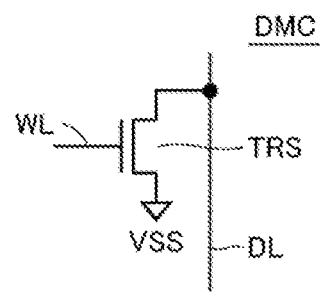
FIG. 4 is a diagram illustrating a configuration of a dummy cell DMC according to a first embodiment.

FIG. 4 is a diagram illustrating a configuration of a dummy cell DMC according to the first embodiment.

Referring to FIG. 4, the dummy cell DMC includes a transistor TRS. The transistor TRS is connected between the fixed voltage VSS and the data line DL, and the gate is connected to the word line WL. Therefore, when the word line WL is at the "H" level, the transistor TRS is turned on, and the data line DL is set to the "L" level.

Therefore, when the word line WL is set to the "H" level, the dummy cell DMC arranged at the position crossing the word line WL and the data line DL becomes conductive, and the data line DL is set to the "L" level.

Referring back to FIG. 3, the plurality of dummy cells DMCs provided in the first row coder 6A are arranged in predetermined first patterns so as to encode address information for selecting any word line WL when the word line WL is selected.

For example, when the word line WL[0] is selected, the dummy cell DMC is not arranged at a position crossing the word line WL[0] and the data lines DL[0] to DL[3].

Therefore, the data lines DL[0] to DL[3] maintain the pre-charged predetermined voltage level ("H" level).

In response to this, the driver circuit 6D inverts the data of the data lines DL[0] to DL[3] and outputs the inverted data ("L" level).

In this example, when the output of the driver-circuit 6D is "H" level, the data is set to "1". When the output of the driver-circuit 6D is "L" level, the data shall be "0".

In this instance, when the word line WL[0] is selected, the first row coder 6A generates the first row address data RT ("0000") by the driver circuits 6D via the data lines DL[0] to DL[3]. The first row coder 6A generates the first row address data RT for selecting the word line WL via the data lines DL[0] to DL[3] in the same manner even when another word line WL is selected.

The second row coder 6B generates second row address information RB complementary to the first row coder 6A.

The plurality of dummy cells DMCs provided in the second row coder 6B are arranged in predetermined second patterns so as to encode address information for selecting any word line WL when the word line WL is selected. Incidentally, the second pattern of the plurality of dummy cells DMC provided in the first pattern and the second row encoder 6B of the plurality of dummy cells DMC provided on the first row encoder 6A, in accordance with the logic of the detecting circuit 5, it may be a pattern opposite to each other.

For example, when the word line WL[0] is selected, the dummy cell DMC is arranged at a position crossing the word line WL[0] and the data lines DL[4] to DL[7].

Therefore, the data lines DL[4] to DL[7] are set to the "L" level from the precharged predetermined voltage level. The driver circuit 6D inverts the data of the data line DL and outputs the inverted data. When the driver-circuit 6D is "L" level, the data shall be "0". When the driver-circuit 6D is "H" level, the data shall be "1".

In this instance, when the word line WL[0] is selected, the second row coder 6B generates the second row address data RB ("1111") by the driver circuits 6D via the data lines DL[4] to DL[7]. The second row coder 6B generates the second row address data RB for selecting the word line WL via the data lines DL[4] to DL[7] in the same manner when another word line WL is selected.

FIG. 5 is a diagram illustrating the relationship between the selection of the word line WL and the encoded first row address information RT and the second row address information RB.

As shown in FIG. 5, the first row address information RT and the second row address information RB according to the selection of the word lines WL[0] to WL[15] are shown.

The first row address information RT and the second row address information RB are shown as complementary relationships to each other.

Referring back to FIG. 3, the column encoder 9 includes a first column encoder 9A and a second column encoder 9B.

The first column encoder 9A includes a plurality of column select lines Y[0]-Y[7], a plurality of NOR circuitry 41,42,44,45,46,48, and a plurality of NAND circuitry 40,43, 47.

A plurality of NOR circuitry and a plurality of NAND circuitry provided in the first column encoder 9A are connected in a predetermined combination with the column select line Y so as to decode the address information for selecting the column select line Y if any column select line Y is selected.

Specifically, the NOR circuit 41 receives inputs from the column select line Y[7] and the column select line Y[6], and outputs a NOR logical operation result. The NOR circuit 42 receives inputs from the column select line Y[5] and the column select line Y[4], and outputs a NOR logical operation result. The NOR circuit 44 receives inputs from the column select line Y[7] and the column select line Y[6], and outputs a NOR logical operation result. The NOR circuit 45 receives inputs from the column select line Y[3] and the column select line Y[2], and outputs a NOR logical operation result. The NOR circuit 46 receives inputs from the column select line Y[7] and the column select line Y[5], and outputs a NOR logical operation result. The NOR circuit 48 receives inputs from the column select line Y[3] and the column select line Y[1], and outputs a NOR logical operation result.

NAND circuit 40 outputs a NAND logical operation result by receiving an input from the NOR circuit 41 and 42.

NAND circuit 43 outputs NAND logical operation result by receiving an input from the NOR circuit 44 and 45.

NAND circuit 45 outputs NAND logical operation result by receiving an input from the NOR circuit 46 and 48.

For example, when the column select line Y[7] is selected, the NOR circuits 41, 44, and 46 connected to the column select line Y[7] output an "L" level. NAND circuitry 40, 43, 47 in accordance with this outputs a "H" level, respectively.

In this instance, the first column encoder 9A generates the first column address information CT ("111") when the column selection line Y[7] is selected. The first column encoders 9A generate first column address information CT for selecting the column selection lines Y in the same manner when the column selection lines Y are selected.

The second column encoder 9B generates second column address information CB complementary to the first column encoder 9A.

The second column encoder 9B includes a plurality of column select lines Y[0]-Y[7], a plurality of NOR circuitry 49,51,52,54,55,57, and a plurality of NAND circuitry 50,53, 56. The first column encoder 9A and the second column encoder 9B may be configured using dummy cells DMCs, similarly to the first row encoder 6A and the second row encoder 6B.

A plurality of NOR circuitry and a plurality of NAND circuitry provided in the second column encoder 9B are connected in a predetermined combination with the column select line Y so as to decode the address information for selecting the column select line Y if any column select line Y is selected.

Specifically, the NOR circuit 49 receives inputs from the column select line Y[3] and the column select line Y[2], and outputs a NOR logical operation result. The NOR circuit 51 receives inputs from the column select line Y[1] and the column select line Y[0], and outputs a NOR logical operation result. The NOR circuit 52 receives inputs from the column select line Y[5] and the column select line Y[4], and outputs a NOR logical operation result. The NOR circuit 54 receives inputs from the column select line Y[1] and the column select line Y[0], and outputs a NOR logical operation result. The NOR circuit 55 receives inputs from the column select line Y[6] and the column select line Y[4], and outputs a NOR logical operation result. The NOR circuit 57 receives inputs from the column select line Y[2] and the column select line Y[0], and outputs a NOR logical operation result.

NAND circuit 50 outputs a NAND logical operation result by receiving an input from the NOR circuit 49 and 51.

NAND circuit 53 outputs a NAND logical operation result by receiving an input from the NOR circuit 52 and 54.

NAND circuit 56 outputs NAND logical operation result by receiving an input from the NOR circuit 55 and 57.

For example, if column select line Y[7] is selected, the NOR circuit is not connected. Thus, NAND circuitry 50, 53, 56 maintains a "L" level.

In this instance, the second column encoders 9B generate the second column address information CB ("000") when the column selection line Y[7] is selected. The second column encoders 9B generate second column address information CB for selecting the column selection lines Y in the same manner when the column selection lines Y are selected.

FIG. 6 is a diagram for explaining a relationship between selection of the column selection line Y and encoded first column address information CT and second column address information CB.

As shown in FIG. 6, the first column address information CT and the second column address information CB according to the selection of the column selection lines Y[0] to Y[7] are shown.

The case where the first column address information CT and the second column address information CB are complementary to each other is shown.

Referring back to FIG. 3, the detecting circuit 5 includes a first row judging circuit 5A, a second row judging circuit 5B, a first column judging circuit 5C, a second column judging circuit 5D, and a synthesizing circuit 5E.

The first row determination circuit 5A includes EXOR circuitry 64-67 and NAND circuitry 70.

The second row determination circuit 5B includes EXOR circuitry 60-63 and NOR circuitry 72.

The first column determination circuit 5C includes EXOR circuitry 33-35 and NAND circuitry 36.

The second column determination circuit 5D includes EXOR circuitry 30-32 and NAND circuitry 37.

The combining circuit 5E includes a NAND circuit 74, an OR circuit 75, and a flip-flop (FF) 76.

The first row determination circuit 5A outputs a first row determination signal RFLG based on the comparison result by comparing the first row address information RT and the second row address information RB.

EXOR circuits 64 to 67 receive respective one-bit inputs of the first row address information RT and the second row address information RB, and outputs EXOR logical operation result RBO to NAND circuit 70.

The first row address information RT and the second row address information RB are complementary to each other when they are normal.

Therefore, when the first row address information RT and the second row address information RB are complementary to each other (normal), EXOR logical operation results RBO of EXOR circuits 64 to 67 all output "H" levels. In this case, NAND circuit 70 outputs a first low determination signal RFLG ("L" level). On the relationship hand, when the first row address information RT and the second row address information RB are not complementary to each other (when they are not normal), at least one of EXOR logical operation results RBO of EXOR circuits 64 to 67 outputs "L" levels. In this case, NAND circuit 70 outputs a first low determination signal RFLG ("H" level).

The first row determination signal RFLG ("H" level), it is determined that the first row address information RT and the second row address information RB is not complementarily related (if not normal). That is, it is determined that the row decoder 4 has an anomaly and is not normally decoded.

Specifically, due to the anomaly of the row decoder 4, a multi-selection abnormality when a plurality of word lines WL is not selected and a multi-selection abnormality when a plurality of word lines WL among a plurality of word lines WL is selected are determined.

The second row determination circuit 5B compares the input row address information RAD with the first row address information RT, and outputs a second row determination signal RCMP based on the result of the comparison.

EXOR circuits 60 to 63 receive input of the input row address information RAD and the first row address information RT bit by bit, respectively, and outputs EXOR logical operation result RTO to the NOR circuit 72.

The input row address information RAD and the first row address information RT have the same relationship when they are normal.

Therefore, when the input low-address information RAD and the first low-address information RT are in the same relationship (when they are normal), all EXOR logical operation results RTO of EXOR circuitry 60 to 63 output the "L" level. In this case, NOR circuit 72 outputs a second low determination signal RCMP ("H" level). On the other hand, when the input row address information RAD and the first row address information RT do not have the same relation (when the input row address information RAD and the first row address information RT are not normal), at least one of EXOR logical operation results RTO of EXOR circuits 60 to 63 outputs "H" levels. In this case, NOR circuit 72 outputs a second low determination signal RCMP ("L" level).

The second row determination signal RCMP ("L" level), it is determined that the input low address information RAD and the first low address information RT is not the same relationship (if not normal). That is, it is determined that the row decoder 4 has an anomaly and is not normally decoded.

Specifically, an erroneous selection anomaly in which an erroneous word line WL is selected among the plurality of word lines WL is determined by an abnormality in the row decoder 4.

The first column determination circuit 5C compares the first column address information CT with the second column address information CB, and outputs a first column determination signal CFLG based on the compared result.

EXOR circuits 33 to 35 receive one-bit inputs of the first column address information CT and the second column address information CB, respectively, and outputs EXOR logical operation result CB0 to NAND circuit 36.

The first column address information CT and the second column address information CB are complementary to each other when they are normal.

Therefore, when the first column address information CT and the second column address information CB are complementary to each other (normal), EXOR logical operation results CB0 of EXOR circuits 33 to 35 all output "H" levels. In this case, NAND circuit 36 outputs the first column determination signal CFLG ("L" level). On the relationship hand, when the first column address information CT and the second column address information CT are not complementary to each other (when they are not normal), at least one of EXOR logical operation results CBO of EXOR circuits 33 to 35 outputs "L" levels. In this case, NAND circuitry 36 outputs the first column determination signal CFLG ("H" level).

According to the first column determination signal CFLG ("H" level), it is determined that the first column address information CT and the second column address information CB are not complementarily related (when they are not normal). That is, it is determined that the column decoder 10 has an anomaly and is not normally decoded.

Specifically, a non-selection anomaly in the case where no plurality of column selection lines Y are selected and a multi-selection abnormality in the case where a plurality of column selection lines Y are selected among the plurality of column selection lines Y are determined by an abnormality of the column decoder 10.

The second column determination circuit 5D compares the input column address information CAD with the first column address information CT, and outputs a second column determination signal CCMP based on the result of the comparison.

EXOR circuits 30 to 32 receive inputs of the input column address information CAD and the first column address information CT, one bit at a time, and outputs EXOR logical operation result CTO to the NOR circuit 37.

The input column address information CAD and the first column address information CT have the same relationship when they are normal.

Therefore, when the input column address information CAD and the first column address information CT are in the same relationship (when they are normal), all EXOR logical operation result CTO of EXOR circuitry 30 to 32 outputs the "L" level. In this case, the NOR circuit 37 outputs a second column determination signal CCMP ("H" level). On the other hand, when the input column address information CAD and the first column address information CT do not have the same relation (when the input column address information CAD and the first column address information CT are not normal), at least one of EXOR logical operation results CTO of EXOR circuits 30 to 32 outputs "H" levels. In this case, the NOR circuit 37 outputs a second column determination signal CCMP ("L" level).

According to the second column determination signal CCMP ("L" level), it is determined that the input column address information CAD and the first column address information CT do not have the same relationship (when they are not normal). That is, it is determined that the column decoder 10 has an anomaly and is not normally decoded.

More specifically, an erroneous selection anomaly in which an erroneous column selection line Y is selected among the plurality of column selection lines Y is determined by an abnormality in the column decoder 10.

In the combining circuit 5E, NAND circuit 74 outputs NAND logical operation result to the OR circuit 75 in response to an input of the second row determination signal RCMP and the second column determination signal RCMP. The OR circuit 75 receives the first row determination signal RFLG, the first column determination signal CFLG, and the output of NAND circuit 74 and outputs the OR logical operation result to the flip-flop 76.

OR circuit 75 includes a first low determination signal RFLG ("L" level), a second low determination signal RCMP ("H" level), the first column determination signal CFLG ("L" level), the second column determination signal COMP ("H" level) if the stores the "L" level to the flip-flop 76. On the other hand, the OR circuit 75 stores the first low determination signal RFLG ("H" level), the second low determination signal RCMP ("L" level), the first column determination signal CFLG ("H" level), the second column determination signal COMP ("L" level) in the flip-flop 76 if any of the states.

The flip-flop 76 outputs abnormal signals FLAG based on the stored data.

FIG. 7 is a diagram for explaining an abnormality of the row decoder 4 and the column decoder 10 according to the first embodiment.

As shown in FIG. 7, when a non-selection anomaly occurs in the case where no plurality of word lines WL are selected or a multi-selection abnormality occurs in the case where a plurality of word lines WL are selected among the plurality of word lines WL due to an abnormality of the row decoders 4, the abnormality signal FLAG (H level) is set in accordance with the first row determination signal RFLG (H level).

When an erroneous selection anomaly occurs in which an erroneous word line WL is selected from a plurality of word lines WL due to an abnormality of the row decoders 4, the abnormality signal FLAG (H level) is set in accordance with the second row determination signal RCMP (L level).

When a non-selection anomaly occurs when no plurality of column selection lines Y are selected or a multi-selection abnormality occurs when a plurality of column selection lines Y are selected among the plurality of column selection lines Y due to an abnormality of the column decoders 10, the abnormality signal FLAG (H level) is set in accordance with the first column determination signal CFLG (H level).

When an erroneous selection anomaly occurs in which an erroneous column selection line Y among a plurality of column selection lines Y is selected due to an abnormality of the column decoders 10, the abnormality signal FLAG (H level) is set in accordance with the second column determination signal CCMP (L level).

When both the row decoder 4 and the column decoder 10 are normal, the error signal FLAG is set to "L" level.

The detecting circuit 5 according to the first embodiment outputs the abnormal signal FLAG to CPU20.

The detector 5 according to the first embodiment outputs abnormal signals FLAG at the time of data reading and data writing. Therefore, according to the configuration of the first embodiment, it is possible to detect the failure of the address decoder (the row decoder 4 and the column decoder 10) at an early stage in a simple method.

Figure 8:
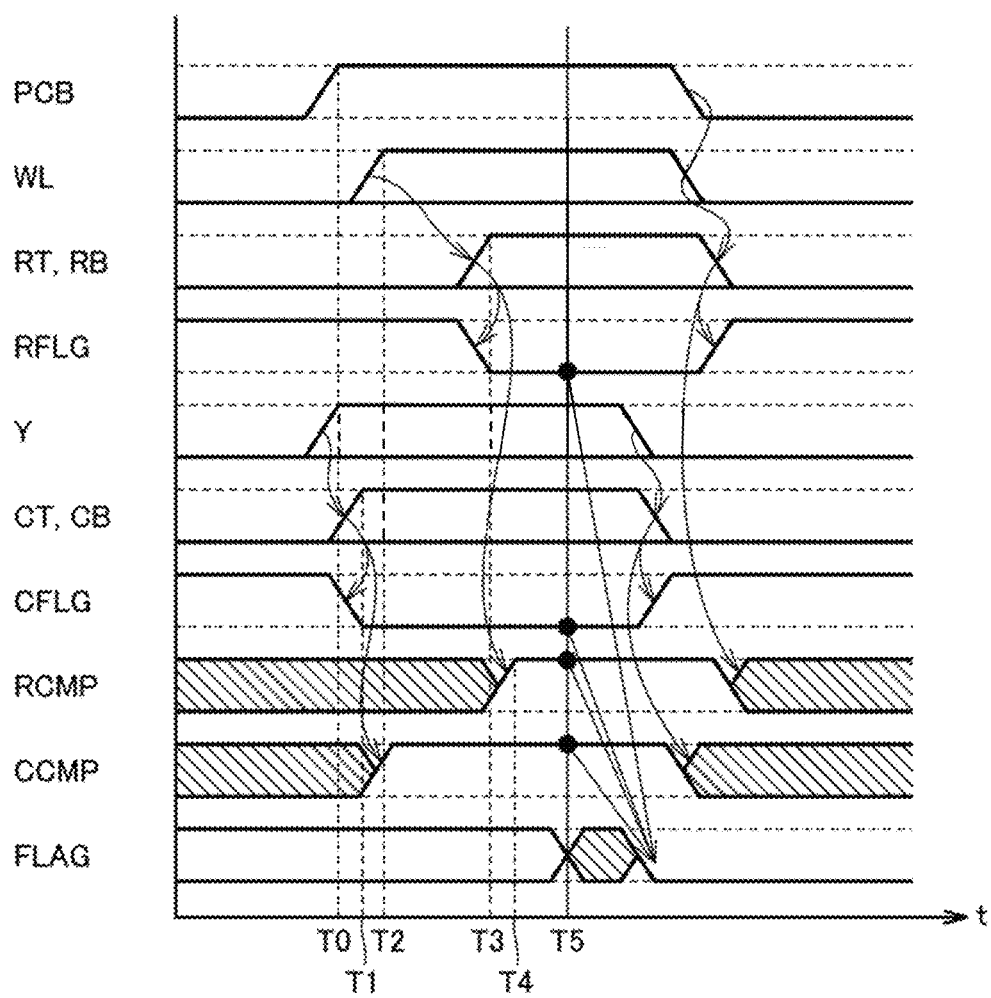
FIG. 8 is a first part of a timing chart illustrating the operation of the semiconductor device 1 according to the first embodiment.

FIG. 8 is a first timing chart illustrating the operation of the semiconductor device 1 according to the first embodiment.

In the present example, a case of normal operation will be described.

As shown in FIG. 8, at time T0, the control signal PCB is set to a "H" level. Along with this, the precharge operation for the data lines DL[0] to DL[7] of the precharge circuit 6C is completed.

Further, at time T0, the column decoder 10 selects one of the plurality of column selection lines Y based on the input column address information CAD.

At time T1, the first and second column encoders 9A,9B generate first column address information CT and second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

At time T2, the second column determination circuit 5D outputs the second column determination signal CCMP ("H"

level) because the input column address information CAD and the first column address information CT are compared and matched.

Further, at time T2, the row decoder 4 selects one of the plurality of word lines WL based on the input row address information RAD.

At time T3, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T4, the second row determination circuit 5B outputs a second row determination signal RCMP for matches by comparing the input low address information RAD and the first low address information RT ("H" level).

At time T5, the detection circuit 5, the first row test signal RFLG ("L" level), a second low determination signal RCMP ("H" level), the first column determination signal CFLG ("L" level), and outputs an abnormal signal FLAG ("L" level) based on the second column determination signal COMP ("H" level).

Figure 9:
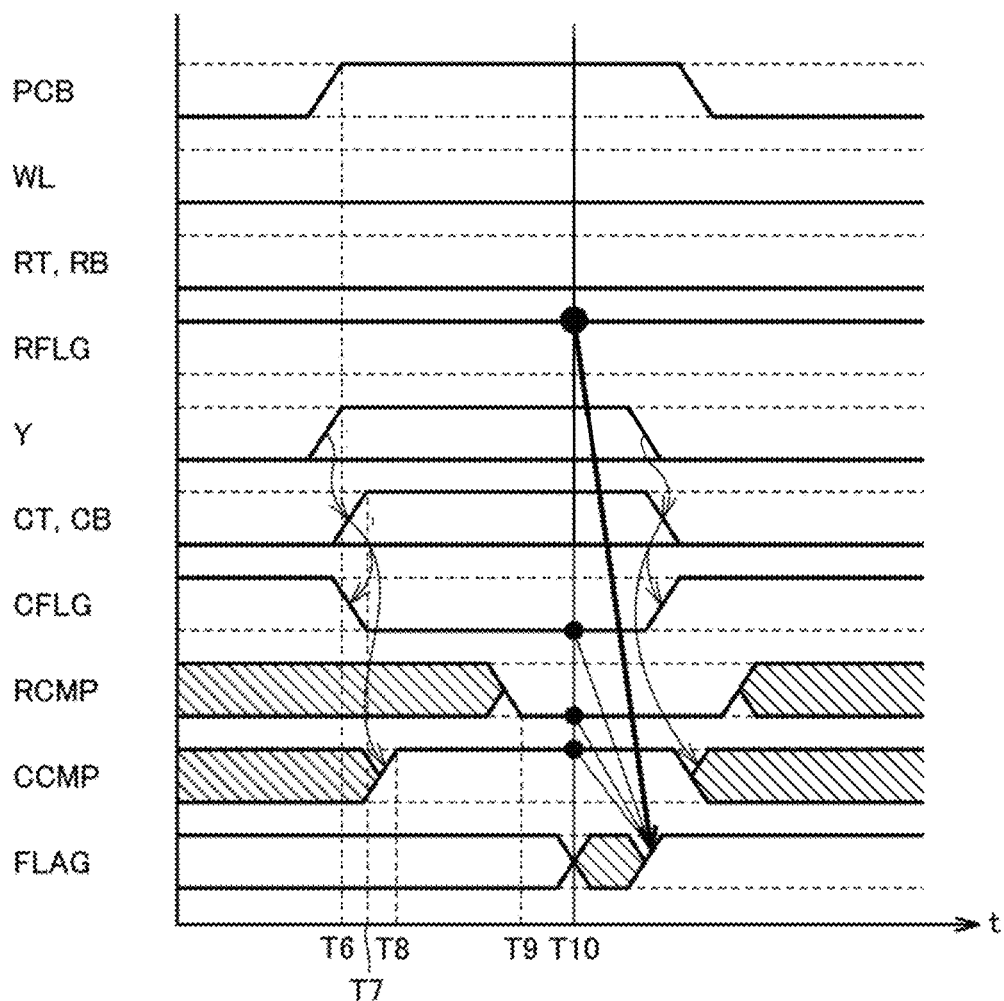
FIG. 9 is a second part of the timing chart diagram for explaining the operation of the semiconductor device 1 according to the first embodiment.

FIG. 9 is a timing chart diagram for explaining the operation of the semiconductor device 1 according to the first embodiment (Part 2).

In this example, a case where there is no operation of selecting the word line WL will be described.

As shown in FIG. 9, at time T6, the control signal PCB is set to a "H" level. Along with this, the precharge operation for the data lines DL[0] to DL[7] of the precharge circuit 6C is completed.

Further, at time T7, the column decoder 10 selects one of the plurality of column selection lines Y based on the input column address information CAD.

At time T7, the first and second column encoders 9A,9B generate first column address information CT and second column address information CB, respectively. In this example, the first column address information CT and the second column address information CB are generated as complementary relationships with each other.

Accordingly, the first column determination circuit 5C compares the first column address information CT with the second column address information CB, and outputs the first column determination signal CFLG ("L" level) because the first column determination circuit 5C has a complementary relation with the second column address information CB.

At time T8, the second column determination circuit 5D outputs the second column determination signal CCMP ("H" level) because the input column address information CAD and the first column address information CT are compared and matched.

Further, in the present exemplary embodiment, the row decoder 4 does not select one of the plurality of word lines WL based on the input row address information RAD due to an error.

The first and second row coders 6A,6B generate the first row address information RT and the second row address information RB, respectively, but in the present embodiment, the first row address information RT and the second row address information RB are not generated as mutually complementary relationships.

Accordingly, the first row determination circuits 5A compare the first row address information RT and the second row address information RB and maintain the first row determination signals RFLG ("H" levels) because they are not complementary to each other.

At time T9, the second row determination circuit 5B outputs a second row determination signal RCMP ("L" level) because it does not match by comparing the input row address information RAD and the first row address information RT.

At time T10, the detection circuit 5, the first row determination signal RFLG ("H" level), a second low determination signal RCMP ("L" level), the first column determination signal CFLG ("L" level), and outputs an abnormal signal FLAG ("H" level) based on the second column determination signal COMP ("H" level).

Therefore, when an unselected anomaly occurs in which one of the plurality of word lines WL is not selected, it is possible to detect the abnormality.

Figure 10:
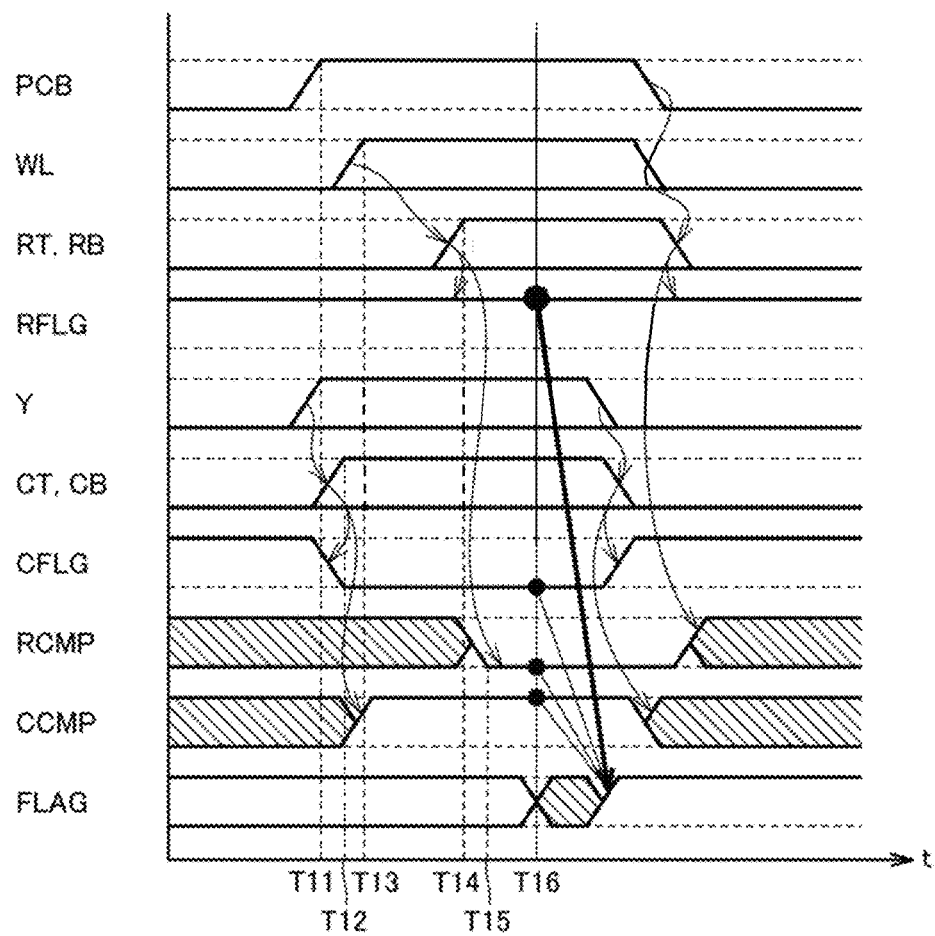
FIG. 10 is a third part of the timing chart diagram for explaining the operation of the semiconductor device 1 according to the first embodiment.

FIG. 10 is a timing chart diagram for explaining the operation of the semiconductor device 1 according to the first embodiment (its 3).

In this example, a case where a plurality of word lines WL among a plurality of word lines WL is selected will be described.

As shown in FIG. 10, at time T11, the control signal PCB is set to a "H" level. Along with this, the precharge operation for the data lines DL[0] to DL[7] of the precharge circuit 6C is completed.

Further, at time T12, the column decoder 10 selects one of the plurality of column selection lines Y based on the input column address information CAD.

At time T12, the first and second column encoders 9A,9B generate first column address information CT and second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

At time T13, the second column determination circuit 5D outputs the second column determination signal CCMP ("H" level) because the input column address information CAD and the first column address information CT are compared and matched.

Further, at time T13, the row decoder 4 selects a plurality of word lines WL among the plurality of word lines WL due to an abnormality based on the input row address information RAD.

At time T14, the first and second row coders 6A,6B generate the first row address information RT and the second row address information RB, respectively, but in the present embodiment, the first row address information RT and the second row address information RB are not generated as mutually complementary relationships.

Accordingly, the first row determination circuits 5A compare the first row address information RT and the second row address information RB and maintain the first row determination signals RFLG ("H" levels) because they are not complementary to each other.

At time T15, the second row determination circuit 5B compares the input row address information RAD with the first row address information RT, and outputs the second row determination signal RCMP ("L" level) because the input row address information RAD does not coincide with the first row address information RT. In this embodiment, the case of outputting the second row determination signal RCMP ("L" level) will be described, but depending on the condition, the case of outputting the second row determination signal RCMP ("H" level) coincident with the case of comparing the inputted row address information RAD and the first row address information RT may be considered.

At time T16, the detection circuit 5, the first row determination signal RFLG ("H" level), a second low determination signal RCMP ("L" level), the first column determination signal CFLG ("L" level), and outputs an abnormal signal FLAG ("H" level) based on the second column determination signal COMP ("H" level).

When a multi-selection anomaly occurs in which a plurality of word lines WL are selected among the plurality of word lines WL, the abnormality can be detected.

Figure 11:
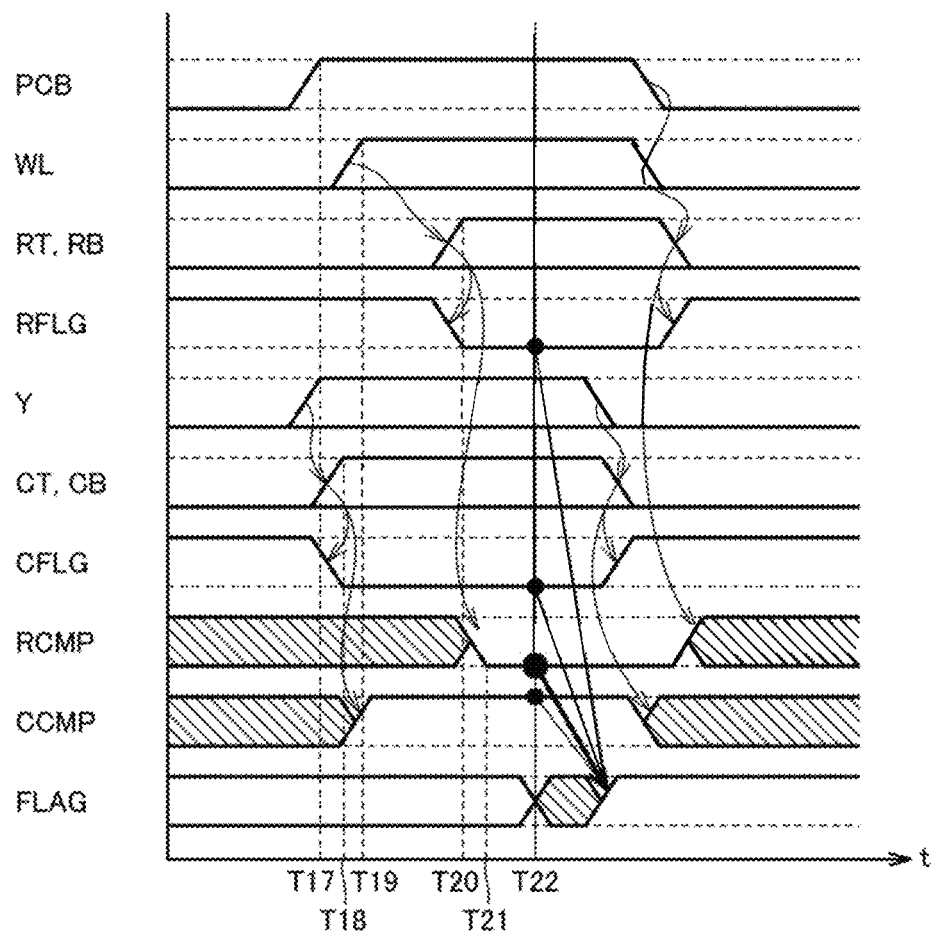
FIG. 11 is a fourth part of the timing chart diagram for explaining the operation of the semiconductor device 1 according to the first embodiment.

FIG. 11 is a timing chart diagram for explaining the operation of the semiconductor device 1 according to the first embodiment (its 4).

In this example, a case of an erroneous selection abnormality in which an erroneous word line WL is selected from a plurality of word lines WL will be described.

As shown in FIG. 11, at time T17, the control signal PCB is set to a "H" level. Along with this, the precharge operation for the data lines DL[0] to DL[7] of the precharge circuit 6C is completed.

Further, at time T17, the column decoder 10 selects one of the plurality of column selection lines Y based on the input column address information CAD.

At time T18, the first and second column encoders 9A,9B generate first column address information CT and second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

At time T19, the second column determination circuit 5D outputs the second column determination signal CCMP ("H" level) because the input column address information CAD and the first column address information CT are compared and matched.

Further, at time T19, the row decoder 4 selects the wrong word line WL among the plurality of word lines WL due to an error based on the input row address information RAD.

At time T20, the first and second row coder 6A,6B generate the first row address information RT and the second row address information RB, respectively, but in this example, the first row address information RT and the second row address information RB are generated as complementary relationships to each other according to the wrong word line WL.

Along with this, the first row determination circuit 5A outputs a first row determination signal RFLG ("L" level) because it is complementary to each other by comparing the first row address information RT and the second row address information RB.

At time T21, the second row determination circuit 5B compares the input row address information RAD with the first row address information RT, and outputs the second row determination signal RCMP ("L" level) because the input row address information RAD does not coincide with the first row address information RT.

At time T22, the detection circuit 5, the first row test signal RFLG ("L" level), a second low determination signal RCMP ("L" level), the first column determination signal CFLG ("L" level), and outputs an abnormal signal FLAG ("H" level) based on the second column determination signal CCMP ("H" level).

When an erroneous selection anomaly occurs in which an erroneous word line WL is selected from a plurality of word lines WL, the abnormality can be detected.

Figure 12:
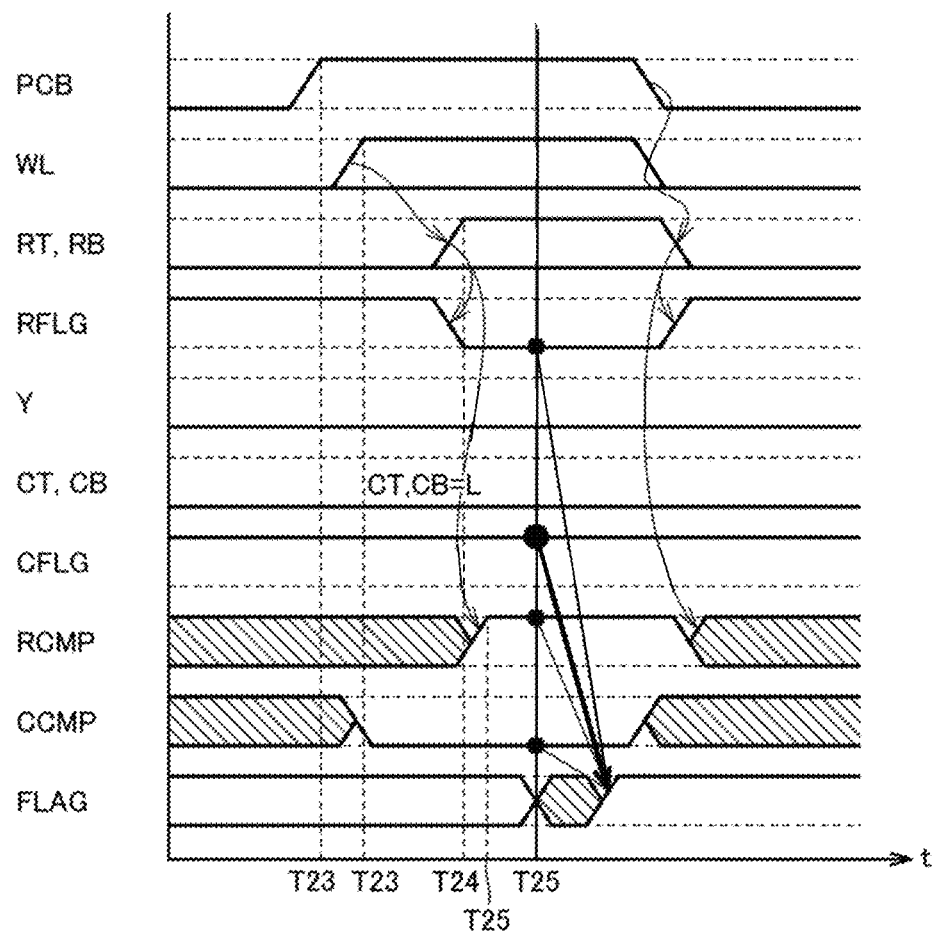
FIG. 12 is a fifth part of the timing chart illustrating the operation of the semiconductor device 1 according to the first embodiment.

FIG. 12 is a timing chart (5) illustrating the operation of the semiconductor device 1 according to the first embodiment.

In the present example, a case where the selection operation of the column selection line Y is not performed will be described.

As shown in FIG. 12, at time T23, the control signal PCB is set to a "H" level. Along with this, the precharge operation for the data lines DL[0] to DL[7] of the precharge circuit 6C is completed.

In this example, the column decoder 10 does not select one of the plurality of column selection lines Y based on the input column address information CAD.

The first and second column encoders 9A,9B generate the first column address information CT and the second column address information CB, respectively, but in the present embodiment, the first column address information CT and the second column address information CB are not generated as mutually complementary relationships.

Accordingly, the first column determination circuit 5C compares the first column address information CT with the second column address information CB, and maintains the first column determination signal CFLG ("H" level) because the first column determination circuit does not have a complementary relation with the second column address information CB.

At time T23, the second column determination circuit 5D outputs the second column determination signal CCMP ("L" level) because the input column address information CAD and the first column address information CT are compared and do not match.

Further, at time T23, the row decoder 4 selects one of the plurality of word lines WL based on the input row address information RAD.

At time T24, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T25, the second row determination circuit 5B outputs a second row determination signal RCMP for matches by comparing the input low address information RAD and the first low address information RT ("H" level).

At time T26, the detection circuit 5, the first low test signal RFLG ("L" level), a second low determination signal RCMP ("H" level), the first column determination signal CFLG ("H" level), and outputs an abnormal signal FLAG ("H" level) based on the second column determination signal CCMP ("L" level).

Therefore, when an unselected anomaly occurs in which one of the plurality of column selection lines Y is not selected, it is possible to detect the abnormality.

Figure 13:
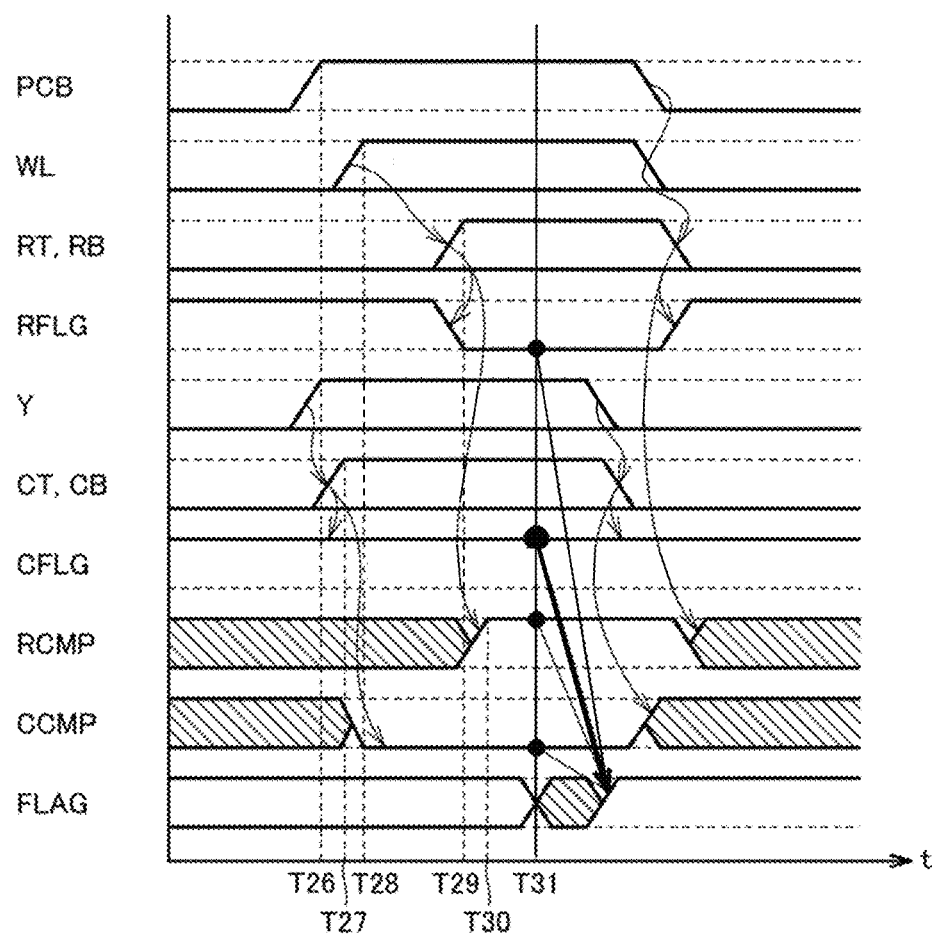
FIG. 13 is a sixth part of the timing chart diagram for explaining the operation of the semiconductor device 1 according to the first embodiment.

FIG. 13 is a timing chart diagram for explaining the operation of the semiconductor device 1 according to the first embodiment (Part 6).

In this example, a case where a plurality of column select lines Y among a plurality of column select lines Y are selected will be described.

As shown in FIG. 13, at time T26, the control signal PCB is set to a "H" level. Along with this, the precharge operation for the data lines DL[0] to DL[7] of the precharge circuit 6C is completed.

Further, in the time T26, in the present exemplary embodiment, the column decoder 10 selects a plurality of column selection lines Y based on the input column address information CAD.

At time T27, the first and second column encoders 9A,9B generate the first column address information CT and the second column address information CB, respectively, but in this embodiment, the first column address information CT and the second column address information CB are not generated as complementary relationships with each other.

Accordingly, the first column determination circuit 5C compares the first column address information CT with the second column address information CB, and maintains the first column determination signal CFLG ("H" level) because the first column determination circuit does not have a complementary relation with the second column address information CB.

At time T28, the second column determination circuit 5D outputs the second column determination signal CCMP ("L" level) because the input column address information CAD and the first column address information CT are compared and do not match.

Further, at time T28, the row decoder 4 selects one of the plurality of word lines WL based on the input row address information RAD.

At time T29, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T30, the second row determination circuit 5B outputs a second row determination signal RCMP for matches by comparing the input low address information RAD and the first low address information RT ("H" level).

At time T31, the detection circuit 5, the first low test signal RFLG ("L" level), a second low determination signal RCMP ("H" level), the first column determination signal CFLG ("H" level), and outputs an abnormal signal FLAG ("H" level) based on the second column determination signal COMP ("L" level).

Therefore, when a multi-selection anomaly occurs in which a plurality of column select lines Y among the plurality of column select lines Y are selected, it is possible to detect the abnormality.

Figure 14:
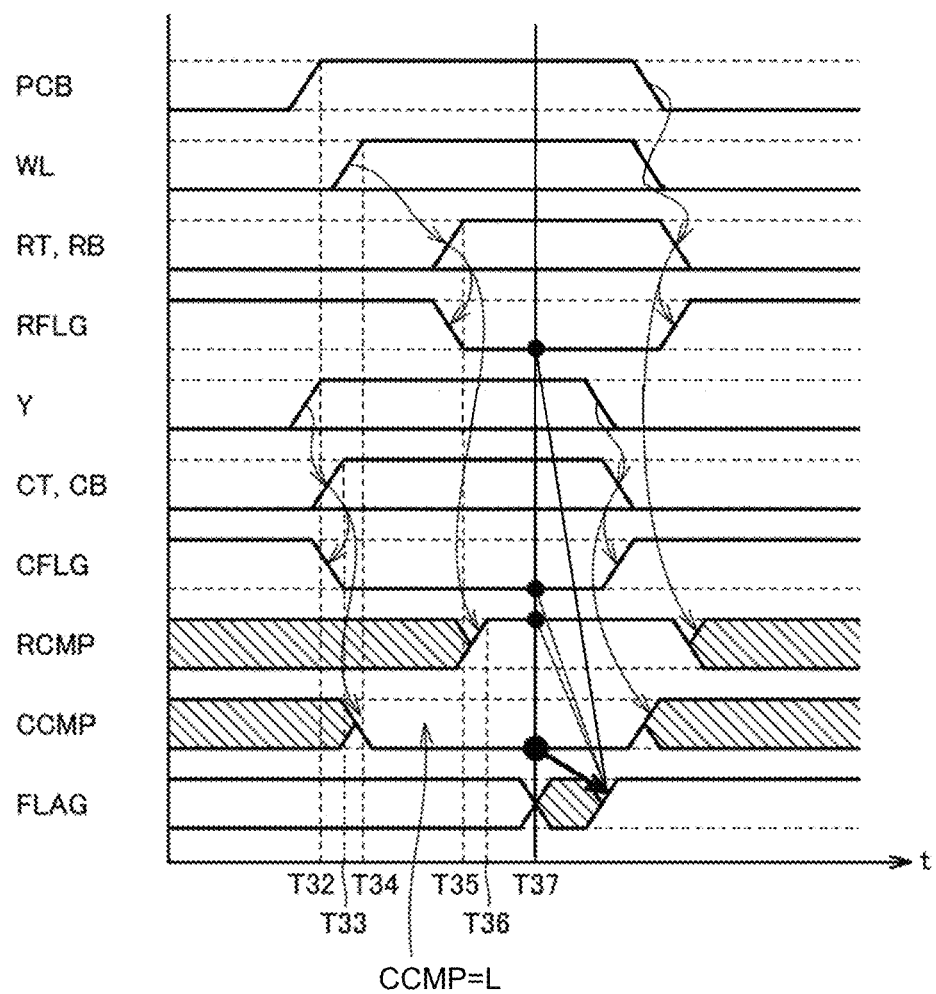
FIG. 14 is a seventh part of the timing chart diagram for explaining the operation of the semiconductor device 1 according to the first embodiment.

FIG. 14 is a timing chart diagram for explaining the operation of the semiconductor device 1 according to the first embodiment (Part 7).

In this example, a case of an erroneous selection abnormality in which an erroneous column selection line Y is selected from a plurality of column selection lines Y will be described.

As shown in FIG. 14, at time T32, the control signal PCB is set to a "H" level. Along with this, the precharge operation for the data lines DL[0] to DL[7] of the precharge circuit 6C is completed.

Further, in the time T32, in the present exemplary embodiment, the column decoder 10 selects the incorrect column selection line Y among the plurality of column selection lines Y based on the input column address information CAD.

At time T33, the first and second column encoders 9A,9B generate the first column address information CT and the second column address information CB, respectively, but in this embodiment, the first column address information CT and the second column address information CB are generated in complementary relation to each other in accordance with the erroneous column selection line Y.

Accordingly, the first column determination circuit 5C compares the first column address information CT with the second column address information CB, and outputs the first column determination signal CFLG ("L" level) because the first column determination circuit is complementary to the second column address information CB.

At time T34, the second column determination circuit 5D outputs the second column determination signal CCMP ("L" level) because the input column address information CAD and the first column address information CT are compared and do not match.

Further, at time T34, the row decoder 4 selects one of the plurality of word lines WL based on the input row address information RAD.

At time T35, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T36, the second row determination circuit 5B outputs a second row determination signal RCMP for matches by comparing the input low address information RAD and the first low address information RT ("H" level).

At time T37, the detection circuit 5, the first low determination signal RFLG ("L" level), a second low determination signal RCMP ("H" level), the first column determination signal CFLG ("H" level), and outputs an abnormal signal FLAG ("H" level) based on the second column determination signal COMP ("L" level).

Therefore, when an erroneous selection anomaly occurs in which an erroneous column selection line Y is selected among the plurality of column selection lines Y, it is possible to detect the abnormality.

Embodiment 2

Figure 15:
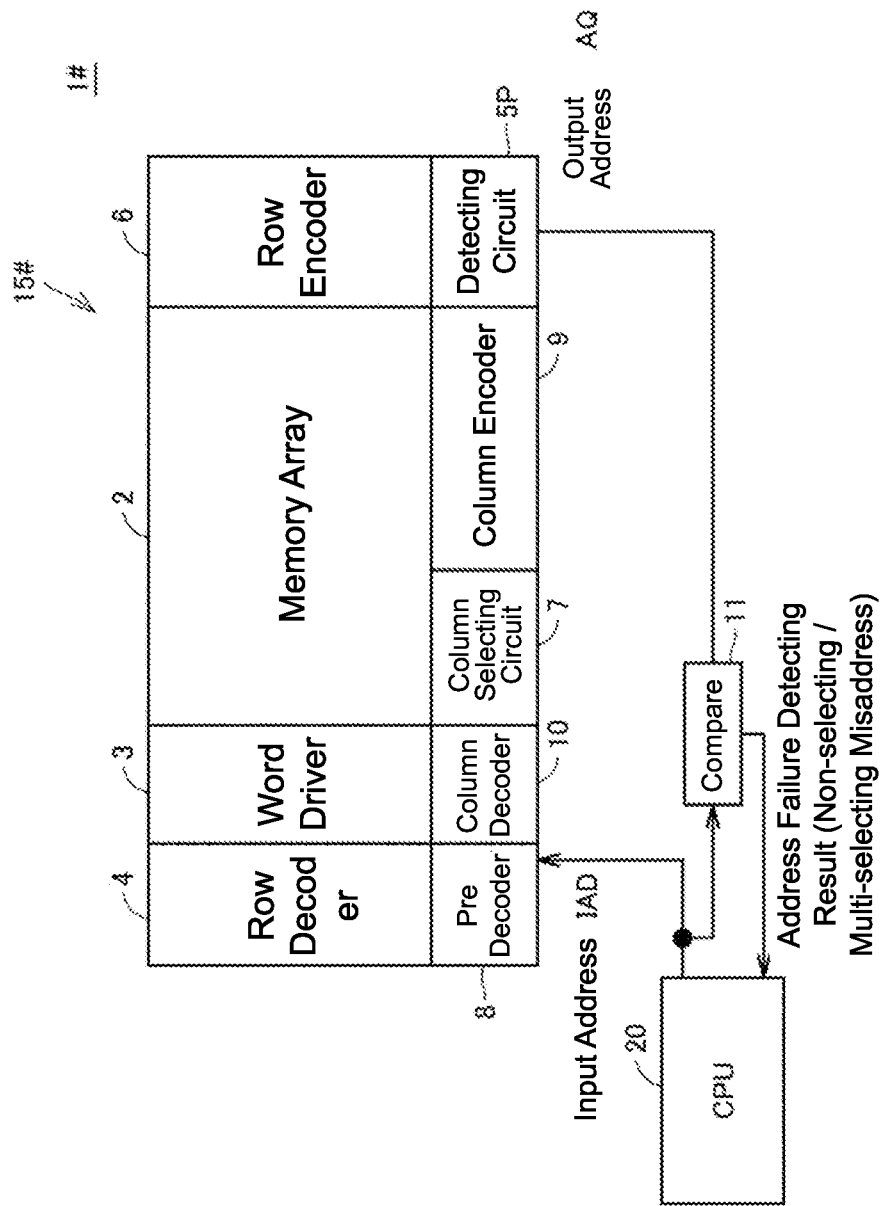
FIG. 15 is a diagram for explaining an outline of a semiconductor device 1 # according to the second embodiment.

FIG. 15 is a diagram for explaining an outline of the semiconductor device 1 # according to the second embodiment.

Referring to FIG. 15, the semiconductor device 1 # includes a memory macro 15 #, a CPU20, and a comparator 11.

CPU20 controls the memory macro 15 # to acquire the data stored in the memory macro 15 #.

The memory macro 15 # differs from the memory macro 15 in that the detection circuit 5 is replaced with a detection circuit 5P. Since the other configurations are the same, detailed description thereof will not be repeated.

The detecting circuit 5P outputs the first row address information RT and the second row address information RB output from the row encoder 6 and the output address information AQ based on the first column address information CT and the second column address information CB output from the column encoder 9. The output address information AQ includes an output row address information ORAD and an output column address information OCAD.

The comparator circuit 11 compares the output address information AQ output from the detector circuit 5P with the input address information IAD, and outputs the comparison result to CPU20.

Figure 16:
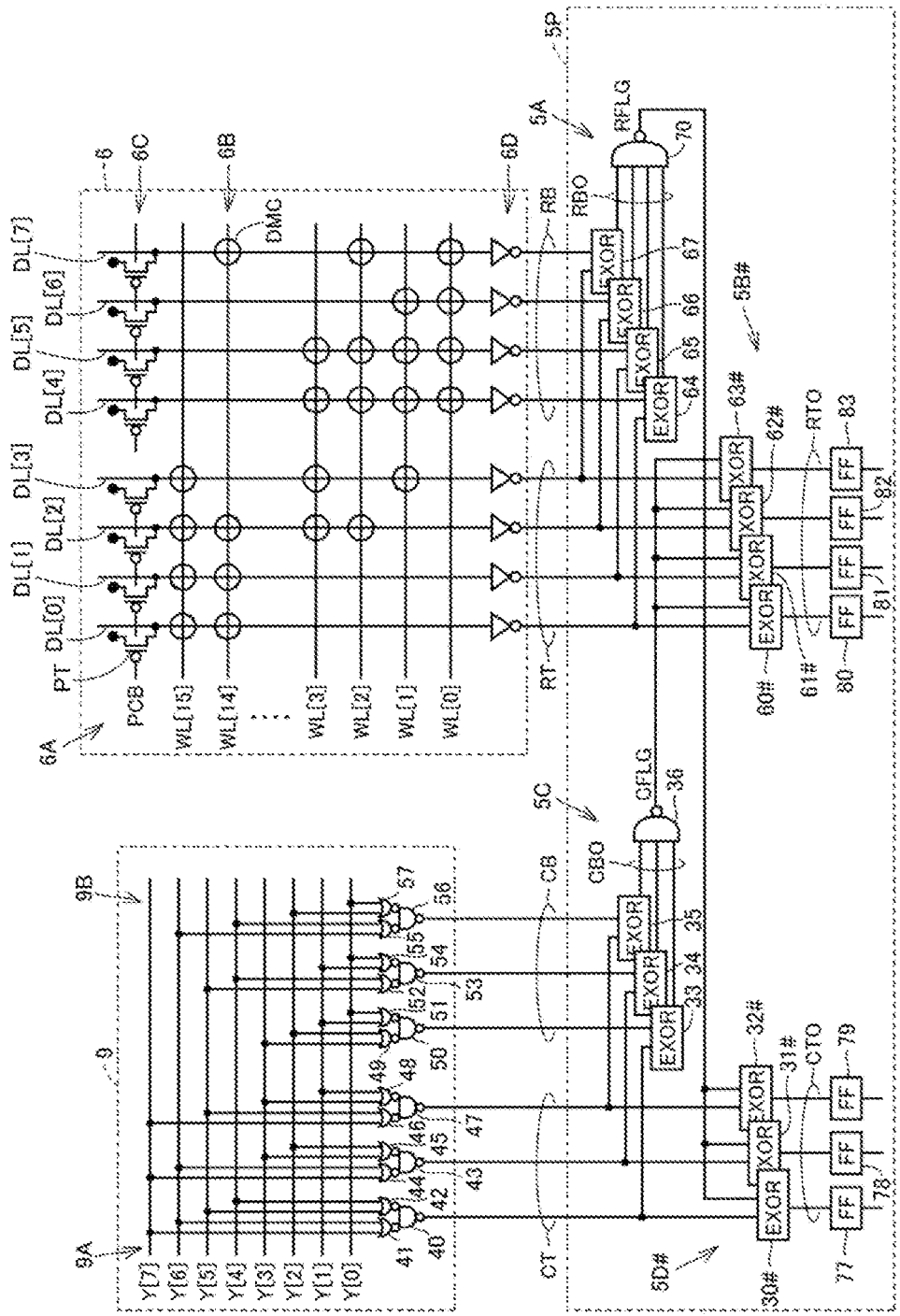
FIG. 16 is a diagram illustrating a circuit configuration of a detection circuit 5P, a low encoder 6 and a column encoder 9 according to the second embodiment.

FIG. 16 is a diagram illustrating a circuit configuration of a detection circuit 5P, a row encoder 6, and a column encoder 9 according to the second exemplary embodiment.

Referring to FIG. 16, as compared to the detection circuit 5 of FIG. 3, the detection circuit 5P includes a first row determination circuit 5A, a second row determination circuit OOC #, a first column determination circuit 5C, and a second column determination circuit OOA #.

The first row determination circuit 5A includes EXOR circuitry 64-67 and NAND circuitry 70.

The second row determination circuit 5B # includes EXOR circuitry 60 # to 63 # and flip-flops (FFFs) 80 to 83.

The first column determination circuit 5C includes EXOR circuitry 33-35 and NAND circuitry 36.

The second column determination circuitry 5D # includes EXOR circuitry 30 # to 32 # and flip-flops (FFs) 77 to 79.

The first row determination circuit 5A outputs a first row determination signal RFLG based on the comparison result by comparing the first row address information RT and the second row address information RB.

As described in the first embodiment, the first row determination signal RFLG ("H" level), it is determined that the first row address information RT and the second row address information RB is not complementarily relationship (if not normal). That is, it is determined that the row decoder 4 has an anomaly and is not normally decoded.

Specifically, due to the anomaly of the row decoder 4, a multi-selection abnormality when a plurality of word lines WL is not selected and a multi-selection abnormality when a plurality of word lines WL among a plurality of word lines WL is selected are determined.

The second row determination circuit 5B # generates an output row address information ORAD based on the first row address information RT and the first column determination signal CFLG.

EXOR circuits 60 # to 63 # receive 1-bit of the first row address information RT and the first column determination signal CFLG, respectively, and output EXOR logical operation result RTO to the flip-flops 80 to 83, respectively.

If there is no abnormality in the column decoder 10, the first column determination signal CFLG is set to "L" level. On the other hand, when the column decoders 10 are abnormal, the first column determination signals CFLG are set to "H" levels.

EXOR circuitry 60 # to 63 # receive the input of the first low address information RT and the first column determination signal CFLG ("L" level) and output EXOR logical operation result RTO to the flip-flops 80 to 83, respectively.

Since the first row address information RT is set to the first column determination signal CFLG ("L" level), the first row address information RT is directly outputted to the flip-flops 80 to 83 as EXOR logical operation result RTO.

The first low address information RT is latched by the flip-flops 80 to 83 and is output to the comparator circuit 11 as the output low address information ORAD.

EXOR circuitry 60 # to 63 # receive the input of the first low address information RT and the first column determination signal CFLG ("H" level) and output EXOR logical operation result RTO to the flip-flops 80 to 83, respectively.

Since the first row address information RT is set to the first column determination signal CFLG ("H" level), the first row address information RT is inverted. For example, when the first row address information RT is "1111", EXOR logical operation result RTO changes to "0000". That is, the first row address information RT is changed to inverted address information in accordance with the first column determination signal CFLG ("H" level). The inverted first row address information RT is latched by the flip-flops 80 to 83 and is output to the comparator circuit 11 as the output row address information ORAD.

Therefore, in the comparator 11, since the output row address information ORAD is changed, the output address information AQ and the input address information IAD are compared with each other, and the comparison results do not coincide with each other. That is, the non-coincidence test signals are outputted to CPU20.

The first column determination circuit 5C compares the first column address information CT with the second column address information CB, and outputs a first column determination signal CFLG based on the compared result.

As described in the first embodiment, the first column determination signal CFLG ("H" level) determines that the first column address information CT and the second column address information CB are not complementarily related (when they are not normal). That is, it is determined that the column decoder 10 has an anomaly and is not normally decoded.

Specifically, a non-selection anomaly in the case where no plurality of column selection lines Y are selected and a multi-selection abnormality in the case where a plurality of column selection lines Y are selected among the plurality of column selection lines Y are determined by an abnormality of the column decoder 10.

The second column determination circuit OOC # generates the output column address information OCAD based on the second column address information CB and the first row determination signal RFLG.

EXOR circuits 30 # to 32 # output EXOR logical operation result CTOs to the flip-flops 77 to 79 by receiving the input of the first bit of the first column address information CT and the first row determination signal RFLG, respectively.

When there are no abnormalities in the row decoders 4, the first row determination signals RFLG are set to "L" levels. On the other hand, when the row decoder 4 is abnormal, the first row determination signal RFLG is set to the "H" level.

EXOR circuits 30 # to 32 # receive the input of the first column address information CT and the first row determination signal RFLG ("L" level) and output EXOR logical operation result CTO to the flip-flops 77 to 79, respectively.

In this case, since the first row determination signal RFLG ("L" level) is set, the first column address information CT is output as it is to the flip-flops 77 to 79 as EXOR logical operation result CTO, respectively.

The first column address information CT is latched by flip-flops 77 to 79 and output to the comparator circuit 11 as output column address information OCAD.

EXOR circuits 30 # to 32 # receive the input of the first column address information CT and the first row determination signal RFLG ("H" level) and output EXOR logical operation result CTO to the flip-flops 77 to 79, respectively.

Since the first row determination signal RFLG is set to the "H" level, the data of the first column address information CT is inverted. For example, when the first column address information CT is "111", EXOR logical operation result CTO changes to "000". That is, the first column address information CT is changed to inverted address information in accordance with the first row determination signal RFLG ("H" level). The inverted first column address information CT is latched by flip-flops 77 to 79 and output as output column address information OCAD to the comparator circuit 11.

Therefore, in the comparator 11, since the output column address information OCAD is changed, the output address information AQ and the input address information IAD are compared with each other, and the comparison results do not coincide with each other. That is, the non-coincidence test signals are outputted to CPU20.

FIG. 17 is a diagram for explaining an anomaly of the row decoder 4 and the column decoder 10 according to the second embodiment.

As shown in FIG. 17A, when a non-selection anomaly occurs in the case where no plurality of word lines WL are selected or a multi-selection abnormality occurs in the case where a plurality of word lines WL are selected among the plurality of word lines WL due to an abnormality in the row decoders 4, the first row determination signals RFLG ("H" levels) are outputted.

As shown in FIG. 17B, when a non-selection anomaly occurs when no plurality of column selection lines Y are selected or a multi-selection abnormality occurs when a plurality of column selection lines Y are selected among the plurality of column selection lines Y due to an abnormality in the column decoders 10, the first column determination signals CFLG ("H" levels) are outputted.

As shown in FIG. 17C, when a non-selection anomaly occurs in the case where no plurality of word lines WL are selected due to an abnormality of the row decoder 4 or a non-selection abnormality occurs in the case where no plurality of column selection lines Y are selected due to an abnormality of the column decoder 10, the row address information or the column address information of a part of the output address information AQ output from the detecting circuits 5P is inverted.

Therefore, even when the input address information IAD is correct address information, the comparison circuit 11 outputs a determination signal (Fail) that does not coincide with the comparison result when the input address information IAD and the output address information AQ are compared with each other to CPU20.

When one of the plurality of word lines WL is normally selected and when one of the plurality of column select lines Y is normally selected, the output address information AQ output from the detecting circuits 5P includes correct row address information and column address information.

Therefore, when the input address information IAD and the output address information AQ are compared with each other in the case where the input address information IAD is correct address information, the comparator 11 outputs a determination signal Pass that matches the comparison result to CPU20.

When a multi-selection anomaly occurs in the case where a plurality of word lines WL are selected among the plurality of word lines WL due to an abnormality of the row decoder 4, or when a multi-selection abnormality occurs in the case where a plurality of column select lines Y among the plurality of column select lines Y are selected due to an abnormality of the column decoder 10, the row address information or the column address information of a part of the output address information AQ output from the detecting circuits 5P is inverted.

Therefore, even when the input address information IAD is correct address information, the comparison circuit 11 outputs a determination signal (Fail) that does not coincide with the comparison result when the input address information IAD and the output address information AQ are compared with each other to CPU20.

When an erroneous selection anomaly occurs in which an erroneous word line WL is selected among the plurality of word lines WL due to an abnormality of the row decoders 4, or when an erroneous selection abnormality occurs in which an erroneous column selection line Y is selected among the plurality of column selection lines Y, the output address information AQ output from the detecting circuits 5P includes erroneous row address information or column address information.

Therefore, even when the input address information IAD is correct address information, the comparison circuit 11 outputs a determination signal (Fail) that does not coincide with the comparison result when the input address information IAD and the output address information AQ are compared with each other to CPU20.

Figure 18:
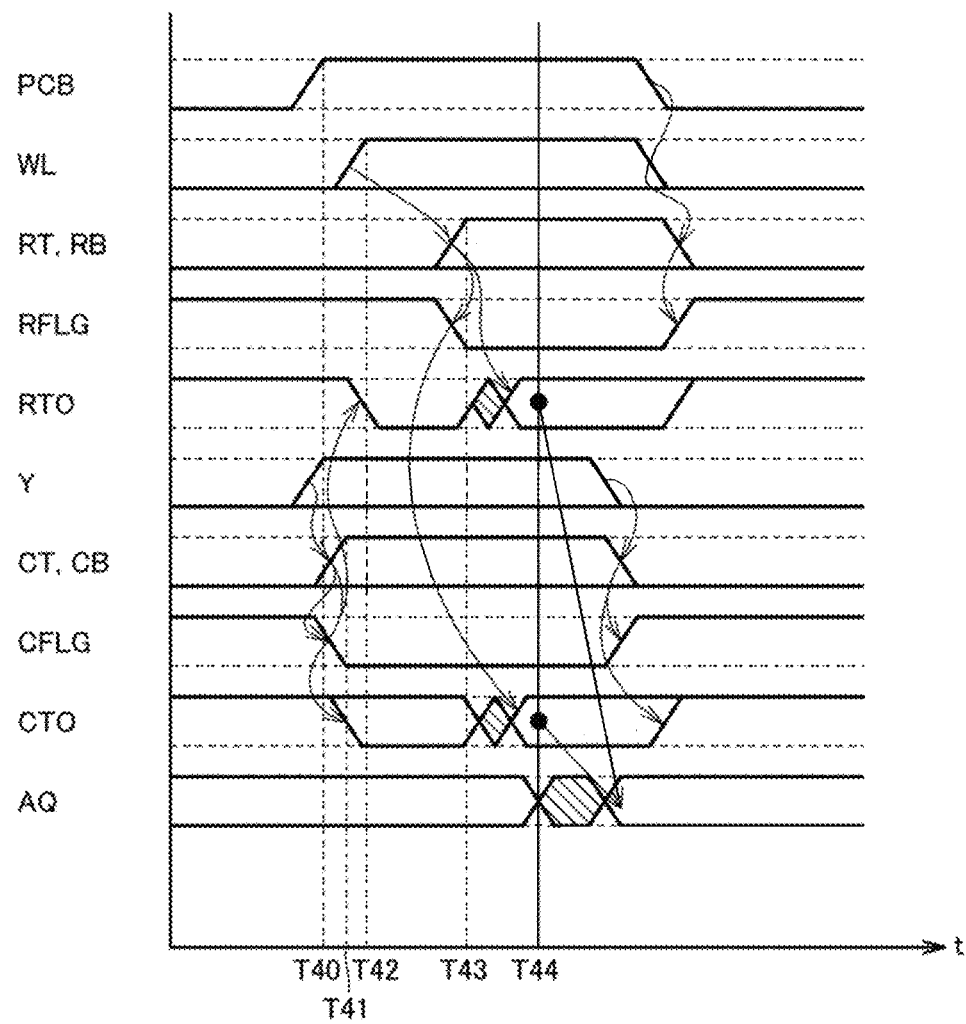
FIG. 18 is a first part of a timing chart diagram explaining the operation of the semiconductor device 1 # according to embodiment 2.

FIG. 18 is a timing chart illustrating the operation of the semiconductor device 1 # according to the second embodiment.

In the present example, a case of normal operation will be described.

As shown in FIG. 18, at time T40, the control signal PCB is set to a "H" level. Along with this, the precharge operation for the data lines DL[0] to DL[7] of the precharge circuit 6C is completed.

Further, at time T40, the column decoder 10 selects one of the plurality of column selection lines Y based on the input column address information CAD.

At time T41, the first and second column encoders 9A,9B generate first column address information CT and second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

At time T42, the row decoder 4 selects one of the plurality of word lines WL based on the input row address information RAD.

At time T43, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T44, since the first row determination signal RFLG ("L" level) is set, the first column address information CT is output as it is to the flip-flops 77 to 79 as EXOR logical operation result CTO, respectively. Since the first column determination signal CFLG ("L" level) is set, the first row address information RT is directly outputted to the flip-flops 80 to 83 as EXOR logical operation result RTO.

The detector 5P outputs output address information AQ including correct row address information and column address information.

When the input address information IAD and the output address information AQ are compared with each other when the input address information IAD is correct address information, the comparator 11 outputs a coincidence determination signal Pass to CPU20.

Figure 19:
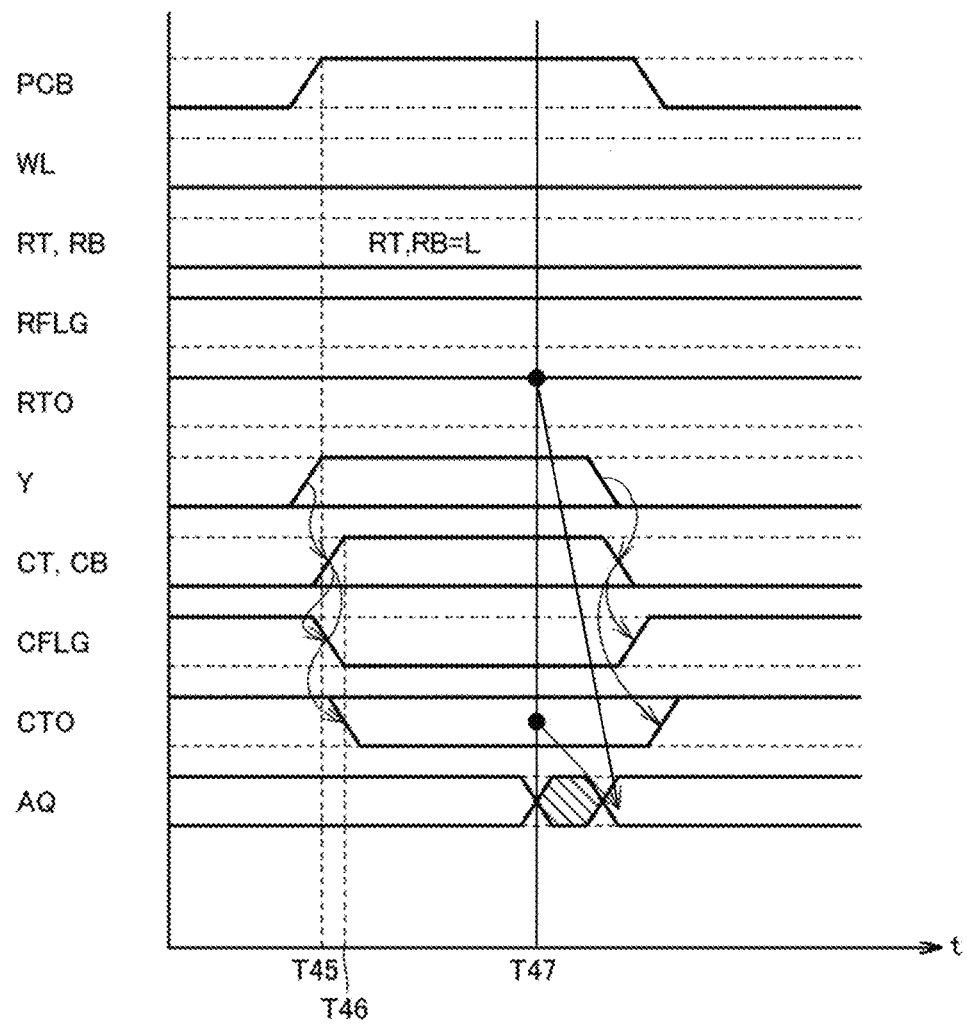
FIG. 19 is a second part of the timing chart diagram for explaining the operation of the semiconductor device 1 # according to the second embodiment.

FIG. 19 is a timing chart diagram for explaining the operation of the semiconductor device 1 # according to the second embodiment (Part 2).

In this example, a case where there is no operation of selecting the word line WL will be described.

As shown in FIG. 19, at time T45, the control signal PCB is set to a "H" level. Along with this, the precharge operation for the data lines DL[0] to DL[7] of the precharge circuit 6C is completed.

Further, at time T45, the column decoder 10 selects one of the plurality of column selection lines Y based on the input column address information CAD.

At time T46, the first and second column encoders 9A,9B generate first column address information CT and second column address information CB, respectively. In this example, the first column address information CT and the second column address information CB are generated as complementary relationships with each other.

Accordingly, the first column determination circuit 5C compares the first column address information CT with the second column address information CB, and outputs the first column determination signal CFLG ("L" level) because the first column determination circuit 5C has a complementary relation with the second column address information CB.

In this example, the row decoder 4 does not select one of the plurality of word lines WL based on the input row address information RAD due to an error.

The first and second row coders 6A,6B generate the first row address information RT and the second row address information RB, respectively, but in the present embodiment, the first row address information RT and the second row address information RB are not generated as mutually complementary relationships.

At time T47, since the first row determination signal RFLG ("H" level) is set, the first column address information CT is inverted and is output as EXOR logical operation result CTO to the flip-flops 77 to 79, respectively. Since the word line WL is not selected, the first row address information RT ("1111") is directly outputted to the flip-flops 80 to 83 as EXOR logical operation result RTO.

The detector 5P outputs output address information AQ including erroneous row address information and inverted column address information.

When the input address information IAD and the output address information AQ are compared with each other in the case where the input address information IAD is correct address information, the comparator 11 outputs a mismatch determination signal (Fail) to CPU20.

Therefore, when an unselected anomaly occurs in which one of the plurality of word lines WL is not selected, it is possible to detect the abnormality.

Figure 20:
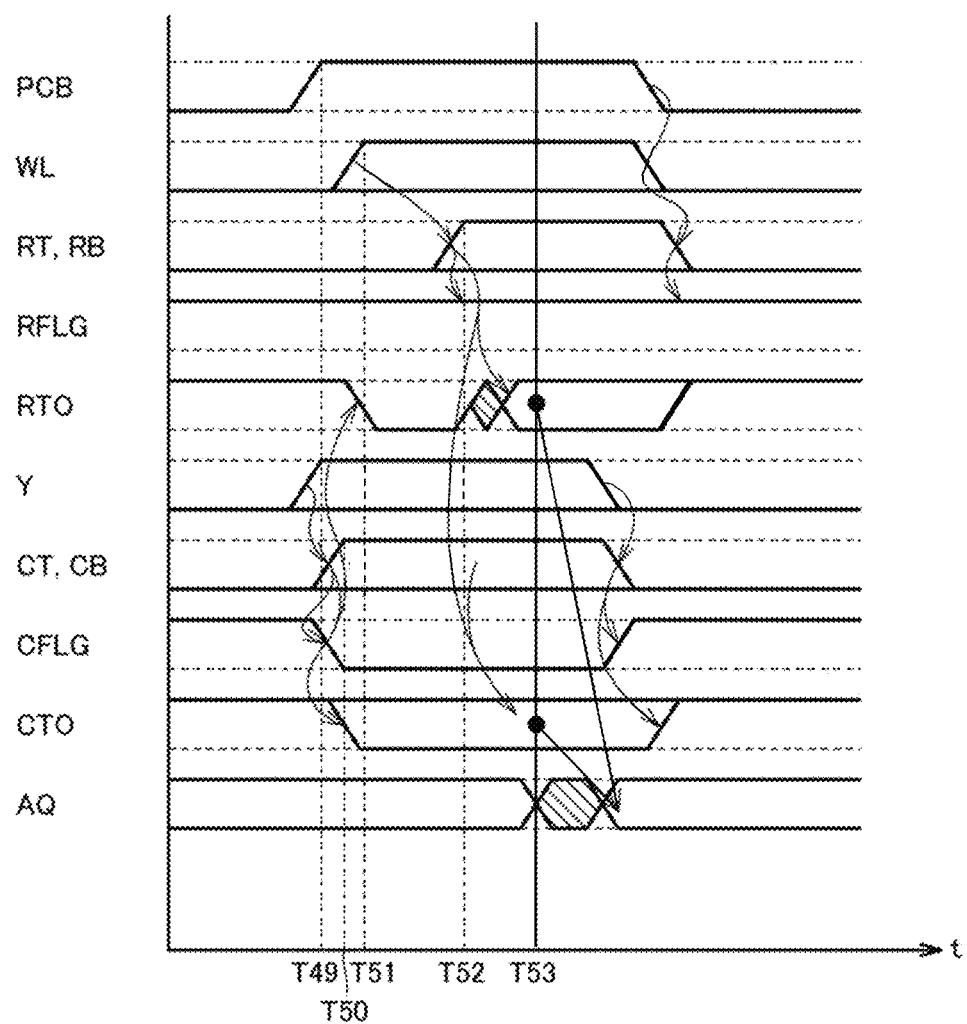
FIG. 20 is a third part of the timing chart diagram for explaining the operation of the semiconductor device 1 # according to the second embodiment.

FIG. 20 is a timing chart diagram for explaining the operation of the semiconductor device 1 # according to the second embodiment (Part 3).

In this example, a case where a plurality of word lines WL among a plurality of word lines WL is selected will be described.

As shown in FIG. 20, at time T49, the control signal PCB is set to a "H" level. Along with this, the precharge operation for the data lines DL[0] to DL[7] of the precharge circuit 6C is completed.

Further, at time T49, the column decoder 10 selects one of the plurality of column selection lines Y based on the input column address information CAD.

At time T50, the first and second column encoders 9A,9B generate first column address information CT and second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

At time T51, the row decoder 4 selects a plurality of word lines WL among the plurality of word lines WL due to an error based on the input row address information RAD.

At time T52, the first and second row coders 6A,6B generate the first row address information RT and the second row address information RB, respectively, but in the present embodiment, the first row address information RT and the second row address information RB are not generated as mutually complementary relationships.

Accordingly, the first row determination circuits 5A compare the first row address information RT and the second row address information RB and maintain the first row determination signals RFLG ("H" levels) because they are not complementary to each other.

At time T53, since the first row determination signal RFLG ("H" level) is set, the first column address information CT is inverted and is output as EXOR logical operation result CTO to the flip-flops 77 to 79, respectively. Since a plurality of word lines WL are selected, the first row address information RT (unknown) is outputted to the flip-flops 80 to 83 as EXOR logical operation result RTO.

The detector 5P outputs output address information AQ including erroneous row address information and inverted column address information.

When the input address information IAD and the output address information AQ are compared with each other in the case where the input address information IAD is correct address information, the comparator 11 outputs a mismatch determination signal (Fail) to CPU20.

When a multi-selection anomaly occurs in which a plurality of word lines WL are selected among the plurality of word lines WL, the abnormality can be detected.

Figure 21:
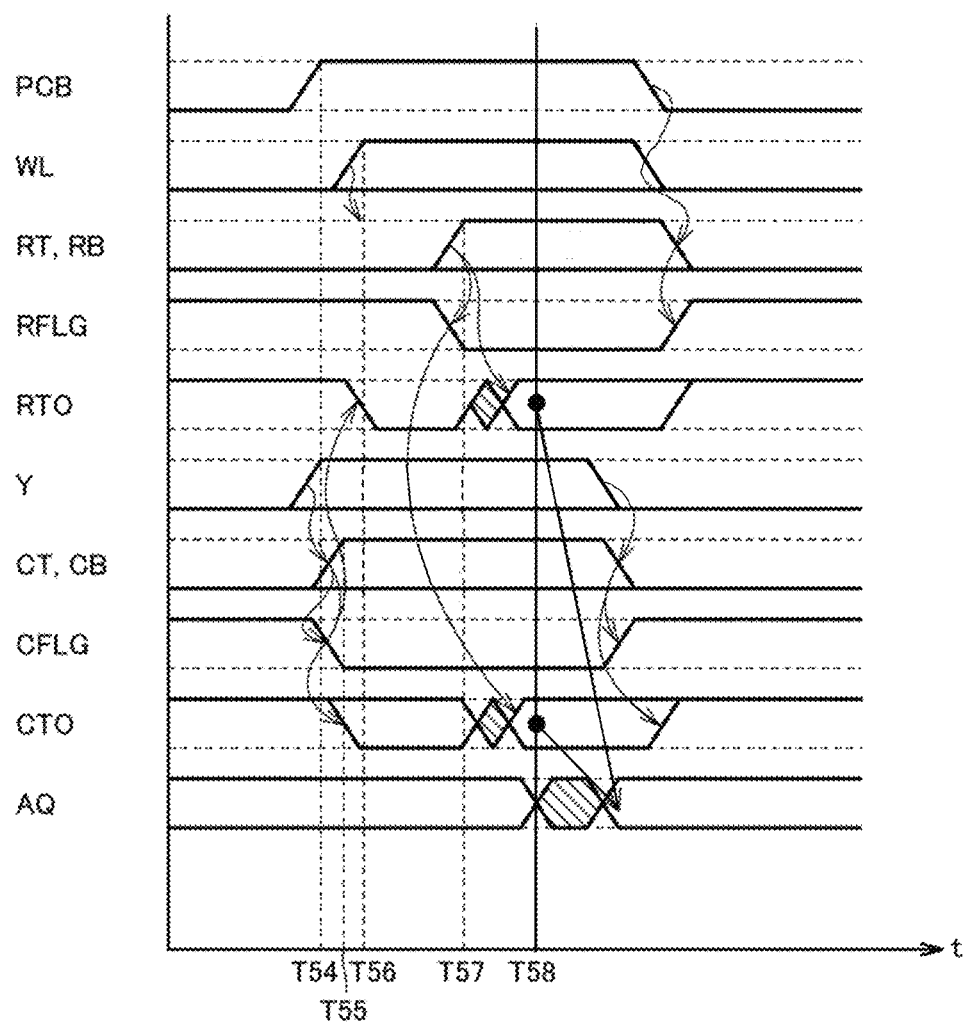
FIG. 21 is a fourth part of the timing chart diagram for explaining the operation of the semiconductor device 1 # according to the second embodiment.

FIG. 21 is a timing chart diagram for explaining the operation of the semiconductor device 1 # according to the second embodiment (its 4).

In this example, a case of an erroneous selection abnormality in which an erroneous word line WL is selected from a plurality of word lines WL will be described.

As shown in FIG. 21, at time T54, the control signal PCB is set to a "H" level. Along with this, the precharge operation for the data lines DL[0] to DL[7] of the precharge circuit 6C is completed.

Further, at time T54, the column decoder 10 selects one of the plurality of column selection lines Y based on the input column address information CAD.

At time T55, the first and second column encoders 9A,9B generate first column address information CT and second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

Further, at time T56, the row decoder 4 selects the wrong word line WL among the plurality of word lines WL due to an error based on the input row address information RAD.

At time T57, the first and second row coder 6A,6B generate the first row address information RT and the second row address information RB, respectively, but in this example, the first row address information RT and the second row address information RB are generated as complementary relationships to each other according to the wrong word line WL.

Along with this, the first row determination circuit 5A outputs a first row determination signal RFLG ("L" level) because it is complementary to each other by comparing the first row address information RT and the second row address information RB.

At time T58, since the first row determination signal RFLG ("L" level) is set, the first column address information CT is output as it is to the flip-flops 77 to 79 as EXOR logical operation result CTO, respectively. Since the first column determination signal CFLG ("L" level) is set, the first row address information RT is directly outputted to the flip-flops 80 to 83 as EXOR logical operation result RTO.

The detector 5P outputs output address information AQ including erroneous row address information and column address information.

When the input address information IAD and the output address information AQ are compared with each other in the case where the input address information IAD is correct address information, the comparator 11 outputs a mismatch determination signal (Fail) to CPU20.

When an erroneous selection anomaly occurs in which an erroneous word line WL is selected from a plurality of word lines WL, the abnormality can be detected.

Figure 22:
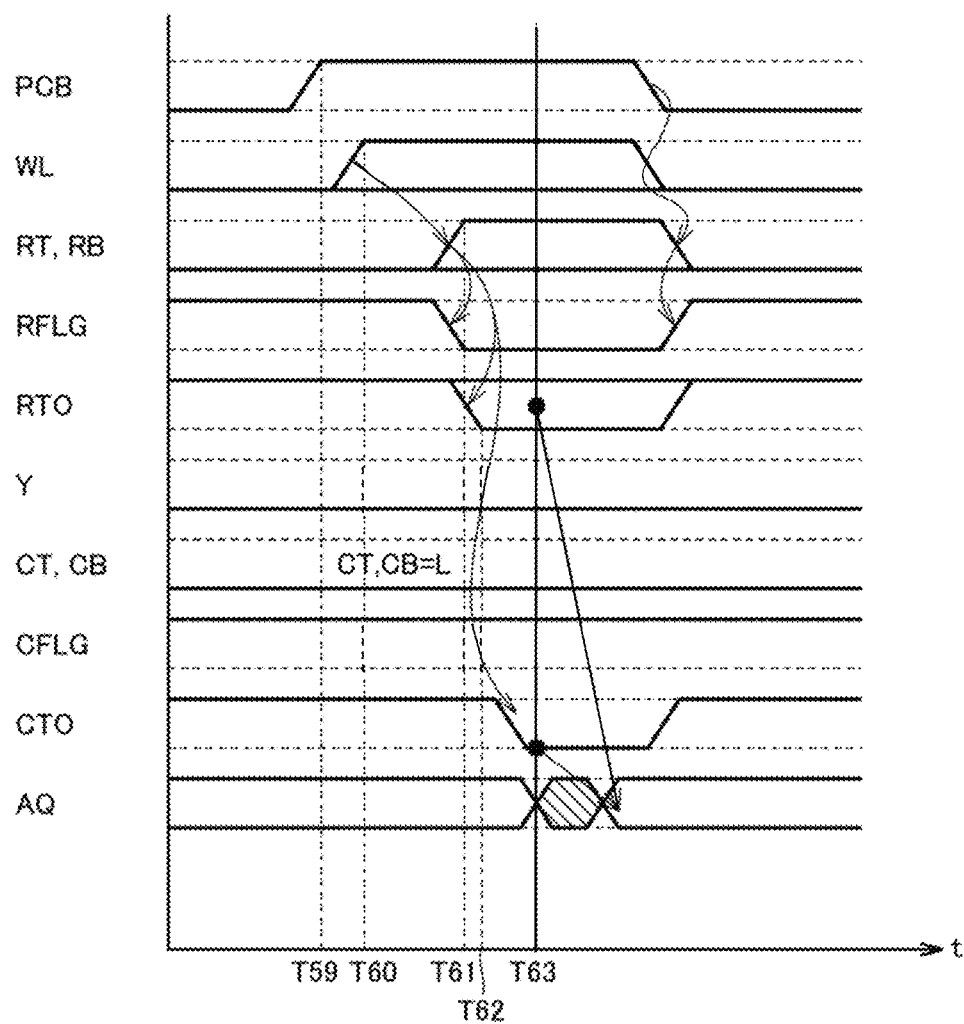
FIG. 22 is a fifth part of the timing chart diagram explaining the operation of the semiconductor device 1 # according to embodiment 2.

FIG. 22 is a timing chart (5) for explaining the operation of the semiconductor device 1 # according to the second embodiment.

In the present example, a case where the selection operation of the column selection line Y is not performed will be described.

As shown in FIG. 22, at time T59, the control signal PCB is set to a "H" level. Along with this, the precharge operation for the data lines DL[0] to DL[7] of the precharge circuit 6C is completed.

In this example, the column decoder 10 does not select one of the plurality of column selection lines Y based on the input column address information CAD.

The first and second column encoders 9A,9B generate the first column address information CT and the second column address information CB, respectively, but in the present embodiment, the first column address information CT and the second column address information CB are not generated as mutually complementary relationships.

Accordingly, the first column determination circuit 5C compares the first column address information CT with the second column address information CB, and maintains the first column determination signal CFLG ("H" level) because the first column determination circuit does not have a complementary relation with the second column address information CB.

At time T60, the row decoder 4 selects one of the plurality of word lines WL based on the input row address information RAD.

At time T61, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T62, since the first row determination signal RFLG ("L" level) is set, the first column address information CT is output as it is to the flip-flops 77 to 79 as EXOR logical operation result CTO, respectively. Since the first column determination signal CFLG is set to the "H" level, the first row address information RT is inverted and outputted to the flip-flops 80 to 83 as EXOR logical operation result RTO.

The detector 5P outputs output address information AQ including inverted row address information and erroneous column address information.

When the input address information IAD and the output address information AQ are compared with each other in the case where the input address information IAD is correct address information, the comparator 11 outputs a mismatch determination signal (Fail) to CPU20.

Therefore, when an unselected anomaly occurs in which one of the plurality of column selection lines Y is not selected, it is possible to detect the abnormality.

Figure 23:
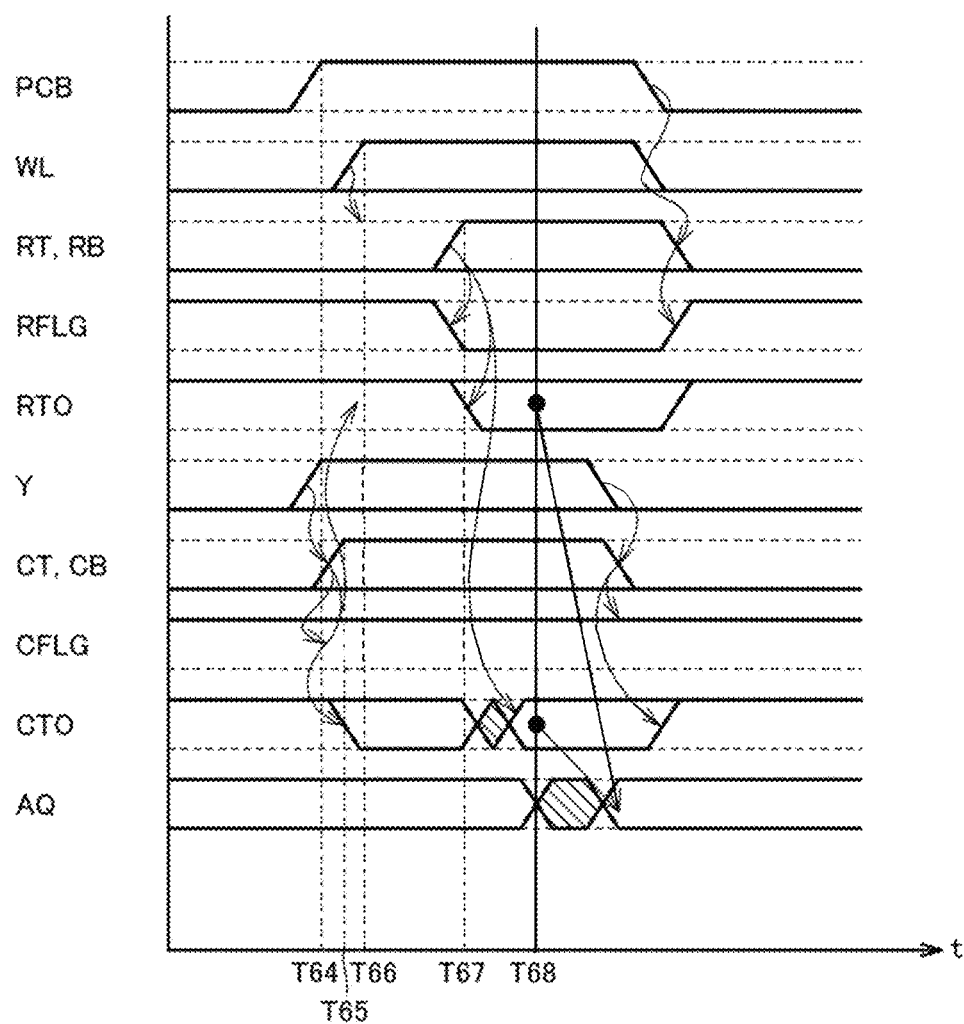
FIG. 23 is a sixth part of the timing chart diagram for explaining the operation of the semiconductor device 1 # according to the second embodiment.

FIG. 23 is a timing chart diagram for explaining the operation of the semiconductor device 1 # according to the second embodiment (Part 6).

In this example, a case where a plurality of column select lines Y among a plurality of column select lines Y are selected will be described.

As shown in FIG. 23, at time T64, the control signal PCB is set to a "H" level. Along with this, the precharge operation for the data lines DL[0] to DL[7] of the precharge circuit 6C is completed.

Further, at time T64, in this example, the column decoder 10 selects one of the plurality of column selection lines Y based on the input column address information CAD.

At time T65, the first and second column encoders 9A,9B generate the first column address information CT and the second column address information CB, respectively, but in this embodiment, the first column address information CT and the second column address information CB are not generated as complementary relationships with each other.

Accordingly, the first column determination circuit 5C compares the first column address information CT with the second column address information CB, and maintains the first column determination signal CFLG ("H" level) because the first column determination circuit does not have a complementary relation with the second column address information CB.

At time T66, the row decoder 4 selects one of the plurality of word lines WL based on the input row address information RAD.

At time T67, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T68, since the first row determination signal RFLG ("L" level) is set, the first column address information CT is output as it is to the flip-flops 77 to 79 as EXOR logical operation result CTO, respectively. Since the first column determination signal CFLG is set to the "H" level, the first row address information RT is inverted and outputted to the flip-flops 80 to 83 as EXOR logical operation result RTO.

The detector 5P outputs output address information AQ including inverted row address information and erroneous column address information.

When the input address information IAD and the output address information AQ are compared with each other in the case where the input address information IAD is correct address information, the comparator 11 outputs a mismatch determination signal (Fail) to CPU20.

Therefore, when a multi-selection anomaly occurs in which a plurality of column select lines Y among the plurality of column select lines Y are selected, it is possible to detect the abnormality.

Figure 24:
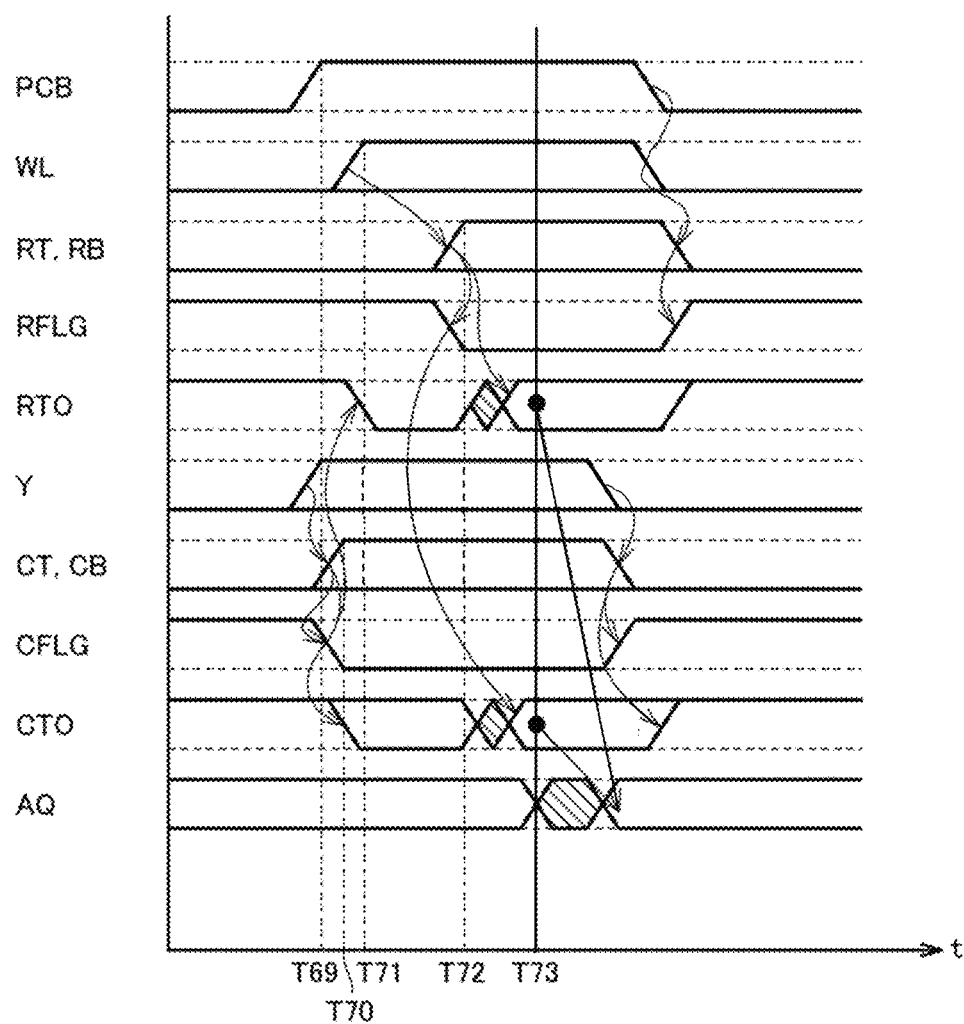
FIG. 24 is a seventh part of the timing chart diagram illustrating the operation of the semiconductor device 1 # according to the second embodiment.

FIG. 24 is a seventh timing chart illustrating the operation of the semiconductor device 1 # according to the second embodiment.

In this example, a case of an erroneous selection abnormality in which an erroneous column selection line Y is selected from a plurality of column selection lines Y will be described.

As shown in FIG. 24, at time T69, the control signal PCB is set to a "H" level. Along with this, the precharge operation for the data lines DL[0] to DL[7] of the precharge circuit 6C is completed.

Further, at time T69, in the present exemplary embodiment, the column decoder 10 selects an incorrect column selection line Y among the plurality of column selection lines Y based on the input column address information CAD.

At time T70, the first and second column encoders 9A,9B generate the first column address information CT and the second column address information CB, respectively, but in this embodiment, the first column address information CT and the second column address information CB are generated in complementary relation to each other in accordance with the erroneous column selection line Y.

Accordingly, the first column determination circuit 5C compares the first column address information CT with the second column address information CB, and outputs the first column determination signal CFLG ("L" level) because the first column determination circuit is complementary to the second column address information CB.

Further, at time T71, the row decoder 4 selects one of the plurality of word lines WL based on the input row address information RAD.

At time T72, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T73, since the first row determination signal RFLG ("L" level) is set, the first column address information CT is output as it is to the flip-flops 77 to 79 as EXOR logical operation result CTO, respectively. In addition, the first column determination signal CFLG ("H"

The first row address information RT is directly outputted as EXOR logical operation result RTO to the flip-flops 80 to 83.

The detector 5P outputs output address information AQ including row address information and erroneous column address information.

When the input address information IAD and the output address information AQ are compared with each other in the case where the input address information IAD is correct address information, the comparator 11 outputs a mismatch determination signal (Fail) to CPU20.

Therefore, when an erroneous selection anomaly occurs in which an erroneous column selection line Y is selected among the plurality of column selection lines Y, it is possible to detect the abnormality.

Embodiment 3

Figure 25:
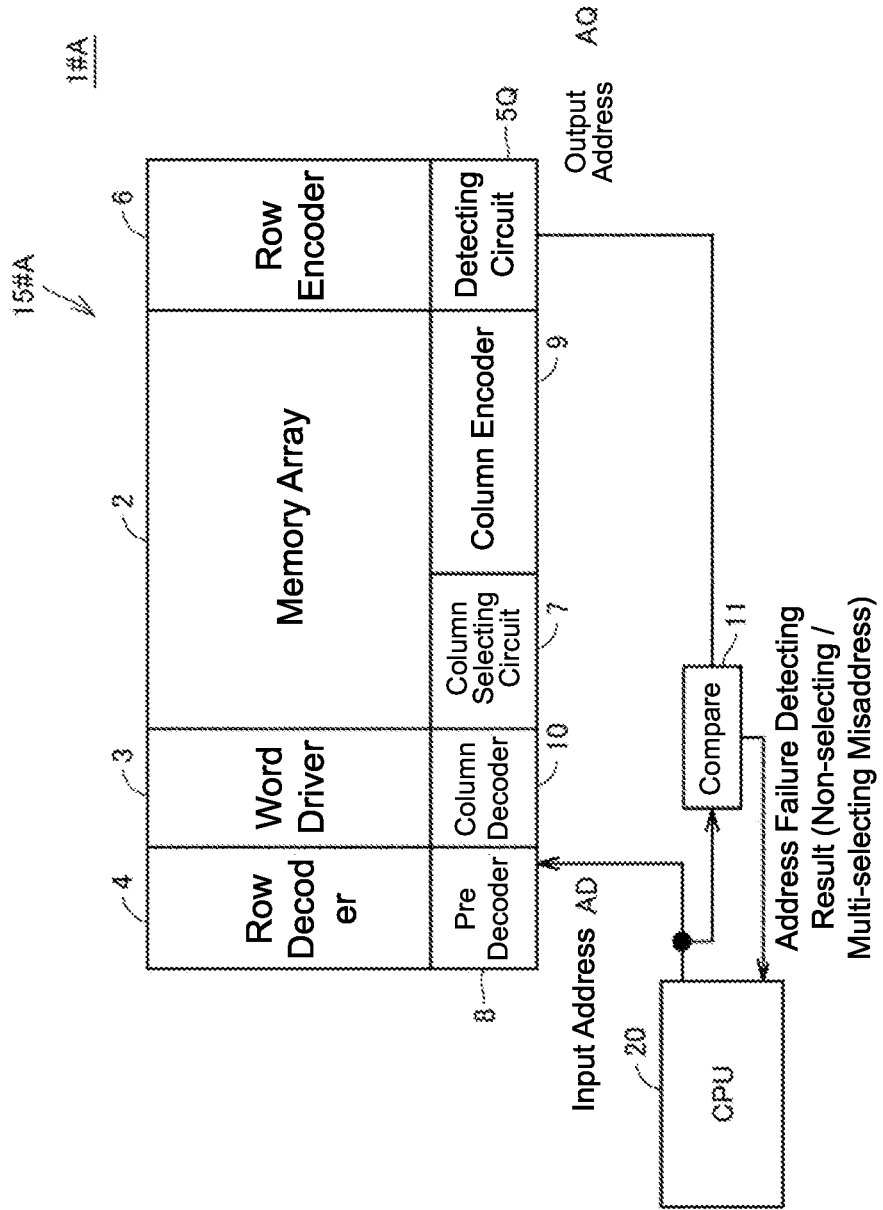
FIG. 25 is a diagram for explaining an outline of a semiconductor device 1 #A according to the third embodiment.

FIG. 25 is a diagram for explaining an outline of the semiconductor device 1 #A according to the third embodiment.

Referring to FIG. 25, the semiconductor device 1 #A includes a memory macro 15 #A, a CPU20, and a comparator 11.

CPU20 controls the memory macro 15 #A to acquire the data stored in the memory macro 15 #A.

The memory macro 15 #A differs from the memory macro 15 in that the detection circuit 5 is replaced with a detection circuit 5Q. Since the other configurations are the same, detailed description thereof will not be repeated.

The detecting circuit 5Q outputs the first row address information RT and the second row address information RB output from the row encoder 6 and the output address information AQ based on the first column address information CT and the second column address information CB output from the column encoder 9. The output address information AQ includes an output row address information ORAD and an output column address information OCAD.

The comparator circuit 11 compares the output address information AQ output from the detector circuit 5Q with the input address information IAD, and outputs the comparison result to CPU20.

Figure 26:
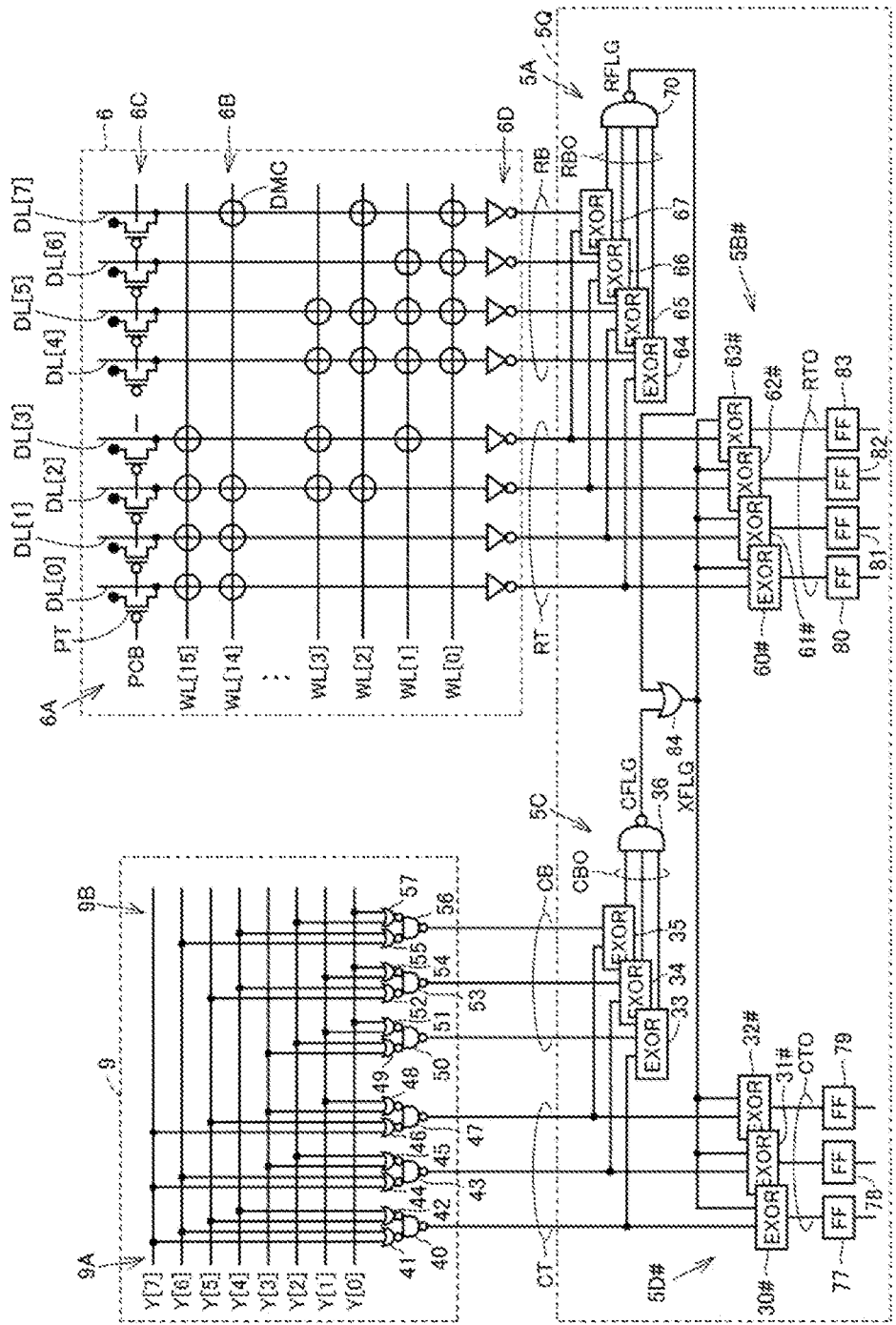
FIG. 26 is a diagram illustrating a circuit configuration of a detection circuit 5Q, a row encoder 6 and a column encoder 9 according to the third embodiment.

FIG. 26 is a diagram illustrating a circuit configuration of a detection circuit 5Q, a row encoder 6, and a column encoder 9 according to the third embodiment.

Referring to FIG. 26, compared to the detection circuit 5P of FIG. 16, differs in that further added OR circuit 84. The detection circuit 5Q includes a first row determination circuit 5A, a second row determination circuit 5B #, a first column determination circuit 5C, and a second column determination circuit 5D #.

The first row determination circuit 5A includes EXOR circuitry 64-67 and NAND circuitry 70.

The second row determination circuit 5B # includes EXOR circuitry 60 # to 63 # and flip-flops (FFFs) 80 to 83.

The first column determination circuit 5C includes EXOR circuitry 33-35 and NAND circuitry 36.

The second column determination circuitry 5D # includes EXOR circuitry 30 # to 32 # and flip-flops (FFs) 77 to 79.

The first row determination circuit 5A outputs a first row determination signal RFLG based on the comparison result by comparing the first row address information RT and the second row address information RB.

The first column determination circuit 5C compares the first column address information CT with the second column address information CB, and outputs a first column determination signal CFLG based on the compared result.

OR circuit 84 outputs the OR logic operation result XFLG of the first row determination signal RFLG and the first column determination signal CFLG to the second row determination circuit 5B # and the second column determination circuit 5D #, respectively.

The second row determination circuit OOC # generates the output row address information ORAD based on the first row address information RT and the OR-logical operation result XFLG.

The second column determination circuit OOC # generates the output column address information OCAD based on the second column address information CB and the OR-logical operation result XFLG.

When the OR logical operation result XFLG ("L" level) is inputted in the same manner as described in the second embodiment, the second row determination circuit OOB # stores the first row address information RT as EXOR logical operation result RTO in the flip-flops 80 to 83, respectively.

When the OR logical operation result XFLG ("L" level) is inputted, the second column determination circuit OOB # stores the first column address information CT as EXOR logical operation result CTO in the flip-flops 77 to 79, respectively.

On the other hand, when the OR logical operation result XFLG ("H" level) is inputted, the second row determination circuit OOB # inverts the first row address information RT and stores the inverted first row address information RT in the flip-flops 80 to 83 as EXOR logical operation result RTO.

In addition, when the OR logic operation result XFLG ("H" level) is input, the second column determination circuit 5D # inverts the first column address information CT and stores it as EXOR logic operation result CTO in the flip-flops 77 to 79, respectively.

Therefore, when there is an anomaly in the row decoder 4 or the column decoder 10, the first row determination signal RFLG, the OR logical operation result XFLG for one of the first column determination signal CFLG becomes H level is set to H level.

Therefore, when the OR-logical operation result XFLG is at the "H" level, both the first row address information RT and the second column address information CT are inverted and stored in the flip-flop.

Therefore, when the input address information IAD and the output address information AQ are compared with each other in the case where the input address information IAD is correct address information, the comparison circuit 11 outputs a mismatch determination signal (Fail) to CPU20.

FIG. 27 is a diagram for explaining an anomaly of the row decoder 4 and the column decoder 10 according to the third embodiment.

As shown in FIG. 27, when a non-selection abnormality occurs when no plurality of word lines WL are selected due to an abnormality of the row decoder 4 or when no plurality of column selection lines Y are selected due to an abnormality of the column decoder 10, the row address information and the column address information in the output address information AQ output from the detecting circuits 5Q are inverted.

Therefore, even when the input address information IAD is correct address information, the comparison circuit 11 outputs a determination signal (Fail) that does not coincide with the comparison result when the input address information IAD and the output address information AQ are compared with each other to CPU20.

When one of the plurality of word lines WL is normally selected and when one of the plurality of column select lines Y is normally selected, the output address information AQ output from the detecting circuits 5Q includes correct row address information and column address information.

Therefore, when the input address information IAD and the output address information AQ are compared with each other in the case where the input address information IAD is correct address information, the comparator 11 outputs a determination signal Pass that matches the comparison result to CPU20.

When a multi-selection anomaly occurs in the case where a plurality of word lines WL are selected among the plurality of word lines WL due to an abnormality of the row decoder 4, or when a multi-selection abnormality occurs in the case where a plurality of column select lines Y among the plurality of column select lines Y are selected due to an abnormality of the column decoder 10, the row address information and the column address information in the output address information AQ output from the detecting circuits 5Q are inverted.

Therefore, even when the input address information IAD is correct address information, the comparison circuit 11 outputs a determination signal (Fail) that does not coincide with the comparison result when the input address information IAD and the output address information AQ are compared with each other to CPU20.

When an erroneous selection anomaly occurs in which an erroneous word line WL is selected among the plurality of word lines WL due to an abnormality of the row decoders 4, or when an erroneous selection abnormality occurs in which an erroneous column selection line Y is selected among the plurality of column selection lines Y, the output address information AQ output from the detecting circuits 5Q includes erroneous row address information or column address information.

Therefore, even when the input address information IAD is correct address information, the comparison circuit 11 outputs a determination signal (Fail) that does not coincide with the comparison result when the input address information IAD and the output address information AQ are compared with each other to CPU20.

Figure 28:
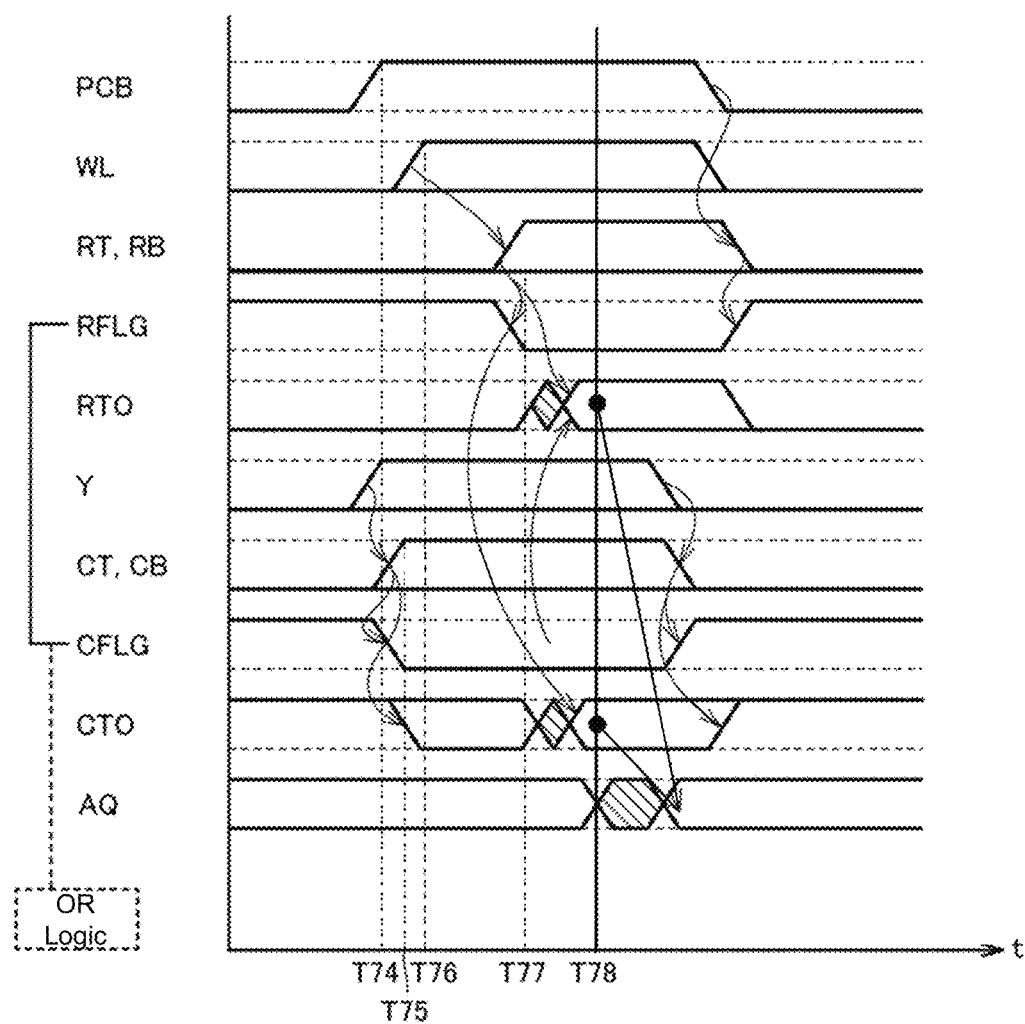
FIG. 28 is a first part of a timing chart diagram explaining the operation of the semiconductor device 1 #A according to embodiment 3.

FIG. 28 is a first timing chart illustrating the operation of the semiconductor device 1 #A according to the third embodiment.

In the present example, a case of normal operation will be described.

As shown in FIG. 28, at time T74, the control signal PCB is set to a "H" level. Along with this, the precharge operation for the data lines DL[0] to DL[7] of the precharge circuit 6C is completed.

Further, at time T74, the column decoder 10 selects one of the plurality of column selection lines Y based on the input column address information CAD.

At time T75, the first and second column encoders 9A,9B generate the first column address information CT and the second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

At time T76, the row decoder 4 selects one of the plurality of word lines WL based on the input row address information RAD.

At time T77, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T78, since the OR logical operation result XFLG ("L" level) between the first row determination signal RFLG ("L" level) and the first column determination signal CFLG ("L" level) is set, the first column address information CT is directly output as EXOR logical operation result CTO to the flip-flops 77 to 79, respectively. Since the first column determination signal CFLG ("L" level) is set, the first row address information RT is directly outputted to the flip-flops 80 to 83 as EXOR logical operation result RTO.

The detector 5Q outputs output address information AQ including correct row address information and column address information.

When the input address information IAD and the output address information AQ are compared with each other when the input address information IAD is correct address information, the comparator 11 outputs a coincidence determination signal Pass to CPU20.

Figure 29:
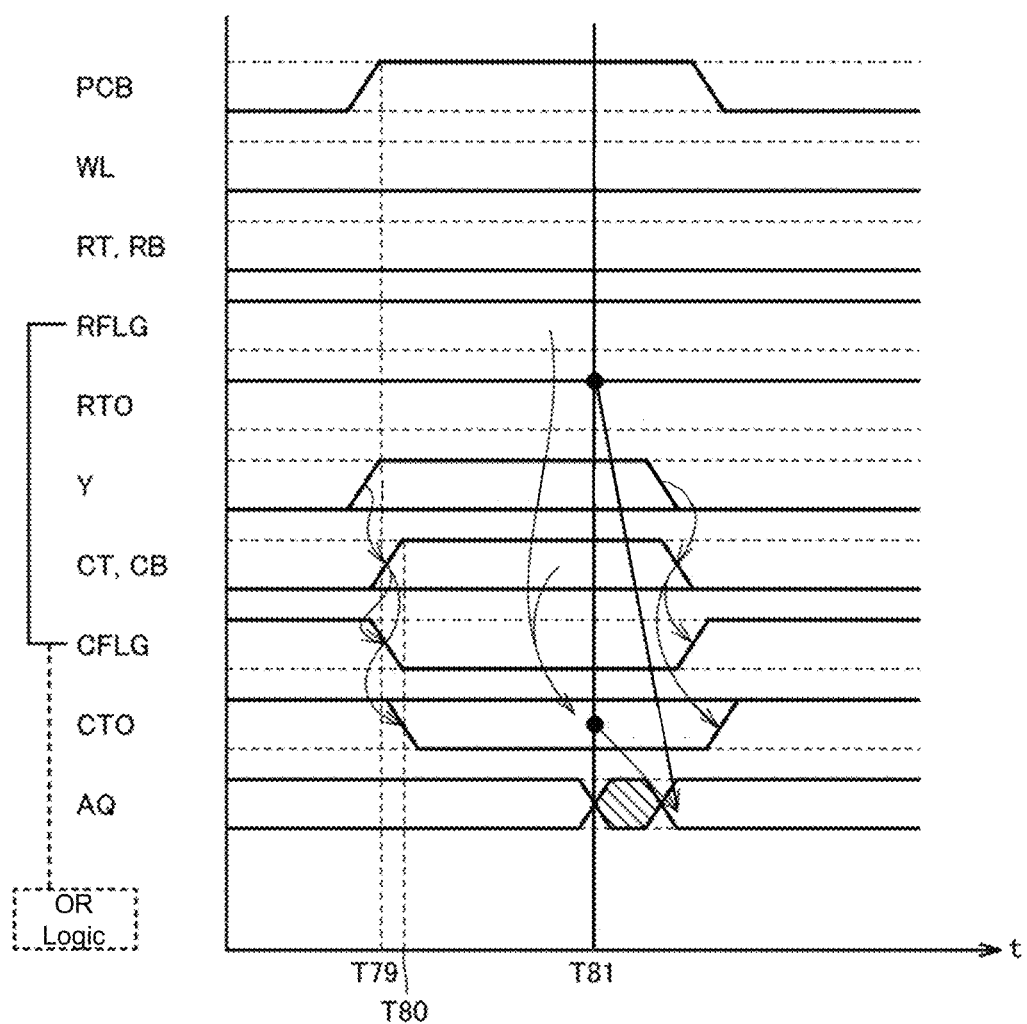
FIG. 29 is a second part of the timing chart diagram for explaining the operation of the semiconductor device 1 #A according to the third embodiment.

FIG. 29 is a timing chart diagram for explaining the operation of the semiconductor device 1 #A according to the third embodiment (Part 2).

In this example, a case where there is no operation of selecting the word line WL will be described.

As shown in FIG. 29, at time T79, the control signal PCB is set to a "H" level. Along with this, the precharge operation for the data lines DL[0] to DL[7] of the precharge circuit 6C is completed.

Further, at time T79, the column decoder 10 selects one of the plurality of column selection lines Y based on the input column address information CAD.

At time T80, the first and second column encoders 9A,9B generate first column address information CT and second column address information CB, respectively. In this example, the first column address information CT and the second column address information CB are generated as complementary relationships with each other.

Accordingly, the first column determination circuit 5C compares the first column address information CT with the second column address information CB, and outputs the first column determination signal CFLG ("L" level) because the first column determination circuit 5C has a complementary relation with the second column address information CB.

In this example, the row decoder 4 does not select one of the plurality of word lines WL based on the input row address information RAD due to an error.

The first and second row coders 6A,6B generate the first row address information RT and the second row address information respectively, but in this embodiment, the first row address information RT and the second row address information CT are not generated as complementary relationships with each other.

At time T81, since the OR logical operation result XFLG ("H" level) is set between the first row determination signal RFLG ("H" level) and the first column determination signal CFLG ("L" level), the first column address information CT is inverted and is output to the flip-flops 77 to 79 as EXOR logical operation result CTO, respectively. Since the OR logical operation result XFLG ("H" level) of the first row test signal RFLG ("H" level) and the first column determination signal CFLG ("L" level) is set, the first row address information RT ("1111") is inverted and outputted to the flip-flops 80 to 83 as EXOR logical operation result RTO ("0000"), respectively.

The detector 5Q outputs output address information AQ including inverted row address information and inverted column address information.

When the input address information IAD and the output address information AQ are compared with each other in the case where the input address information IAD is correct address information, the comparator 11 outputs a mismatch determination signal (Fail) to CPU20.

Therefore, when an unselected anomaly occurs in which one of the plurality of word lines WL is not selected, it is possible to detect the abnormality.

Figure 30:
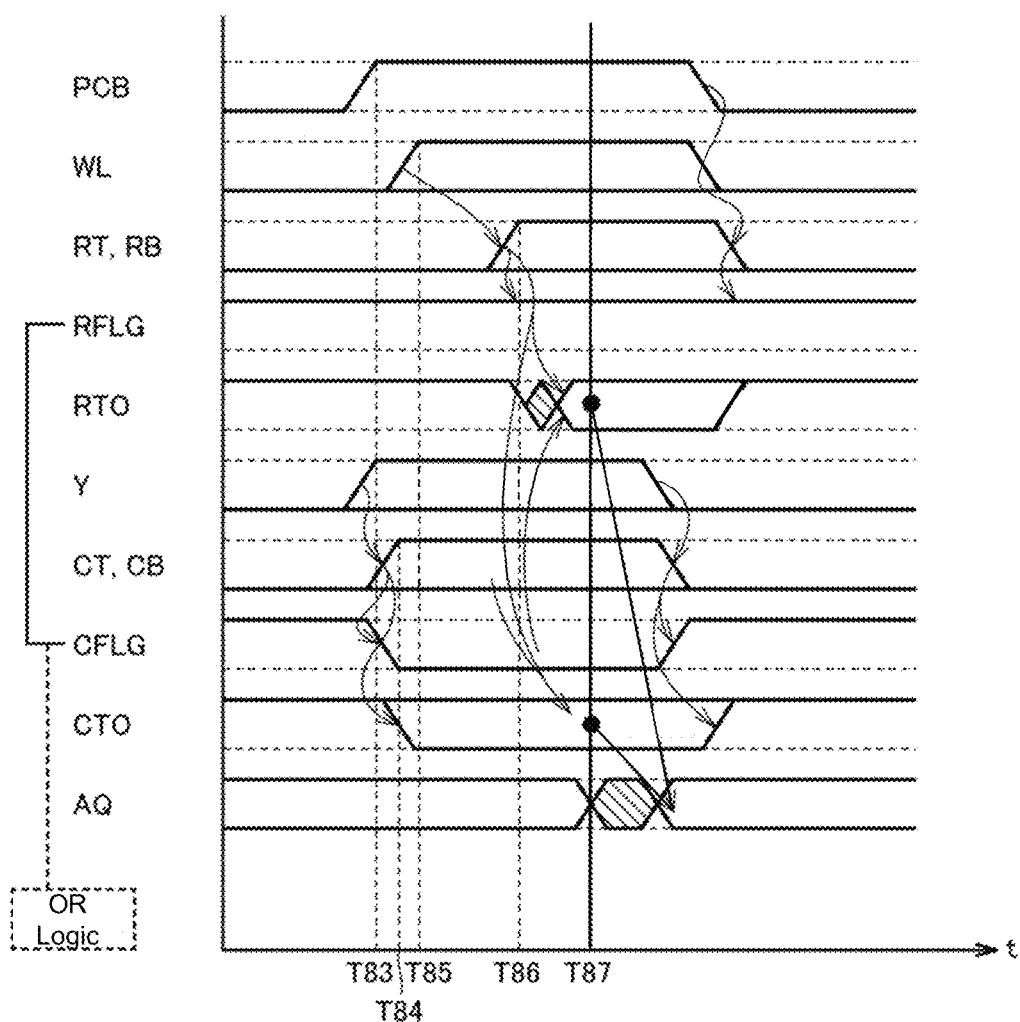
FIG. 30 is a third part of the timing chart diagram for explaining the operation of the semiconductor device 1 #A according to the third embodiment.

FIG. 30 is a timing chart diagram for explaining the operation of the semiconductor device 1 #A according to the third embodiment (Part 3).

In this example, a case where a plurality of word lines WL among a plurality of word lines WL is selected will be described.

As shown in FIG. 30, at time T83, the control signal PCB is set to a "H" level. Along with this, the precharge operation for the data lines DL[0] to DL[7] of the precharge circuit 6C is completed.

Further, at time T84, the column decoder 10 selects one of the plurality of column selection lines Y based on the input column address information CAD.

At time T84, the first and second column encoders 9A,9B generate the first column address information CT and the second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

At time T85, the row decoder 4 selects a plurality of word lines WL among the plurality of word lines WL due to an error based on the input row address information RAD.

At time T86, the first and second row coders 6A,6B generate the first row address information RT and the second row address information RB, respectively, but in the present embodiment, the first row address information RT and the second row address information RB are not generated as mutually complementary relationships.

Accordingly, the first row determination circuits 5A compare the first row address information RT and the second row address information RB and maintain the first row determination signals RFLG ("H" levels) because they are not complementary to each other.

At time T87, since the OR logical operation result XFLG ("H" level) is set between the first row determination signal RFLG ("H" level) and the first column determination signal CFLG ("L" level), the first column address information CT is inverted and is output to the flip-flops 77 to 79 as EXOR logical operation result CTO, respectively. Since the OR logical operation result XFLG ("H" level) of the first row determination signal RFLG ("H" level) and the first column determination signal CFLG ("L" level) is set, the first row address information RT (unknown) is inverted and outputted to the flip-flops 80 to 83 as EXOR logical operation result RTO.

The detector 5Q outputs output address information AQ including inverted row address information and inverted column address information.

When the input address information IAD and the output address information AQ are compared with each other in the case where the input address information IAD is correct address information, the comparator 11 outputs a mismatch determination signal (Fail) to CPU20.

When a multi-selection anomaly occurs in which a plurality of word lines WL are selected among the plurality of word lines WL, the abnormality can be detected.

Figure 31:
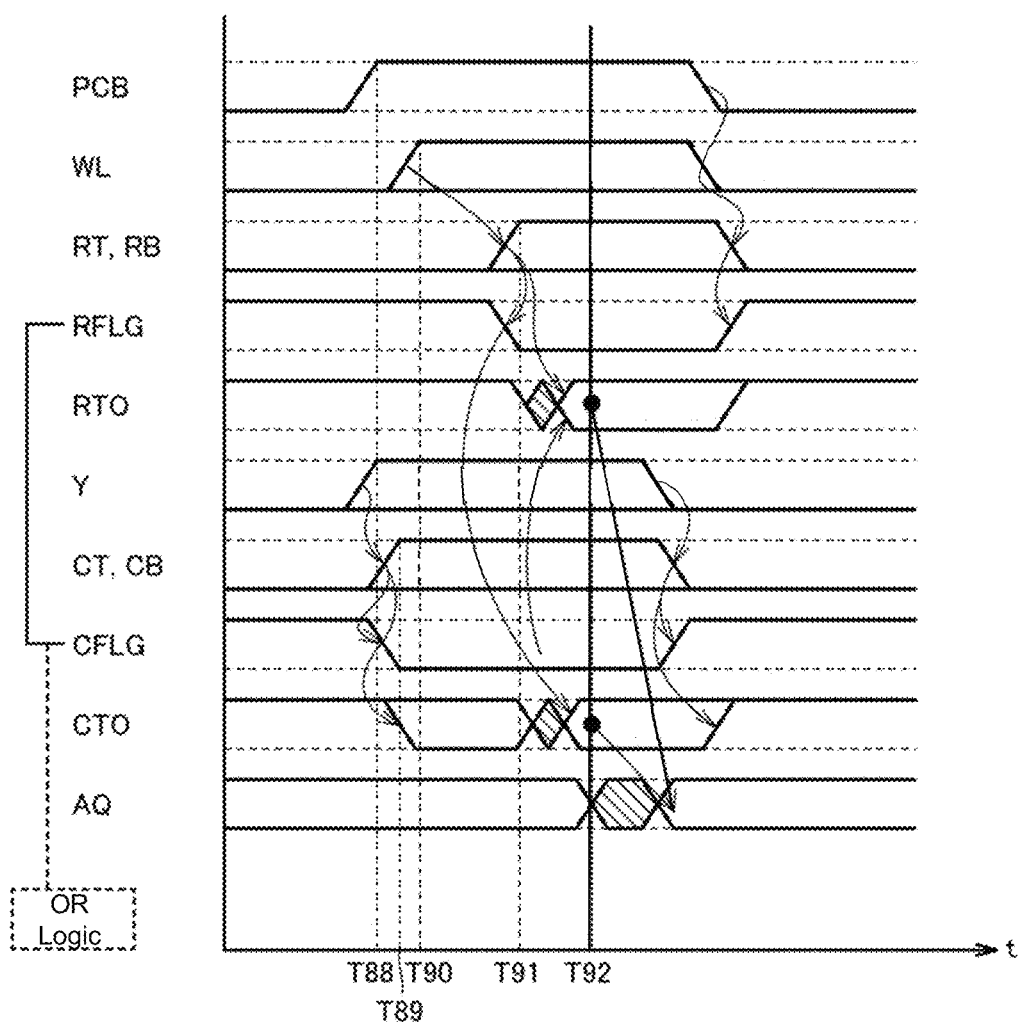
FIG. 31 is a fourth part of the timing chart diagram for explaining the operation of the semiconductor device 1 #A according to the third embodiment.

FIG. 31 is a timing chart diagram for explaining the operation of the semiconductor device 1 #A according to the third embodiment (its 4).

In this example, a case of an erroneous selection abnormality in which an erroneous word line WL is selected from a plurality of word lines WL will be described.

As shown in FIG. 31, at time T88, the control signal PCB is set to a "H" level. Along with this, the precharge operation for the data lines DL[0] to DL[7] of the precharge circuit 6C is completed.

Further, at time T88, the column decoder 10 selects one of the plurality of column selection lines Y based on the input column address information CAD.

At time T89, the first and second column encoders 9A,9B generate first column address information CT and second column address information CB, respectively. In this example, the first column address information CT and the second column address information CB are generated as complementary relationships with each other.

Accordingly, the first column relationship circuit 5C compares the first column address information CT and the second column address information CB and outputs the first column determination signal CFLG ("L" level) because the first column determination circuit 5C is complementary to each other.

Further, at time T90, the row decoder 4 selects the wrong word line WL among the plurality of word lines WL due to an error based on the input row address information RAD.

At time T91, the first and second row coder 6A,6B generate the first row address information RT and the second row address information RB, respectively, but in this example, the first row address information RT and the second row address information RB are generated as complementary relationships to each other according to the wrong word line WL.

Along with this, the first row determination circuit 5A outputs a first row determination signal RFLG ("L" level) because it is complementary to each other by comparing the first row address information RT and the second row address information RB.

At time T92, since the OR logical operation result XFLG ("L" level) is set between the first row determination signal RFLG ("L" level) and the first column determination signal CFLG ("L" level), the first column address information CT is directly output as EXOR logical operation result CTO to the flip-flops 77 to 79, respectively. Since the OR logical operation result XFLG ("L" level) of the first row determination signal RFLG ("L" level) and the first column determination signal CFLG ("L" level) is set, the first row address information RT is directly outputted to the flip-flops 80 to 83 as EXOR logical operation result RTO.

The detector 5P outputs output address information AQ including erroneous row address information and column address information.

When the input address information IAD and the output address information AQ are compared with each other in the case where the input address information IAD is correct address information, the comparator 11 outputs a mismatch determination signal (Fail) to CPU20.

When an erroneous selection anomaly occurs in which an erroneous word line WL is selected from a plurality of word lines WL, the abnormality can be detected.

Figure 32:
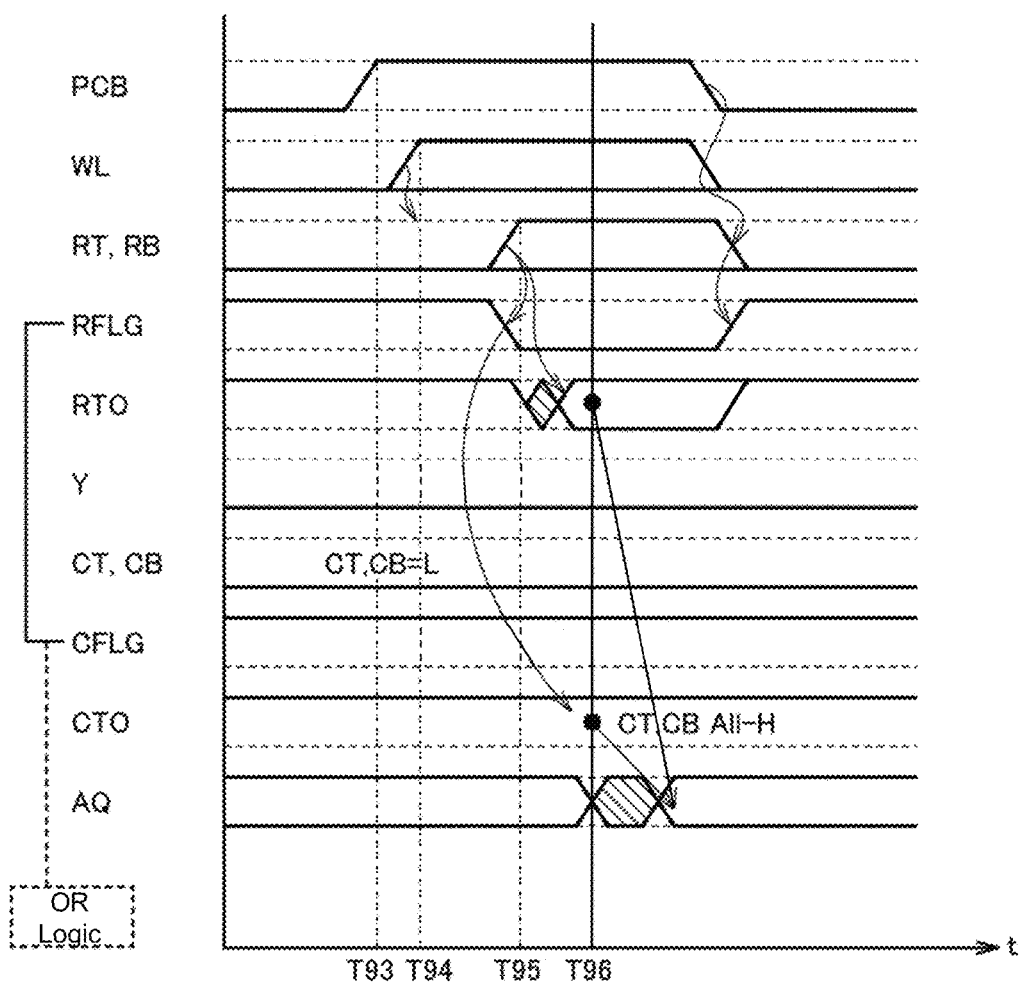
FIG. 32 is a fifth part of the timing chart diagram explaining the operation of the semiconductor device 1 #A according to embodiment 3.

FIG. 32 is a timing chart (5) illustrating the operation of the semiconductor device 1 #A according to the third embodiment.

In the present example, a case where the selection operation of the column selection line Y is not performed will be described.

As shown in FIG. 32, at time T93, the control signal PCB is set to a "H" level. Along with this, the precharge operation for the data lines DL[0] to DL[7] of the precharge circuit 6C is completed.

In this example, the column decoder 10 does not select one of the plurality of column selection lines Y based on the input column address information CAD.

The first and second column encoders 9A,9B generate the first column address information CT and the second column address information CB, respectively, but in the present embodiment, the first column address information CT and the second column address information CB are not generated as mutually complementary relationships.

Accordingly, the first column determination circuit 5C compares the first column address information CT with the second column address information CB, and maintains the first column determination signal CFLG ("H" level) because the first column determination circuit does not have a complementary relation with the second column address information CB.

At time T94, the row decoder 4 selects one of the plurality of word lines WL based on the input row address information RAD.

At time T95, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

At time T96, since the OR logical operation result XFLG ("H" level) is set between the first row determination signal RFLG ("L" level) and the first column determination signal CFLG ("H" level), the first column address information CT is inverted and is output to the flip-flops 77 to 79 as EXOR logical operation result CTO, respectively. Since the OR logical operation result XFLG ("H" level) between the first low determination signal RFLG ("L" level) and the first column determination signal CFLG ("H" level) is set, the first low address information RT is inverted and is output to the flip-flops 80 to 83 as EXOR logical operation result RTO, respectively.

The detector 5Q outputs output address information AQ including inverted row address information and inverted column address information.

When the input address information IAD and the output address information AQ are compared with each other in the case where the input address information IAD is correct address information, the comparator 11 outputs a mismatch determination signal (Fail) to CPU20.

Therefore, when an unselected anomaly occurs in which one of the plurality of column selection lines Y is not selected, it is possible to detect the abnormality.

Figure 33:
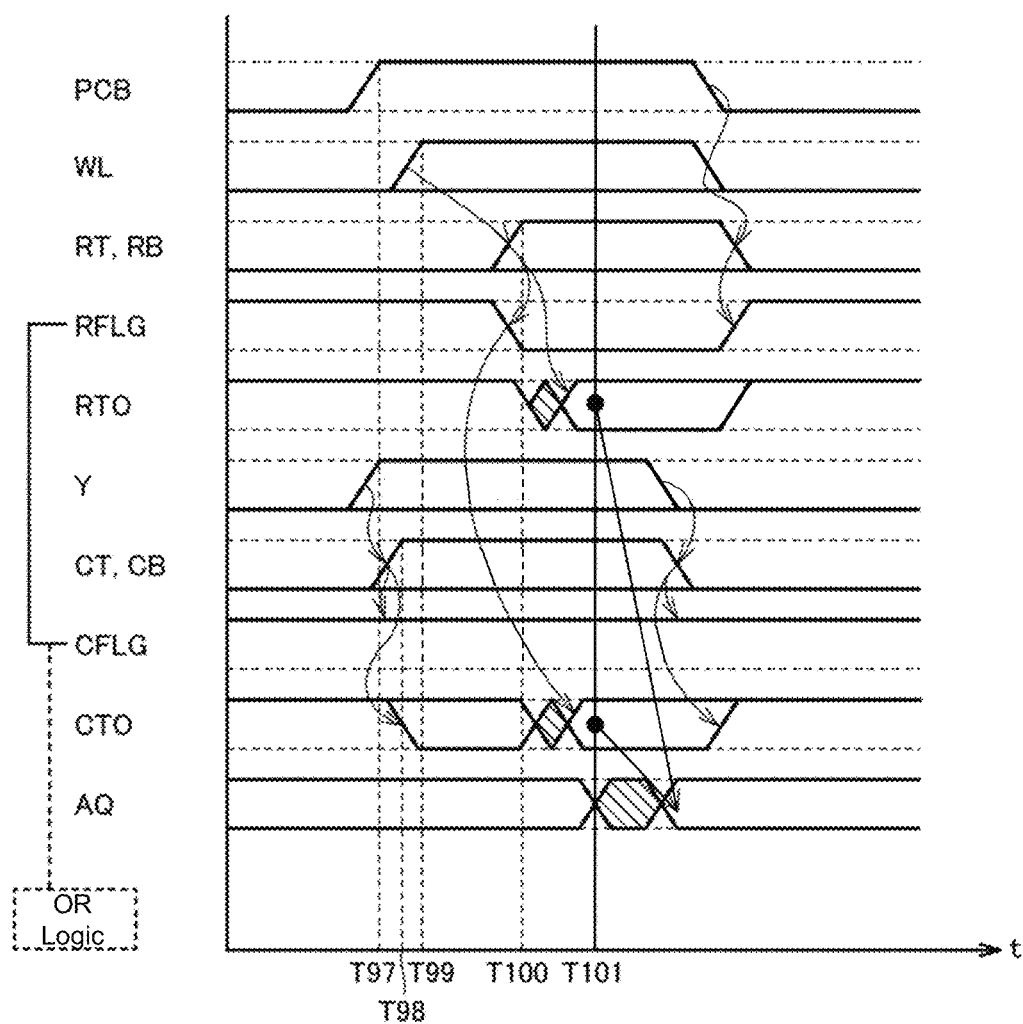
FIG. 33 is a sixth part of the timing chart diagram for explaining the operation of the semiconductor device 1 #A according to the third embodiment.

FIG. 33 is a timing chart diagram for explaining the operation of the semiconductor device 1 #A according to the third embodiment (Part 6).

In this example, a case where a plurality of column select lines Y among a plurality of column select lines Y are selected will be described.

As shown in FIG. 33, at time T97, the control signal PCB is set to a "H" level. Along with this, the precharge operation for the data lines DL[0] to DL[7] of the precharge circuit 6C is completed.

Further, at time T97, in this example, the column decoder 10 selects one of the plurality of column selection lines Y based on the input column address information CAD.

At time T98, the first and second column encoders 9A,9B generate the first column address information CT and the second column address information CB, respectively, but in this embodiment, the first column address information CT and the second column address information CB are not generated as complementary relationships with each other.

Accordingly, the first column determination circuit 5C compares the first column address information CT with the second column address information CB, and maintains the first column determination signal CFLG ("H" level) because the first column determination circuit does not have a complementary relation with the second column address information CB.

At time T99, the row decoder 4 selects one of the plurality of word lines WL based on the input row address information RAD.

At time T100, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

In the time T101, since the OR logical operation result XFLG ("H" level) between the first row determination signal RFLG ("L" level) and the first column determination signal CFLG ("H" level) is set, the first column address information CT is inverted and is output to the flip-flops 77 to 79 as EXOR logical operation result CTO, respectively. Further, since the OR logical operation result XFLG ("H" level) between the first low determination signal RFLG ("L" level) and the first column determination signal CFLG ("H" level) is set, the first low address information RT is inverted and is output to the flip-flops 80 to 83 as EXOR logical operation result RTO, respectively.

The detector 5Q outputs output address information AQ including inverted row address information and inverted column address information.

When the input address information IAD and the output address information AQ are compared with each other in the case where the input address information IAD is correct address information, the comparator 11 outputs a mismatch determination signal (Fail) to CPU20.

Therefore, when a multi-selection anomaly occurs in which a plurality of column select lines Y among the plurality of column select lines Y are selected, it is possible to detect the abnormality.

Figure 34:
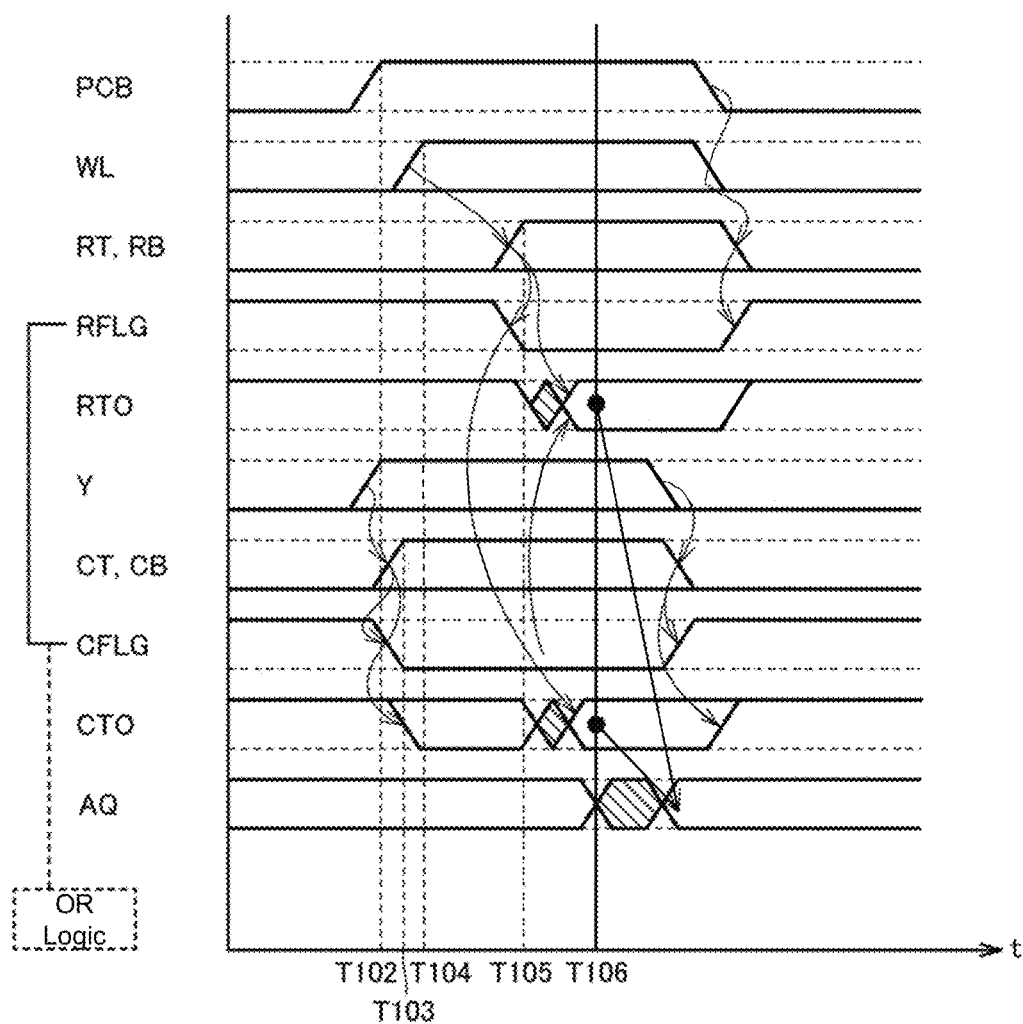
FIG. 34 is a seventh part of the timing chart diagram for explaining the operation of the semiconductor device 1 #A according to the third embodiment.

FIG. 34 is a timing chart diagram illustrating the operation of the semiconductor device 1 #A according to the third embodiment (Part 7).

In this example, a case of an erroneous selection abnormality in which an erroneous column selection line Y is selected from a plurality of column selection lines Y will be described.

As shown in FIG. 34, at time T102, the control-signal PCBs are set to a "H" level. Along with this, the precharge operation for the data lines DL[0] to DL[7] of the precharge circuit 6C is completed.

Further, in the time T102, in the present exemplary embodiment, the column decoder 10 selects an incorrect column selection line Y among the plurality of column selection lines Y based on the input column address information CAD.

At time T103, the first and second column encoders 9A,9B generate the first column address information CT and the second column address information CB, respectively, but in this embodiment, the first column address information CT and the second column address information CB are generated in complementary relation to each other in accordance with an erroneous column selection line Y.

Accordingly, the first column determination circuit 5C compares the first column address information CT with the second column address information CB, and outputs the first column determination signal CFLG ("L" level) because the first column determination circuit is complementary to the second column address information CB.

Further, in the time T104, the row decoder 4 selects one of the plurality of word lines WL based on the input row address information RAD.

At time T105, the first and second row coders 6A,6B generate first row address information RT and second row address information RB, respectively. In this example, the first row address information RT and the second row address information RB are generated as complementary relationships with each other.

Along with this, the first row determination circuit 5A outputs a first row determination signal RFLG ("L" level) because it is complementarily related to each other by comparing the first row address information RT and the second row address information RB.

In the time T106, since the OR logical operation result XFLG ("L" level) between the first row test signal RFLG ("L" level) and the first column determination signal CFLG ("H" level) is set, the first column address information CT is output to the flip-flops 77 to 79 as EXOR logical operation result CTO as it is. Since the first row address information RT is set to the OR logical operation result XFLG ("L" level) of the first row determination signal RFLG ("L" level) and the first column determination signal CFLG ("L" level), the first row address information RT is directly outputted to the flip-flops 80 to 83 as EXOR logical operation result RTO.

The detector 5Q outputs output address information AQ including row address information and erroneous column address information.

When the input address information IAD and the output address information AQ are compared with each other in the case where the input address information IAD is correct address information, the comparator 11 outputs a mismatch determination signal (Fail) to CPU20.

Therefore, when an erroneous selection anomaly occurs in which an erroneous column selection line Y is selected among the plurality of column selection lines Y, it is possible to detect the abnormality.

Embodiment 4

Figure 35:
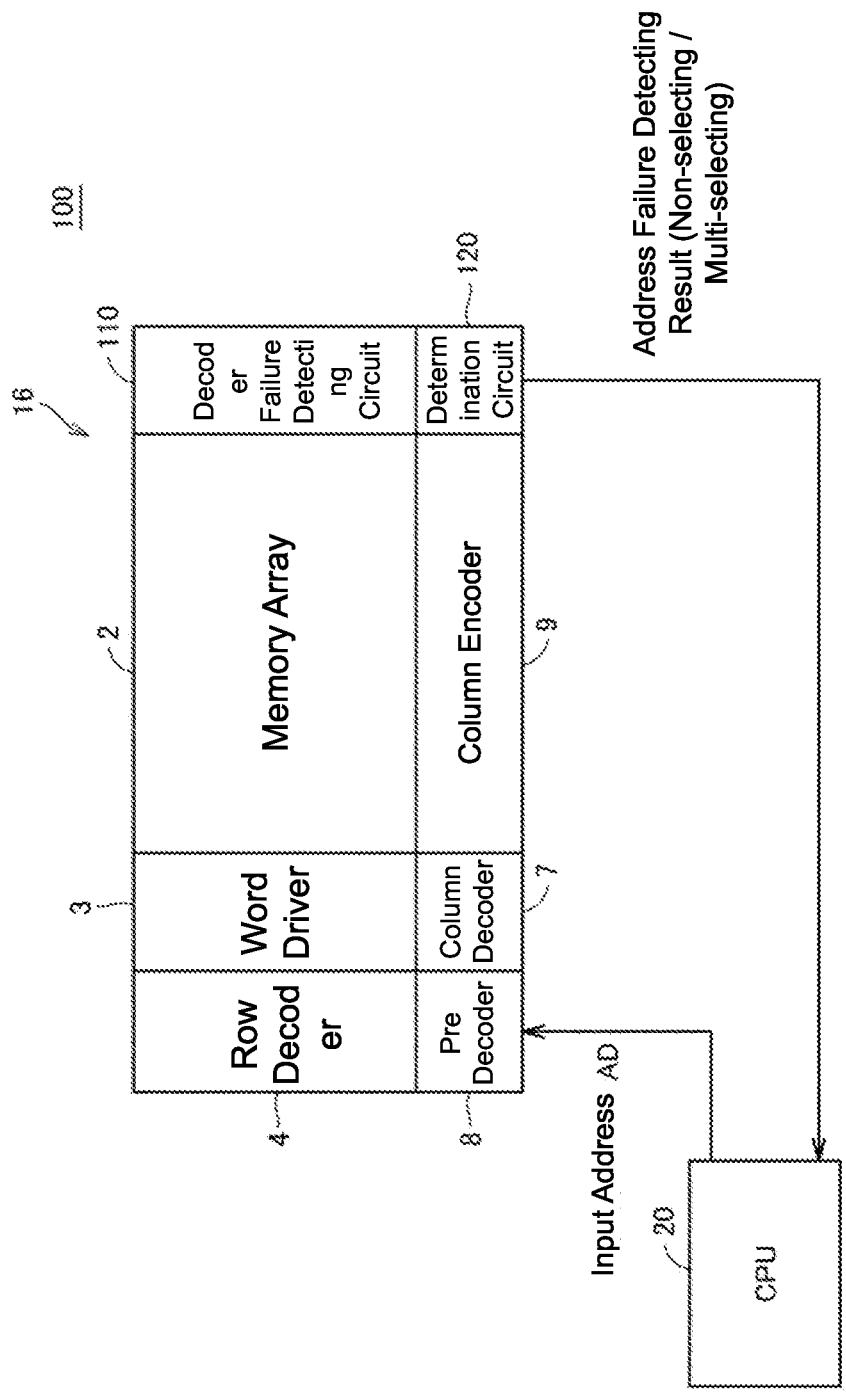
FIG. 35 it is a diagram for explaining an outline of a semiconductor device 100 according to the fourth embodiment.

FIG. 35 is a diagram for explaining an outline of the semiconductor device 100 according to the fourth embodiment.

Referring to FIG. 35, the semiconductor device 100 includes a memory macro 16 and a CPU20.

CPU20 controls the memory macro 16 to acquire data stored in the memory macro 16.

The memory macro 16 includes a memory array 2, a word driver 3, a row decoder 4, a decoder failure detection circuit 110, a column selection circuit 7, a predecoder 8, a column decoder 10, and a determination circuit 120.

Since the memory array 2, the word driver 3, the row decoder 4, the column selection circuit 7, the predecoder 8, and the column decoder 10 are the same as those described in the above embodiment, detailed description thereof will not be repeated.

The decoder fault detection circuit 110 detects abnormalities in the row decoder 4 and column decoder 10.

Determination circuit 120 outputs an abnormal signal to CPU20 based on the detection signal from the decoder failure detection circuit 110.

In this example, a case of detecting a non-selection anomaly and a multi-selection abnormality by the row decoder 4 and the column decoder 10 will be described.

Figure 36:
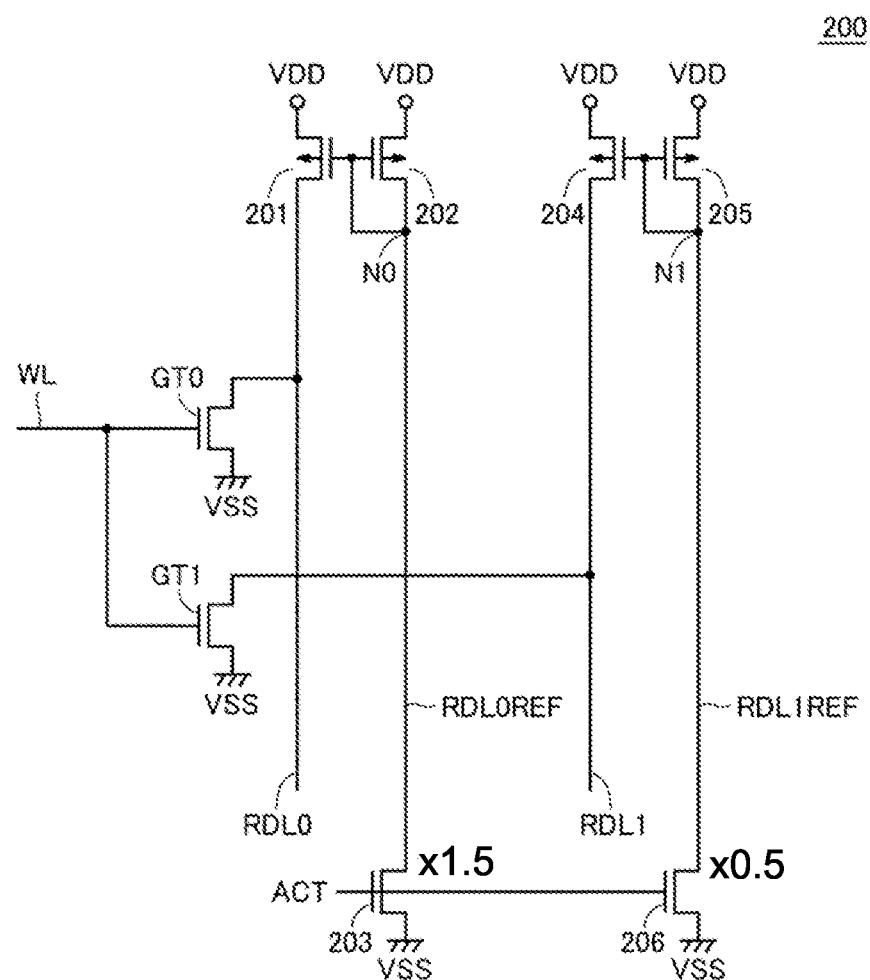
FIG. 36 it is a diagram illustrating a decoder failure detection circuit 200 of the row side according to the fourth embodiment.

FIG. 36 is a diagram illustrating a decoder fault detection circuit 200 on the row side according to the fourth embodiment.

Referring to FIG. 36, the row-side decoder fault detection circuit 200 includes a row-side data line RDL0,RDL1, a row-side reference data line RDL0REF,RDL1REF, a P-channel MOS transistor 201,202,204,205, an N-channel MOS transistor 203,206, and a gate transistor GT0,GT1.

An N-channel MOS transistor 203 is provided between a reference data line RDL0REF and a fixed voltage VSS, the gate receiving an input of the control signal ACT.

The P-channel MOS transistor 202 is provided between the power supply voltage VDD and the reference data line RDL0REF, and its gate is connected to the drain-side node N0. The P-channel MOS transistor 201 is provided between the power supply voltage VDD and the data line RDL0, and its gate is connected to the node N0. The P-channel MOS transistors 201 and 202 form a current mirror circuit.

An N-channel MOS transistor 206 is provided between a reference data line RDL1REF and a fixed voltage VSS, the gate receiving an input of the control signal ACT.

P-channel MOS transistor 205 is provided between the power supply voltage VDD and the reference data line RDL1REF, the gate is connected to the drain-side node N1. A P-channel MOS transistor 204 is provided between the power supply voltage VDD and the data line RDL1, the gate of which is connected to node N1. P-channel MOS transistor 204,205 forms a current mirror circuit.

Further, in the present exemplary embodiment, a gate transistor GT0,GT1 is provided corresponding to the word line WL. The gate transistor GT0,GT1 is an N-channel MOS transistor. In this exemplary embodiment, a gate transistor GT0,GT1 corresponding to one word line WL is provided.

A gate transistor GT0 is provided between the data line RDL0 and the fixed voltage VSS, the gate of which is connected to the word line WL.

A gate transistor GT1 is provided between the data line RDL1 and the fixed voltage VSS, the gate of which is connected to the word line WL.

In this example, for the size of the gate transistor GT0, GT1, the size of the N-channel MOS transistor 203 is set to a size of 1.5 times, and the N-channel MOS transistor 201 is set to a size of 0.5 times.

When the word line WL is set to "H" level, the gate transistor GT0,GT1 conducts. This causes current to flow through the gate transistor GT0,GT1.

On the other hand, for the size of the gate transistor GT0,GT1, the size of the N-channel MOS transistor 203 is set to 1.5 times, the data line RDL0 is set to "H" level, and the data line RDL1 is set to "L" level because the size of the N-channel MOS transistor 201 is set to 0.5 times the size.

If word line WL is not selected, i.e. set to "L" level, the gate transistor GT0,GT1 will not conduct.

In this instance, both the data lines RDL0,RDL1 are maintained at the "H" level.

When a plurality of word lines WL are set to "H" level, a plurality of gate transistor GT0,GT1 are conducted. This causes current to flow through the gate transistor GT0,GT1.

For the size of the gate transistor GT0,GT1, the size of the N-channel MOS transistor 203 is set to a size of 1.5 times and the N-channel MOS transistor 201 to a size of 0.5 times, but since the plurality of gate transistor GT0,GT1 are conducted, the data line RDL0,RDL1 is set to both "L" levels.

The decoder failure detection circuit on the column side is the same configuration.

Specifically, a gate transistor GT is provided corresponding to each of the column select lines Y. The data line CDL0,RDL1 on the column side, the reference data line RDL0REF,RDL1REF on the column side, and the like are provided in the same manner.

When the column select line Y is set to a "H" level, the gate transistor GT conducts. The data line CDL0 is set to the "H" level, and the data line CDL1 is set to the "L" level.

If column select line Y is not selected, i.e. set to "L" level, the gate transistor GT will not conduct. Both the data lines CDL0,CDL1 are maintained at the "H" level.

When multiple column select lines Y are set to a "H" level, multiple gate transistors GT are conducted. Both data lines CDL0,CDL1 are set to "L" levels.

FIG. 37 is a diagram illustrating a detection result of a decoder failure detection circuit 110 according to a fourth embodiment.

As shown in FIG. 37, when there is no selection anomaly when one of the plurality of word lines WL is not selected due to the abnormality of the row decoder 4, both the data line RDL0,RDL1 are set to the "H" level. When a multi-selection anomaly occurs in the case where a plurality of word lines WL are selected among the plurality of word lines WL due to an abnormality in the row decoders 4, both the data lines RDL0,RDL1 are set to "L" levels.

When the row decoders 4 are normal, the data lines RDL0,RDL1 are set to the "H" level and the "L" level, respectively.

In the case of a non-selection anomaly in which no plurality of column selection lines Y are selected due to an abnormality in the column decoders 10, both the data lines CDL0,CDL1 are set to "H" levels. When multiple selection anomalies occur when a plurality of column selection lines Y among the plurality of column selection lines Y are selected due to abnormalities in the column decoders 10, both the data lines CDL0,CDL1 are set to "L" levels.

When the column decoder 10 is normal, the data line CDL0,CDL1 is set to the "H" level and the "L" level, respectively.

Figure 38:
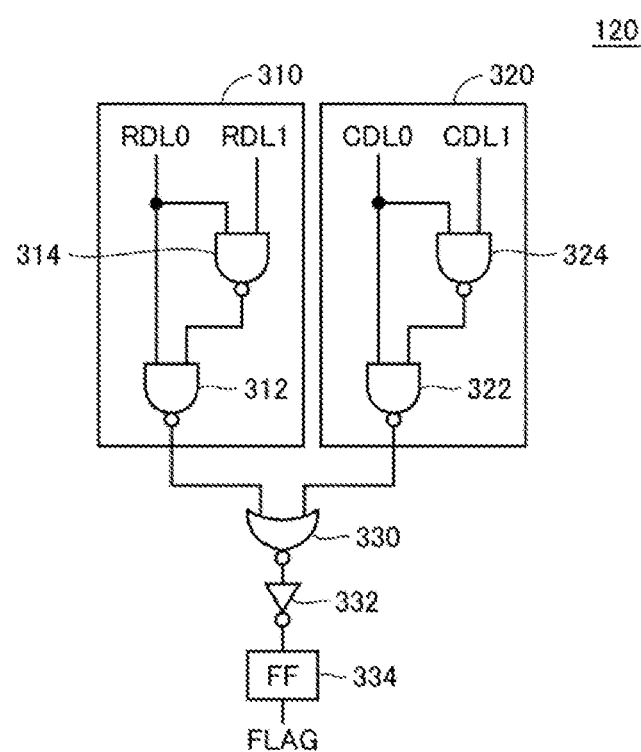
FIG. 38 is a circuit configuration diagram of a determination circuit 120 according to the fourth embodiment.

FIG. 38 is a circuit configuration diagram of the determination circuit 120 according to the fourth embodiment.

Referring to FIG. 38, the determination circuit 120 includes first and second determination units 310,320, a NOR circuit 330, an inverter 332, and a flip-flop (FF) 334.

The first determination unit 310 includes NAND circuits 312, 314.

NAND circuit 314 outputs NAND logical operation result to RDL0 circuit 312 by receiving a signal input from the data line and RDL1.

NAND circuit 312 receives a signal from the data line RDL0 and an output from NAND circuit 314 and outputs NAND logical operation result to the NOR circuit 330.

In this embodiment, when the data line RDL0,RDL1 is both "H" level, and both are "L" level, the output of NAND circuitry 312 is set to "H" level.

On the other hand, when the data line RDL0,RDL1 is "H" level and "L" level, the output of NAND circuitry 312 is set to "L" level.

The second determination unit 320 includes NAND circuits 322 and 324.

NAND circuit 324 outputs NAND logical operation result to CDL0 circuit 322 by receiving a signal input from the data line and CDL1.

NAND circuit 322 receives a signal from the data line CDL0 and an output from NAND circuit 324 and outputs NAND logical operation result to the NOR circuit 330.

In this embodiment, when the data line CDL0,CDL1 is both "H" level, and both are "L" level, the output of NAND circuitry 322 is set to "H" level.

On the other hand, when the data line CDL0,CDL1 is "H" level and "L" level, the output of NAND circuitry 322 is set to "L" level.

NOR circuit 330 receives the input of NAND circuit 312 and 322 and outputs the NOR logic operation result to the inverter 332.

Inverter 332 inverts the signal of the NOR circuit 330 is stored in the flip-flop (FF) 334.

In the present exemplary embodiment, when the output of either one of NAND circuitry 312 and 322 is at the "H" level, the "H" level is stored in the flip-flop (FF) 334 abnormal signal FLAG ("H" level) is output.

FIG. 39 is a diagram for explaining an anomaly of the row decoder 4 and the column decoder 10 according to the fourth embodiment.

As shown in FIG. 39, when a non-selection anomaly occurs in the case where no plurality of word lines WL are selected or a multi-selection abnormality occurs in the case where a plurality of word lines WL are selected among the plurality of word lines WL due to an abnormality of the row decoders 4, the abnormality signals FLAG (H level) are set in accordance with outputs (H level) of NAND circuits 312.

When a non-selection anomaly occurs in the case where no plurality of column selection lines Y are selected or a multi-selection abnormality occurs in the case where a plurality of column selection lines Y are selected among the plurality of column selection lines Y due to an abnormality of the column decoders 10, the abnormality signals FLAG (H level) are set in accordance with outputs (H level) of NAND circuits 322.

When both the row decoder 4 and the column decoder 10 are normal, the error signal FLAG is set to "L" level.

Figure 40:
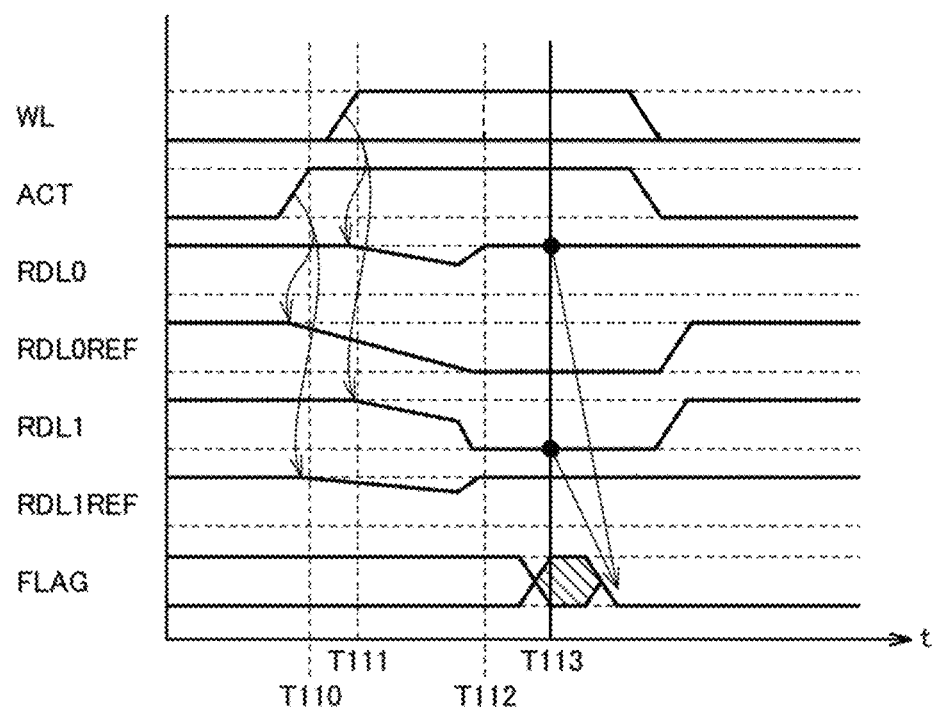
FIG. 40 is a first part of a timing chart diagram explaining the operation of the semiconductor device 100 according to embodiment 4.

FIG. 40 is a timing chart illustrating the operation of the semiconductor device 100 according to the fourth embodiment.

In the present example, a case of normal operation will be described.

As shown in FIG. 40, at time T110, the control signal ACT is set to a "H" level. The decoder fault detection circuit 110 operates accordingly.

The reference data line RDL0REF,RDL1REF begins to fall to a "L" level according to the size of the transistor.

In time T111, the row decoder 4 selects one of the plurality of word lines WL based on the input row address information RAD. Along with this, the gate transistor GT0, GT1 is conducted.

At the time T112, the data line RDL0,RDL1 is amplified to the "H" level and the "L" level, respectively.

Next, at time T113, the determination circuit 120, the data line RDL0 ("H" level), and outputs an abnormal signal FLAG ("L" level) based on RDL1 ("L" level).

Although the word line WL has been described in this example, the same applies to the column selection line Y.

Figure 41:
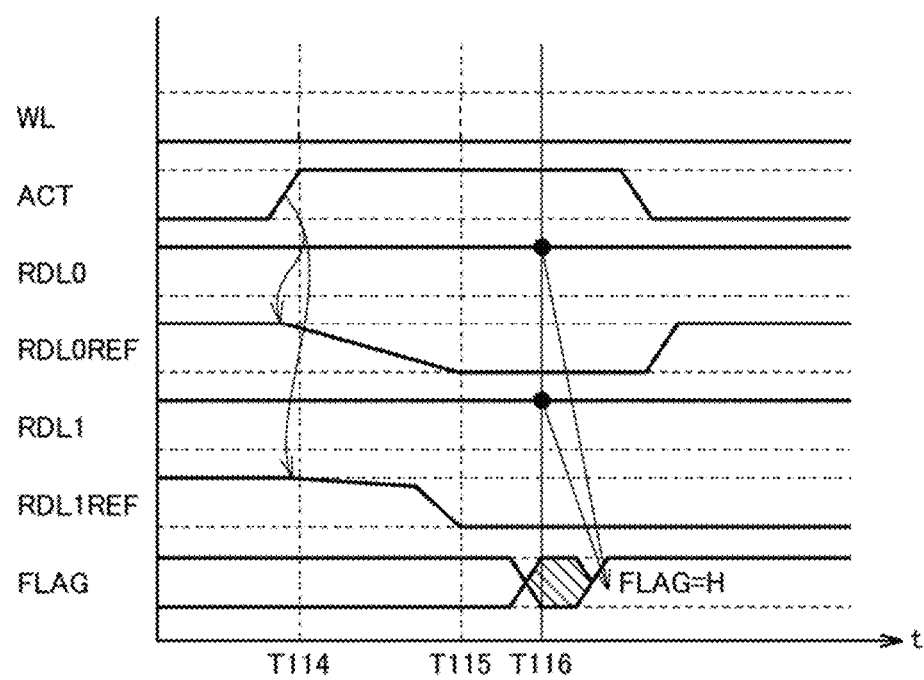
FIG. 41 is a second part of the timing chart diagram illustrating the operation of the semiconductor device 100 according to the fourth embodiment.

FIG. 41 is a timing chart diagram illustrating the operation of the semiconductor device 100 according to the fourth embodiment (Part 2).

In this example, a case where there is no operation of selecting the word line WL will be described.

As shown in FIG. 41, at time T114, the control signal ACT is set to a "H" level. The decoder fault detection circuit 110 operates accordingly.

The reference data line RDL0REF,RDL1REF begins to fall to a "L" level according to the size of the transistor.

In this example, the row decoder 4 does not select one of the plurality of word lines WL based on the input row address information RAD due to an error. In this instance, the gate-transistor GT0,GT1 will not conduct.

At time T115, each of the data lines RDL0,RDL1 maintains the "H" level.

Next, at time T116, the determination circuit 120, the data line RDL0 ("H" level), and outputs an abnormal signal FLAG ("H" level) based on RDL1 ("H" level).

Therefore, when an unselected anomaly occurs in which one of the plurality of word lines WL is not selected, it is possible to detect the abnormality.

Although the word line WL has been described in this example, the same applies to the column selection line Y.

Figure 42:
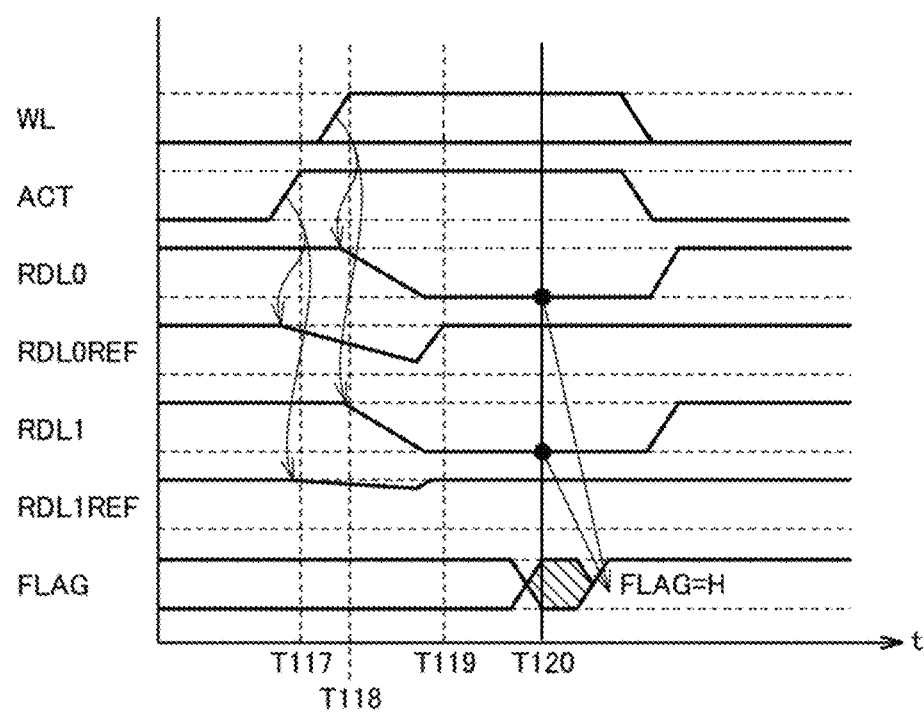
FIG. 42 is a third part of the timing chart diagram illustrating the operation of the semiconductor device 100 according to the fourth embodiment.

FIG. 42 is a timing chart diagram illustrating the operation of the semiconductor device 100 according to the fourth embodiment (Part 3).

In this example, a case where a plurality of word lines WL among a plurality of word lines WL is selected will be described.

As shown in FIG. 42, at time T117, the control signal ACT is set to a "H" level. The decoder fault detection circuit 110 operates accordingly.

The reference data line RDL0REF,RDL1REF begins to fall to a "L" level according to the size of the transistor.

In time T118, the row decoder 4 selects a plurality of word lines WL based on the input row address information RAD. Along with this, a plurality of gate transistor GT0,GT1 is conducted.

At time T119, both data lines RDL0,RDL1 are set to "L" levels.

Next, at time T120, the determination circuit 120 outputs the abnormal signal FLAG ("H" level) based on the data line RDL0 ("L" level), RDL1 ("L" level).

When a multi-selection anomaly occurs in which a plurality of word lines WL are selected among the plurality of word lines WL, the abnormality can be detected.

Although the word line WL has been described in this example, the same applies to the column selection line Y.

Modifications of Embodiment 4

Figure 43:
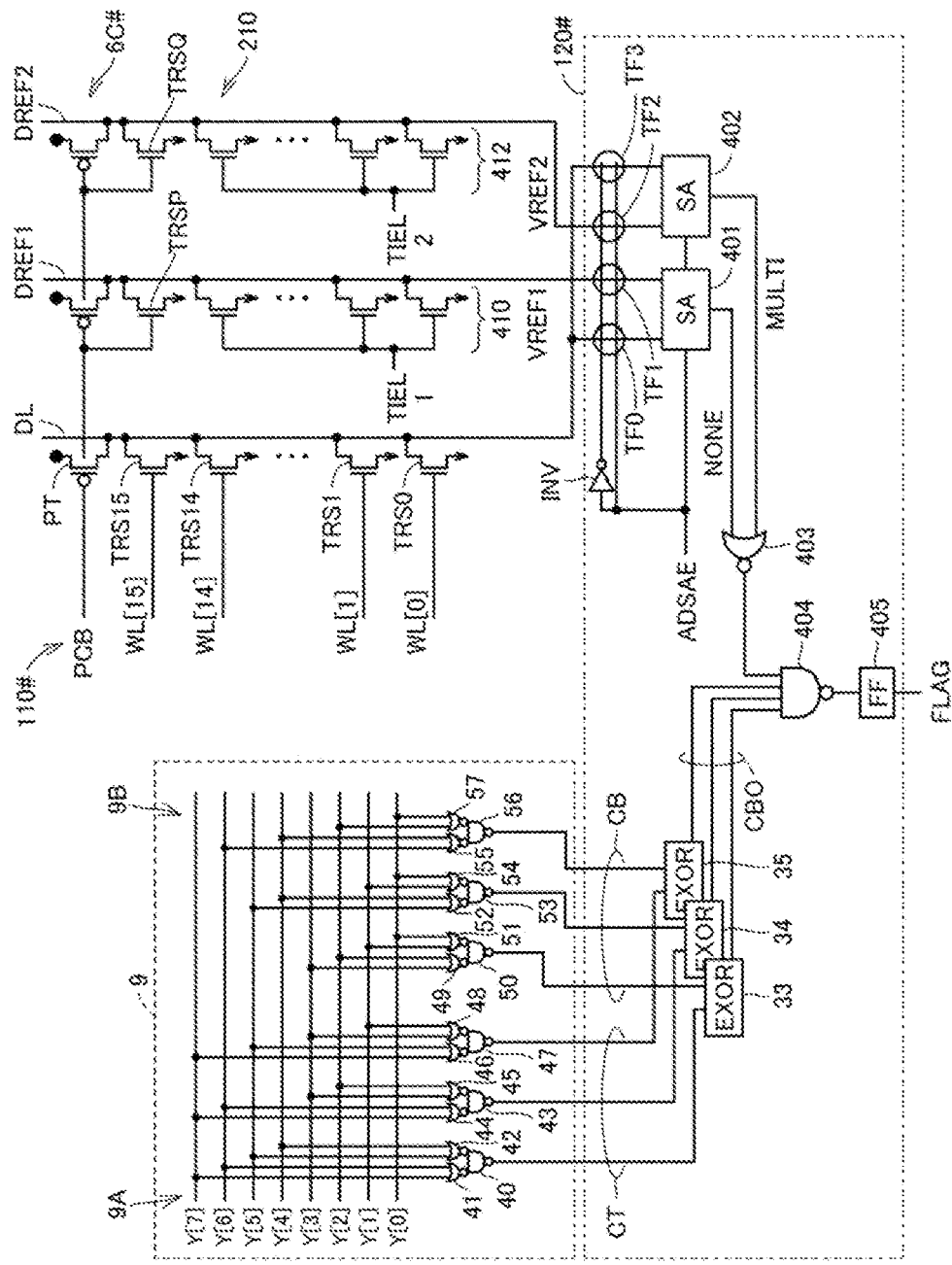
FIG. 43 is a diagram illustrating a circuit configuration of a decoder failure detection circuit 110 # and the determination circuit 120 # according to a modification of the fourth embodiment.

FIG. 43 is a diagram illustrating a circuit configuration of a decoder failure detection circuit 110 # and a determination circuit 120 # according to a modification of the fourth embodiment.

Referring to FIG. 43, decoder failure detection circuit 110 # includes a column encoder 9 and a row side decoder fault detection circuit 210.

The column encoder 9 is the same as that described in the first embodiment.

The column encoder 9 is connected to a plurality of column select lines Y, and encodes column address information based on the rising edge of the selected column select line Y.

The row-side decoder fault detection circuit 210 includes a data line DL, a reference data line DREF1,DREF2, an N-channel MOS transistor TRS0~TRS15, a precharge circuit 60 #, and a dummy circuit 410,412.

Precharge circuit 60 # includes a data line DL, is provided corresponding to the reference data line DREF1,DREF2, respectively, a data line DL, a plurality of precharge transistors PT for precharging the reference data line DREF1, DREF2 to a predetermined voltage, an adjusting transistor TRSP,TRSQ. The precharge transistor PT operates in accordance with the control signal PCB, and precharges the data line DL and the reference data line DREF1,DREF2 to predetermined voltages when the control signal PCB is at the "L" level.

Adjusting transistor TRSP is provided corresponding to the reference data line DREF1.

Adjusting transistor TRSQ is provided corresponding to the reference data line DREF2.

The regulating transistor TRSP,TRSQ is an N-channel MOS transistor that regulates the respective voltage of the reference data line DREF1,DREF2 in accordance with the control signal PCB.

The reference data line DREF1,DREF2 is adjusted to the reference voltage VREF1,VREF2 by regulating transistor TRSP,TRSQ is conducted from a predetermined voltage that is precharged.

When the driving capacity of the N-channel MOS transistor TRS0~TRS15 is set to 1, the driving capacity of the adjusting transistor TRSP is set to 1.5. Further, when the driving capacity of the N-channel MOS transistor TRS0~TRS15 is set to 1, the driving capacity of the adjusting transistor TRSQ is set to 0.5.

Dummy circuit 410,412 is a circuit for adding a pseudo data line DL and the same capacitance for each of the reference data line DREF1,DREF2. Specifically, 15 N-channel MOS transistors TRS are respectively connected to the reference data line DREF1,DREF2, receives the input of the control signal TIEL1,TIEL2.

Normally, when the word line WL is selected, one word line WL of the word line WL [0]-WL [15] is activated, the other word line WL is in an inactive state.

That is, the N-channel MOS transistor TRS of one of the 16 N-channel MOS transistor TRS0~TRS15 connected to the data line DL is conductive, the remaining 15 N-channel MOS transistor TRS is not conductive.

Therefore, the data line DL is a state in which the drain capacitance of the remaining 15 N-channel MOS transistors TRS is added.

In this embodiment, by setting the control signal TIEL1, TIEL2 of the dummy circuit 410,412 to the respective "L" level, it is possible to provide the same drain capacitance as the drain capacitance to be added to the data line DL for each of the reference data line DREF1,DREF2.

Then, in accordance with the control signal PCB is set to "H" level, the adjusting transistor TRSP,TRSQ is conducted.

In this case, when the driving capacity of the N-channel MOS transistor TRS0~TRS15 is set to 1, the driving capacity of the adjusting transistor TRSP is set to 1.5, and the driving capacity of the adjusting transistor TRSQ is set to 0.5.

Therefore, the voltage of the data line DL when the word line WL is selected is set between the reference voltage VREF1 and the reference voltage VREF2.

Determination circuit 120 # includes EXOR circuitry 33-35, sense amplifier (SA) 401,402, transfer gate TF0~TF4, NOR circuit 403, NAND circuit 404, flip-flop (FF) 405, and inverter-INV.

The transfer gate TF0~TF4 conducts upon receiving the input of the control signal ADSAE and the input of the inverted signal of the control signal ADSAE via the inverter INV.

More specifically, the transfer gate TF0 connects one input node of the sense amplifier 401 to the data line DL. The transfer gate TF1 connects the other input node of the sense amplifier 401 to the reference data line DREF1.

The transfer gate TF2 also connects one input node of the sense amplifier (SA) 402 to the reference data line DREF2. The transfer gate TF3 connects the other input node of the sense amplifier 402 to the data line DL.

Sense amplifier (SA) 401 is activated according to the input of the control signal ADSAE is amplified by comparing the voltage between the data line DL connected to one input node of the sense amplifier (SA) 401 and the reference data line DREF1 connected to the other input node, and outputs a control signal NONE.

Sense amplifier (SA) 402 is activated according to the input of the control signal ADSAE and the reference data line DREF2 connected to one input node of the sense amplifier (SA) 402, and amplifies by comparing the voltage between the other input node and the connected data line DL, and outputs a control signal MULTI.

NOR circuit 403 receives the input of the control signal NONE and MULTI and outputs the NOR logical operation result to NAND circuit 404.

NAND circuitry 404 outputs a "H" level if the control signal NONE and MULTI are both "L" level. On the other hand, NAND circuitry 404 outputs a "L" level if either the control signal NONE and MULTI is "H" level.

EXOR circuits 33 to 35 compare the first column address information CT with the second column address information CB, and outputs a EXOR logical operation result CBO.

When the first column address information CT and the second column address information CB are complementary to each other (when they are normal), EXOR logical operation results CBO of EXOR circuits 33 to 35 all output "H" levels. On the relationship hand, if the first column address information CT and the second column address information CT are not complementary to each other (if they are not normal), EXOR circuits 33

At least one of the 35 EXOR logical operation results CBO outputs an "L" level.

Therefore, when no anomaly is detected by the column encoder 9, all EXOR logical operation results CBO are set to "H" levels. Further, when the anomaly is not detected by the decoder failure detection circuit 210 of the low-side, the control signal NONE is set to "L" level, the control signal MULTI is set to "L" level.

Thus, NAND circuitry 404 outputs the "L" level, the flip-flop (FF) 405 stores the "L" level. Then, it outputs a control signal FLAG ("L" level).

On the other hand, when an error is detected by the column encoder 9, any one of the bits of EXOR logical operation result CBO is set to "L" level. Further, when an anomaly is detected in the decoder failure detection circuit 210 of the row-side, either the control signal NONE or the control signal MULTI is set to "H" level.

Thus, NAND circuitry 404 outputs the "H" level, the flip-flop (FF) 405 stores the "H" level. Then, it outputs a control signal FLAG ("H" level).

FIG. 44 is a diagram illustrating an anomaly of the row decoder 4 and the column decoder 10 according to a modification of the fourth embodiment.

As shown in FIG. 44A, when a non-selection abnormality occurs in the case where no plurality of column selection lines Y are selected due to an abnormality in the column decoders 10, EXOR logical operation result CBO is not "111" and any one of the bits CBO is set to "L" levels.

Further, even if a multi-selection error occurs when a plurality of column selection lines Y among the plurality of column selection lines Y are selected, EXOR logical operation result CBO is not "111", but one of the bits is set to the "L" level.

When one of the plurality of column selection lines Y is selected, EXOR logical operation result CBO is set to "111".

As shown in FIG. 44(B), when there is no selection anomaly when one of the plurality of word lines WL is not selected due to an abnormality of the row decoder 4, the control signal NONE ("H" level) is set to the control signal MULTI ("L" level).

When one of the plurality of word lines WL is successfully selected, a control signal NONE ("L" level) is set to the control signal MULTI ("L" level).

In the case of a multi-selection anomaly in which a plurality of word lines WL are selected among the plurality of word lines WL due to an abnormality of the row decoders 4, the control signal NONE ("L" level) and the control signal MULTI ("H" level) are set.

As shown in FIG. 44C, when a non-selection anomaly occurs in the case where no plurality of word lines WL are selected or a multi-selection abnormality occurs in the case where a plurality of word lines WL are selected among the plurality of word lines WL due to an abnormality of the level decoders 4, the abnormality signals FLAG (H) are set according to outputs (L) of the NOR circuits 403.

When an error in the column decoder 10 causes a non-selection error in the case where no more than one column selection line Y is selected or a multi-selection error in the case where a plurality of column selection lines Y are selected among a plurality of column selection lines Y, the error signal FLAG ("H" level) is set according to any one bit ("L" level) of EXOR logical operation result CBO.

When both the row decoder 4 and the column decoder 10 are normal, the error signal FLAG is set to "L" level.

Figure 45:
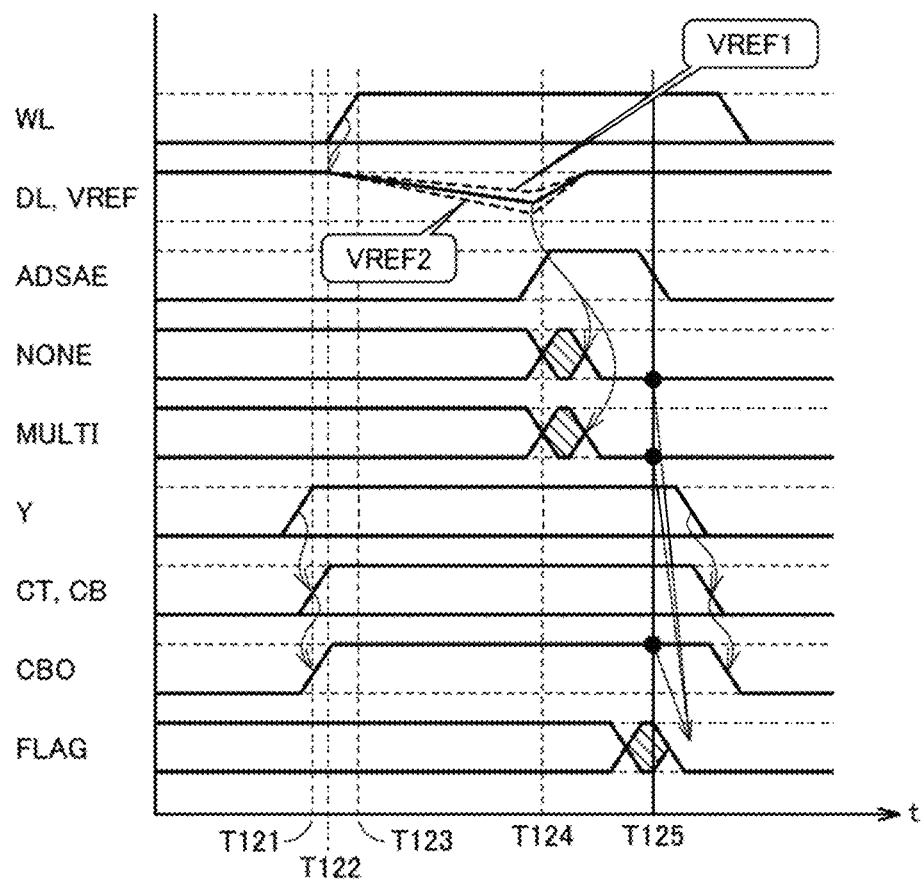
FIG. 45 is a first part of a timing chart diagram explaining the operation of the semiconductor device 100 according to a variation of the embodiment 4.

FIG. 45 is a first timing chart illustrating the operation of the semiconductor device 100 according to the modification of the fourth embodiment.

In the present example, a case of normal operation will be described.

As shown in FIG. 45, at the time T121, the column decoders 10 select one of the plurality of column selection lines Y based on the input column address information CAD.

At time T122, the first and second column encoders 9A,9B generate first column address information CT and second column address information CB, respectively. In this example, the first column address information CT and the second column address information CB are generated as complementary relationships with each other.

Since the first column address information CT and the second column address information CB are compared and are complementary to each other, EXOR logical operation result CBO (all "H" level) is output.

In time T123, the row decoder 4 selects one of the plurality of word lines WL based on the input row address information RAD.

Further, the reference data line DREF1,DREF2 according to the input of the control signal PCB ("H" level) is set to the reference voltage VREF1,VREF2, respectively.

Here, the voltage of the data line DL is set between the reference voltage VREF1 and VREF2.

At time T124, the control signal ADSAE ("H" level) is activated. Accordingly, the sense amplifiers (SAs) 401 and 402 are activated, and the control signals NONE (L level) and MULTI (L level) are outputted.

In time T125, the determination circuit 120 # outputs an abnormal signal FLAG ("L" level) based on EXOR logical operation result CBO (all "H" level), the control signal NONE ("L" level) and MULTI ("L" level).

Figure 46:
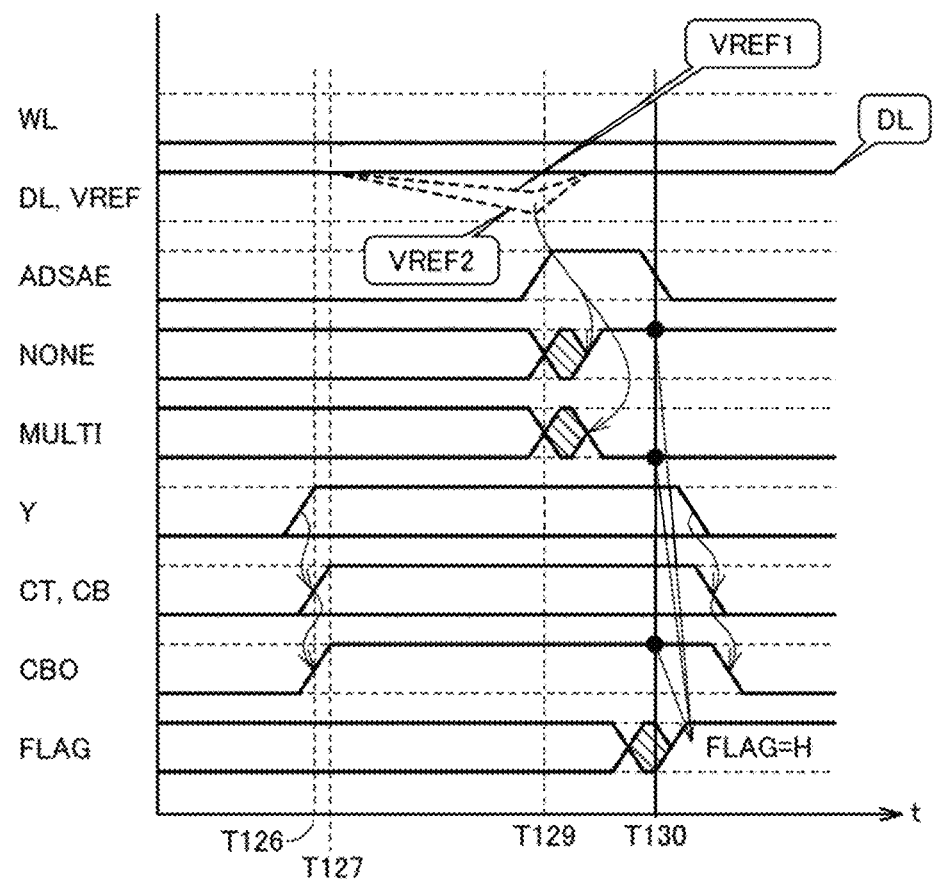
FIG. 46 is a second part of the timing chart diagram illustrating the operation of the semiconductor device 100 according to a modification of the fourth embodiment.

FIG. 46 is a timing chart diagram illustrating the operation of the semiconductor device 100 according to a modification of the fourth embodiment (Part 2).

In this example, a case where there is no operation of selecting the word line WL will be described.

As shown in FIG. 46, at the time T126, the column decoders 10 select one of the plurality of column selection lines Y based on the input column address information CAD.

At time T127, the first and second column encoders 9A,9B generate first column address information CT and second column address information CB, respectively. In this example, the first column address information CT and the second column address information CB are generated as complementary relationships with each other.

Since the first column address information CT and the second column address information CB are compared and are complementary to each other, EXOR logical operation result CBO (all "H" level) is output.

Further, in the present exemplary embodiment, the row decoder 4 does not select one of the plurality of word lines WL based on the input row address information RAD due to an error. Therefore, the data line DL maintains a predetermined precharge voltage.

Further, the reference data line DREF1,DREF2 according to the input of the control signal PCB ("H" level) ("HL" level) is set to the reference voltage VREF1,VREF2, respectively.

Here, the voltage of the data line DL is larger than the reference voltage VREF1,VREF2.

At time T129, the control signal ADSAE ("H" level) is activated. Accordingly, the sense amplifiers (SAs) 401 and 402 are activated, and the control signals NONE ("H" level) and MULTI ("L" level) are outputted.

In time T130, the determination circuit 120 #, EXOR logical operation result CBO (all H level), and outputs an abnormal signal FLAG ("H" level) based on the control signal NONE ("H" level) and MULTI ("L" level).

Therefore, when an unselected anomaly occurs in which one of the plurality of word lines WL is not selected, it is possible to detect the abnormality.

Figure 47:
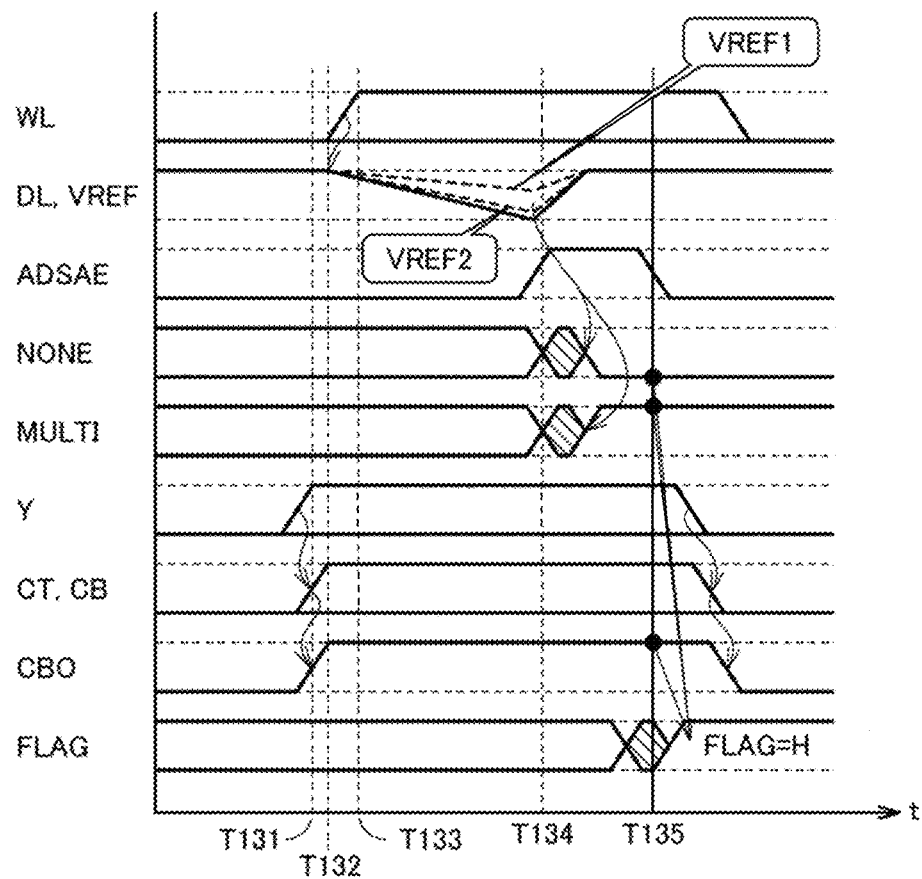
FIG. 47 is a third part of the timing chart diagram illustrating the operation of the semiconductor device 100 according to a modification of the fourth embodiment.

FIG. 47 is a timing chart diagram illustrating the operation of the semiconductor device 100 according to a modification of the fourth embodiment (Part 3).

In this example, a case where a plurality of word lines WL among a plurality of word lines WL is selected will be described.

As shown in FIG. 47, at the time T131, the column decoders 10 select one of the plurality of column selection lines Y based on the input column address information CAD.

At time T132, the first and second column encoders 9A,9B generate first column address information CT and second column address information CB, respectively. In this example, the first column address information CT and the second column address information CB are generated as complementary relationships with each other.

Since the first column address information CT and the second column address information CB are compared and are complementary to each other, EXOR logical operation result CBO (all "H" level) is output.

In time T133, the row decoder 4 selects a plurality of word lines WL among the plurality of word lines WL due to an anomaly based on the input row address information RAD.

Further, the reference data line DREF1,DREF2 according to the input of the control signal PCB ("H" level) ("HL" level) is set to the reference voltage VREF1,VREF2, respectively.

Here, the voltage of the data line DL is smaller than the reference voltage VREF1,VREF2.

At time T134, the control signal ADSAE ("H" level) is activated. Accordingly, the sense amplifiers (SAs) 401 and 402 are activated, and the control signals NONE (L level) and MULTI (H level) are outputted.

In time T135, the determination circuit 120 # outputs an abnormal signal FLAG ("H" level) based on EXOR logical operation result CBO (all "H" level), the control signal NONE ("L" level) and MULTI ("H" level).

When a multi-selection anomaly occurs in which a plurality of word lines WL are selected among the plurality of word lines WL, the abnormality can be detected.

Figure 48:
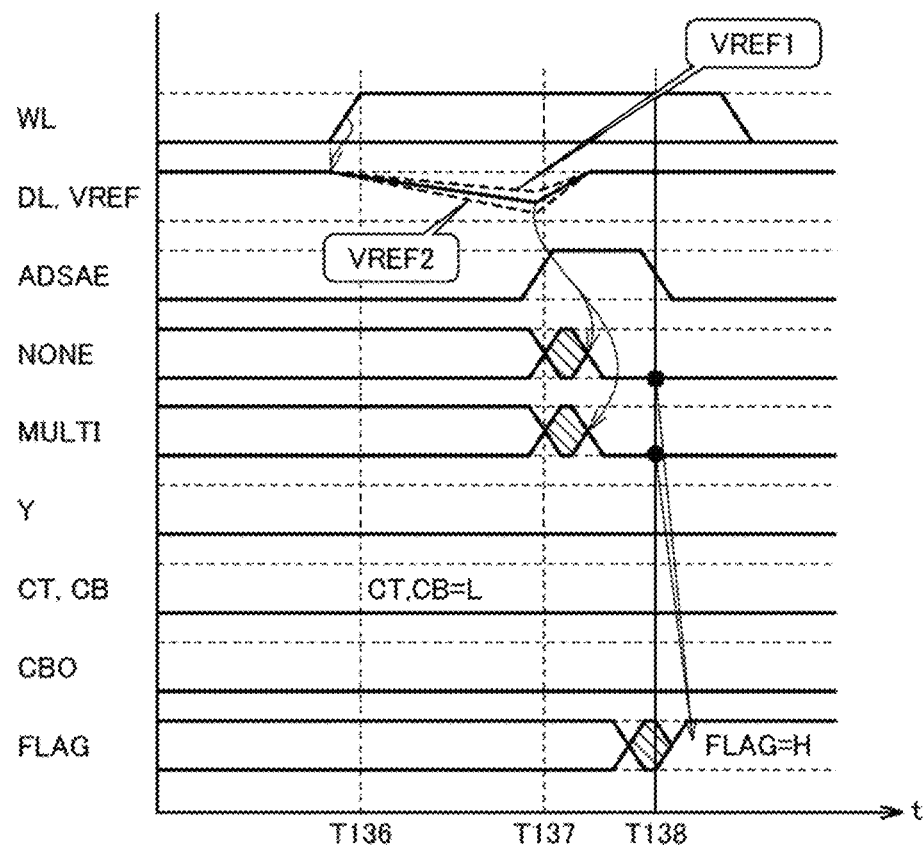
FIG. 48 is a fourth part of the timing chart diagram illustrating the operation of the semiconductor device 100 according to a modification of the fourth embodiment.

FIG. 48 is a timing chart diagram illustrating the operation of the semiconductor device 100 according to a modification of the fourth embodiment (Part 4).

In the present example, a case where the selection operation of the column selection line Y is not performed will be described.

As shown in FIG. 48, in the first and second column encoders 9A,9B, the first column address information CT and the second column address information CB are all set to "L" levels. Therefore, the first column address information CT and the second column address information CB are not generated as mutually complementary relationships.

The first column address information CT and the second column address information CB are compared, and EXOR logical operation result CBO (all "L" level) is output because they are not complementary to each other.

In time T136, the row decoder 4 selects a plurality of word lines WL among the plurality of word lines WL due to an anomaly based on the input row address information RAD.

Further, the reference data line DREF1,DREF2 according to the input of the control signal PCB ("H" level) ("HL" level) is set to the reference voltage VREF1,VREF2, respectively.

Here, the voltage of the data line DL is set between the reference voltage VREF1 and VREF2.

At time T137, the control signal ADSAE ("H" level) is activated. Accordingly, the sense amplifiers (SAs) 401 and 402 are activated, and the control signals NONE (L level) and MULTI (L level) are outputted.

In time T138, the determination circuit 120 # outputs an abnormal signal FLAG ("H" level) based on EXOR logical operation result CBO (all "L" level), the control signal NONE ("L" level) and MULTI ("L" level).

Therefore, when an unselected anomaly occurs in which one of the plurality of column selection lines Y is not selected, it is possible to detect the abnormality.

Figure 49:
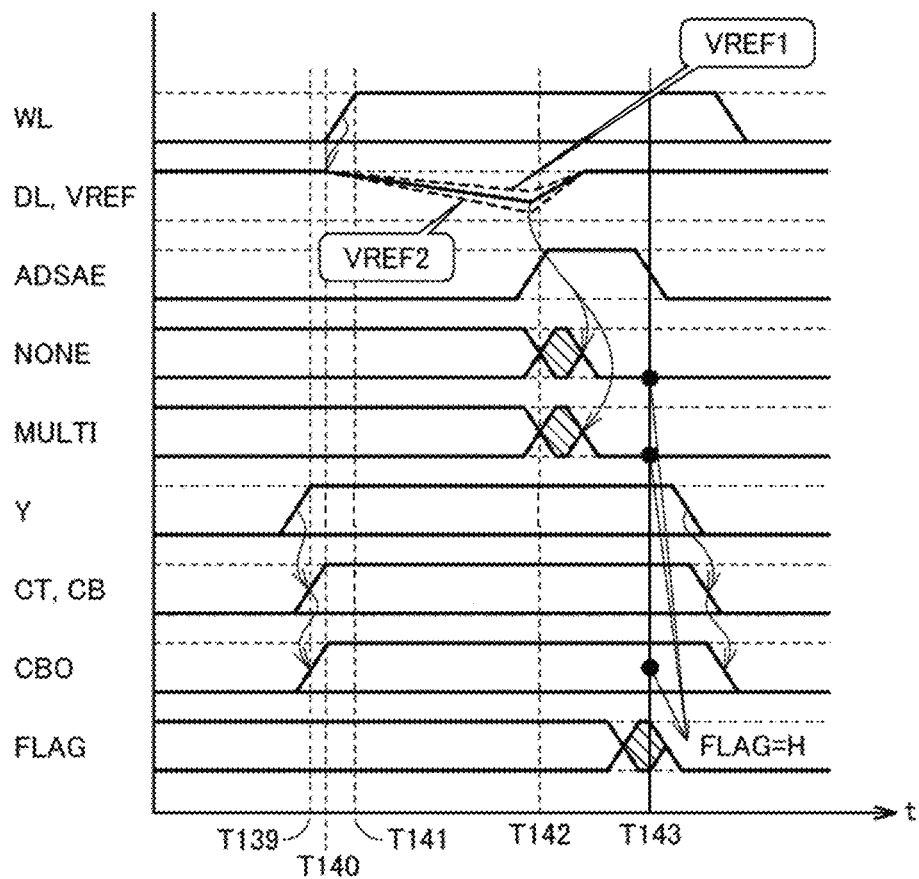
FIG. 49 is a fifth part of the timing chart diagram explaining the operation of the semiconductor device 100 according to a variation of the embodiment 4.

FIG. 49 is a timing chart (5) illustrating the operation of the semiconductor device 100 according to the modification of the fourth embodiment.

In this example, a case where a plurality of column select lines Y among a plurality of column select lines Y are selected will be described.

As shown in FIG. 49, at time T139, the column decoders 10 select a plurality of column select lines Y based on the input column address information CAD.

At the time T140, the first and second column encoders 9A,9B generate the first column address information CT and the second column address information CB, respectively, but are not generated in complementary relation to each other.

Accordingly, since the first column address information CT and the second column address information CB are compared with each other and are not complementarily related to each other, EXOR logical operation result CBO (at least one signal is "L" level) is output.

In time T141, the row decoder 4 selects one of the plurality of word lines WL due to an error based on the input row address information RAD.

Further, the reference data line DREF1,DREF2 according to the input of the control signal PCB ("H" level) ("HL" level) is set to the reference voltage VREF1,VREF2, respectively.

Here, the voltage of the data line DL is set between the reference voltage VREF1 and VREF2.

At time T142, the control signal ADSAE ("H" level) is activated. Accordingly, the sense amplifiers (SAs) 401 and 402 are activated, and the control signals NONE (L level) and MULTI (L level) are outputted.

In time T143, the determination circuit 120 # outputs an abnormal signal FLAG ("H" level) based on EXOR logical operation result CBO (at least one signal is "L" level), the control signal NONE ("L" level) and MULTI ("L" level).

Therefore, when a multi-selection anomaly occurs in which a plurality of column select lines Y among the plurality of column select lines Y are selected, it is possible to detect the abnormality.

Embodiment 5

Figure 50:
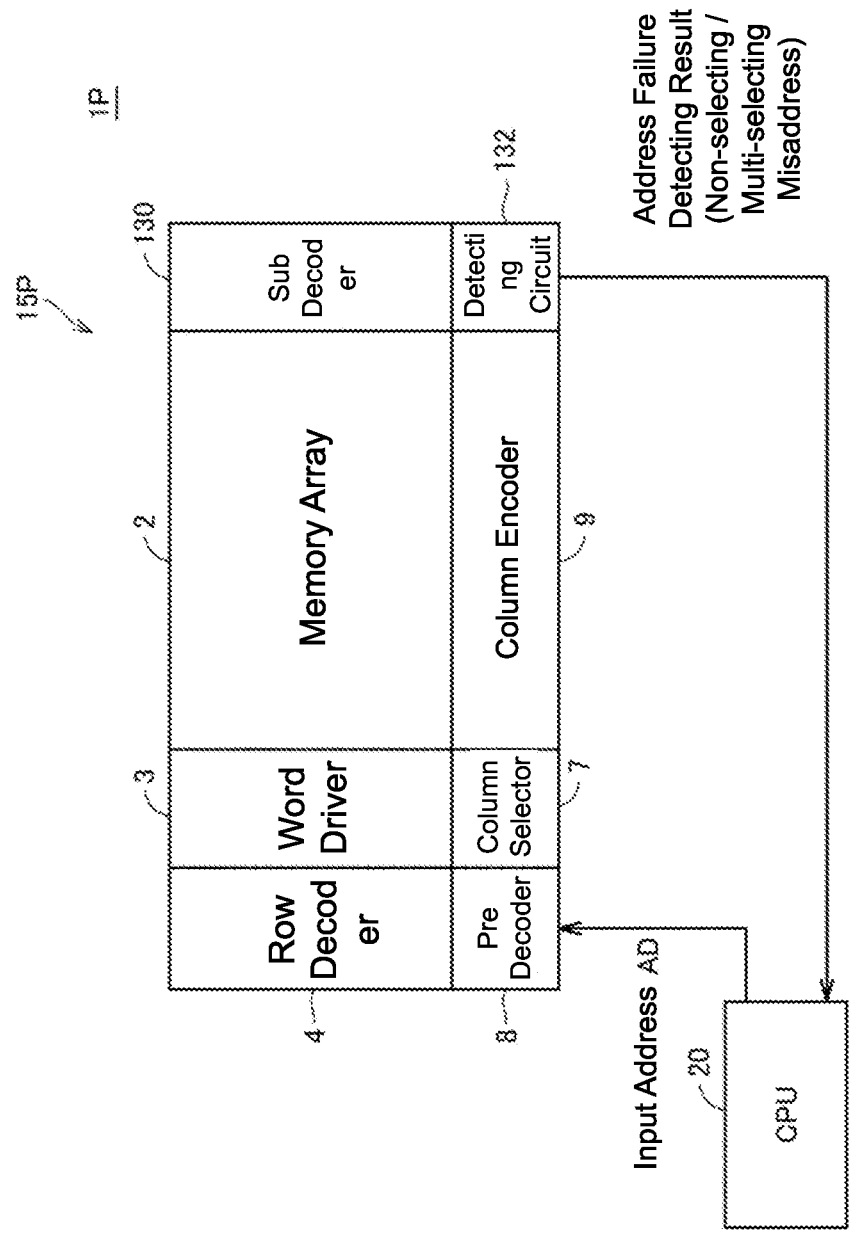
FIG. 50 is a diagram for explaining an outline of a semiconductor device 1P according to the fifth embodiment.

FIG. 50 is a diagram for explaining an outline of 1P of the semiconductor device according to the fifth embodiment.

Referring to FIG. 50, a semiconductor device 1P includes a memory macro 15P and a CPU20.

CPU20 controls the memory macro 15P to acquire the data stored in the memory macro 15P.

Memory macro 15P differs in that sub-decoder 130 is provided instead of row encoder 6 and column encoder 9 and detection circuit 132 is provided instead of detection circuit 5 as compared to memory macro 15. Since the other configurations are the same, detailed description thereof will not be repeated.

The sub-decoder 130 includes a sub-row decoder 4 # and a sub-column decoder 10 # similarly to the row decoder 4 and the column decoder 10.

Detection circuit 132 detects faults in row decoder 4 and column decoder 10.

Figure 51:
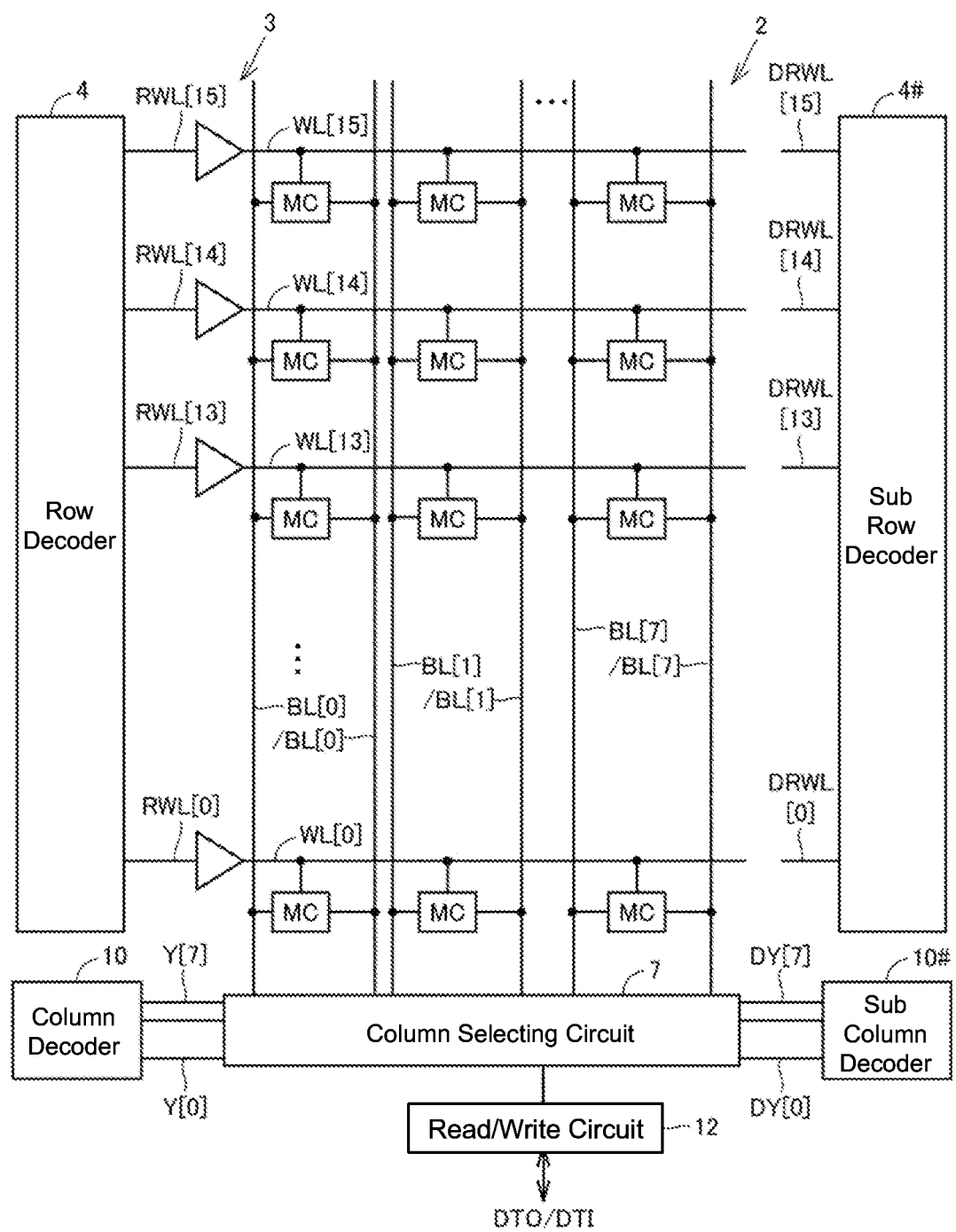
FIG. 51 is a diagram illustrating a memory array 2 and its peripheral circuits according to the fifth embodiment.

FIG. 51 is a diagram illustrating a memory array 2 and its peripheral circuits according to the fifth embodiment.

Referring to FIG. 51, it is different from the configuration of FIG. 2 in that a sub row decoder 4 # and a sub column decoder 10 # are provided.

The sub-row decoder 4 # outputs row selection signals to a plurality of dummy row selection lines DRWL based on the input row address data RAD. The sub-column decoder 10 # outputs a column selection signal to a plurality of dummy column selection lines DY based on the input column address information CAD. In this embodiment, dummy row select lines DRWL[0] to DRWL[15] are provided. In addition, dummy column select lines DY[0] to DY[7] are provided.

Figure 52:
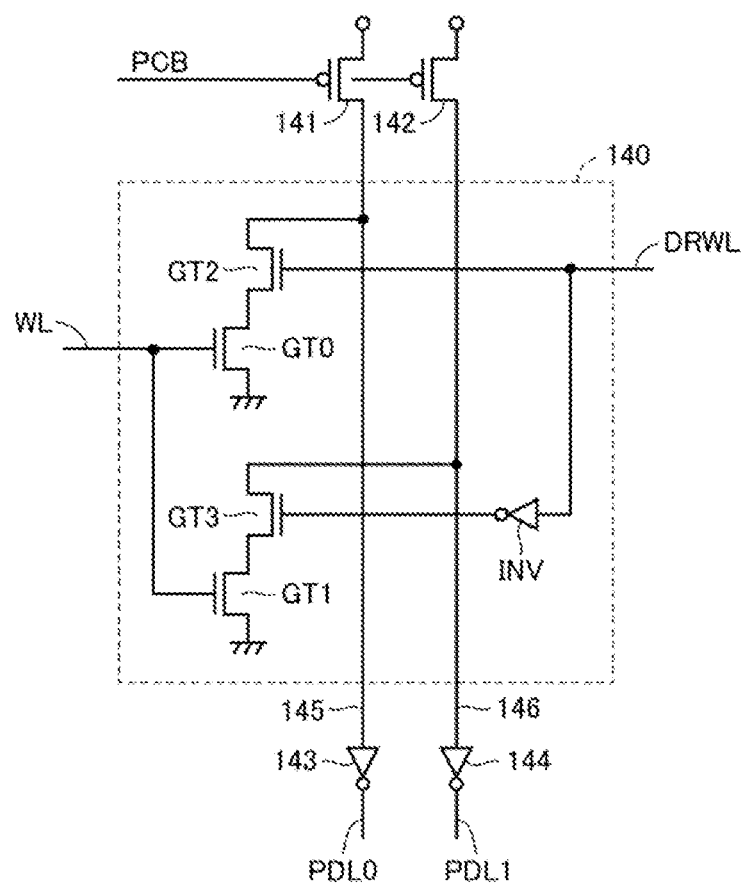
FIG. 52 is a diagram for explaining a detection unit 140 of the detection circuit 132 according to the fifth embodiment.

FIG. 52 is a diagram illustrating the detection unit 140 of the detection circuit 132 according to the fifth embodiment.

Referring to FIG. 52, the detection circuit 132 includes a plurality of detection units 140, data lines 145,146, P-channel MOS transistors 141,142, and an inverter 143,144 for detecting abnormalities in the row-side row decoder 4 corresponding to the memory cell rows, respectively. P-channel MOS transistor 141,142 is a precharge transistor that precharges the data line 145,146.

P-channel MOS transistor 141,142 is connected to data line 145,146 and conducts according to the control signal PCB ("L" level). The data lines 145 and 146 are set to the "H" level.

The data lines 145 and 146 are provided in common to the plurality of detection units 140.

Specifically, to set the data line 145,146 to a predetermined voltage by precharging according to the control signal PCB ("L" level).

Inverter 143 outputs a control signal PDL0 obtained by inverting the voltage signal of the data line 145.

Inverter 144 outputs a control signal PDL1 obtained by inverting the voltage signal of the data line 146.

In this example, one detection unit 140 is shown.

Detection unit 140 includes a gate transistor GT0~GT3 and inverter-INV.

The gate transistor GT0,GT2 is connected in series between the data line 145 and the fixed voltage VSS, the gate receiving the signal of the word line WL and the signal of the corresponding dummy low select line DRWL, respectively.

The gate transistor GT1,GT3 is connected in series between the data line 146 and the fixed voltage VSS, the gate receiving the input of the signal of the word line WL and the inverted signal via the inverter INV of the corresponding dummy low select line DRWL, respectively.

For example, when the row decoder 4 and the sub-row decoder 4 # operate normally, when the word line WL is set to the "H" level, the corresponding dummy row selection line DRWL is also set to the "H" level.

Thus, the gate transistor GT0,GT2 both conduct, and the data line 145 is connected to the fixed-voltage VSS. That is, the data line 145 is set to the "L" level.

On the other hand, the gate transistor GT3 is not conductive because the inverted signal of the dummy low selection line DRWL via the inverter INV is inputted. That is, the data line 146 is set to the "H" level.

The control signal PDL0 is set to a "H" level and the control signal PDL1 is set to a "L" level.

FIG. 53 is a diagram illustrating a detection result of the detection circuit 132 according to the fifth embodiment.

As shown in FIG. 53, for example, if the row decoder 4 and the sub row decoder 4 # do not operate properly and the word line WL is not selected, the gate transistor GT0,GT1 will not conduct. That is, both of the data lines 145 and 146 maintain the "H" level.

The control signal PDL0,PDL1 are both set to "L" level.

For example, when the row decoder 4 and the sub-row decoder 4 # operate normally and one word line WL is selected, the gate transistor GT0,GT2 are both conductive. Data line 145 is connected to a fixed voltage VSS. That is, the data line 145 is set to the "L" level. Data line 146 is not connected to a fixed voltage VSS. That is, the data line 145 is set to the "H" level.

Control signal PDL0 is set to "H" level, the control signal PDL1 is set to "L" level.

For example, when the row decoder 4 and the sub row decoder 4 # do not operate normally and a plurality of word lines WL are selected, the gate transistor GT0,GT2 of the detection unit 140 is both conductive. Data line 145 is connected to a fixed voltage VSS. That is, the data line 145 is set to the "L" level. The gate transistor GT1,GT3 of another sensing unit 140 also conducts. Data line 146 is connected to a fixed voltage VSS. That is, the data line 145 is set to the "L" level.

The control signal PDL0,PDL1 are both set to "H" level.

For example, if the row decoder 4 and the sub-row decoder 4 # do not operate properly and the word line WL selects the wrong word line, both the gate transistor GT0, GT2 will not conduct. Also, the gate transistor GT1,GT3 is not both conductive. That is, both of the data lines 145 and 146 maintain the "H" level.

The control signal PDL0,PDL1 are both set to "L" level.

Although the detection unit 140 for detecting the row decoder 4 and the sub-row decoder 4 # has been described in this example, the column decoder 10 and the sub-column decoder 10 # are similarly provided with the detection unit on the column side.

Specifically, the column-side detection unit is connected to the gate of the gate transistor GT0,GT1 by the column select line Y instead of the word line WL in the same manner as the row-side detection unit. Also connected are a dummy column select line DY and a gate transistor GT3 via a gate transistor GT2 and an inverter INV instead of a dummy low select line DRWL.

For example, when the column decoder 10 and the dummy column decoder 10 # operate normally, and when the column selection line Y is set to the "H" level, the corresponding dummy column selection line DY is also set to the "H" level.

Thus, the gate transistor GT0,GT2 both conduct, and the data line 145 is connected to the fixed-voltage VSS. That is, the data line 145 is set to the "L" level.

On the other hand, the gate transistor GT3 is not conductive because the inversion signal of the dummy column selection line DY via the inverter INV is inputted. That is, the data line 146 is set to the "H" level.

The control signal QDL0 is set to the "H" level, and the control signal QDL1 is set to the "L" level.

For example, if column decoder 10 and sub-column decoder 10 # do not work properly and column select line Y is not selected, the gate transistor GT0,GT1 will not conduct. That is, both of the data lines 145 and 146 maintain the "H" level.

The control signals QDL0,QDL1 are both set to "L" levels.

For example, if the column decoder 10 and the sub-column decoder 10 # do not operate properly and a plurality of column select lines Y are selected, the gate transistor GT0,GT2 are both conductive. Data line 145 is connected to a fixed voltage VSS. That is, the data line 145 is set to the "L" level. Data line 146 is connected to a fixed voltage VSS. That is, the data line 145 is set to the "L" level.

The control signals QDL0,QDL1 are both set to "H" levels.

For example, if column decoder 10 and sub-column decoder 10 # fail to work properly and select an incorrect column select line Y, both gate transistor GT0,GT2 will not conduct. Also, the gate transistor GT1,GT3 is not both conductive. That is, both of the data lines 145 and 146 maintain the "H" level.

The control signals QDL0,QDL1 are both set to "L" levels.

Figure 54:
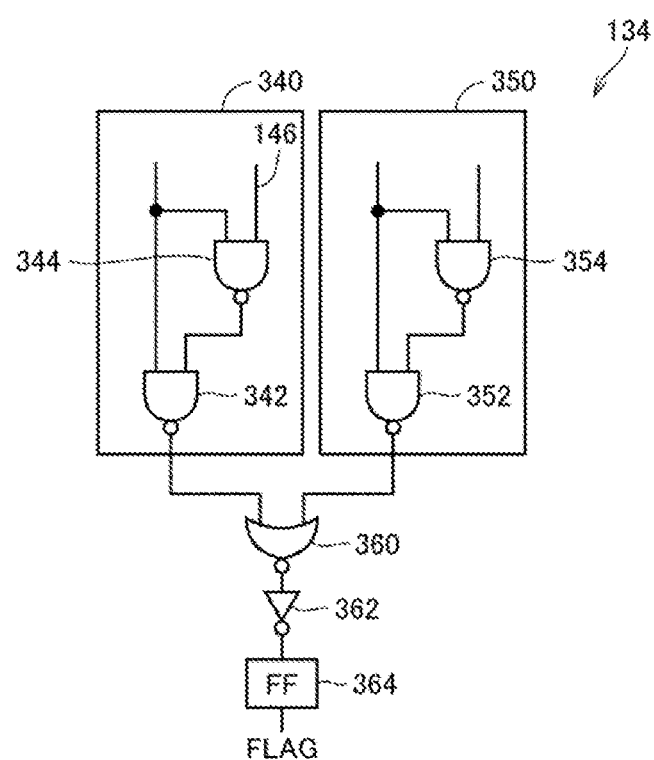
FIG. 54 is a diagram for explaining a composite circuit 134 of the detection circuit 132 according to the fifth embodiment.

FIG. 54 is a diagram illustrating the synthesis circuit 134 of the detection circuit 132 according to the fifth embodiment.

Referring to FIG. 54, the combining circuit 134 includes a combining unit 340,350, a NOR circuit 360, an inverter 362, and a flip-flop (FF) 364.

The combining unit 340 includes NAND circuits 342, 344.

The combining unit 350 includes NAND circuits 352, 354.

NAND circuit 344 outputs NAND logical operation result upon receiving a signal input from the control signal PDL0 and PDL1 to the 342.

NAND circuit 342 receives the control signal PDL0 and the output from NAND circuit 344 and outputs NAND logical operation result to the NOR circuit 360.

If the control signal PDL0,PDL1 is both "H" level, and both "L" level, the output of NAND circuitry 342 is set to "H" level.

On the other hand, when the control signal PDL0,PDL1 is "H" level and "L" level, the output of NAND circuitry 342 is set to "L" level.

NAND circuit 354 outputs NAND logical operation result upon receiving a signal input from the control signal QDL0 and QDL1 to the 352.

NAND circuit 352 receives the control signal QDL0 and the output from NAND circuit 354 and outputs NAND logical operation result to the NOR circuit 360.

If the control signal QDL0,QDL1 is both "H" level, and both "L" level, the output of NAND circuitry 352 is set to "H" level.

On the other hand, when the control signal QDL0,QDL1 is "H" level and "L" level, the output of NAND circuitry 352 is set to "L" level.

NOR circuit 360 receives the input of NAND circuit 342 and 352 and outputs the NOR logic operation result to the inverter 362.

Inverter 362 inverts the signal of the NOR circuit 360 is stored in the flip-flop (FF) 364.

In the present exemplary embodiment, when the output of either one of NAND circuitry 342 and 352 is at the "H" level, the "H" level is stored in the flip-flop (FF) 364 abnormal signal FLAG ("H" level) is output.

FIG. 55 is a diagram for explaining an anomaly of the row decoder 4 and the column decoder 10 according to the fifth embodiment.

As shown in FIG. 55, due to an anomaly of the row decoder 4, there is a non-selection abnormality when no plurality of word lines WL are selected, a multi-selection abnormality when a plurality of word lines WL are selected among a plurality of word lines WL, or a false selection abnormality when a wrong word line WL among a plurality of word lines WL is selected. If the anomaly occurs, it is set to the abnormal signal FLAG ("H" level) according to the output of NAND circuitry 342 ("H" level).

The anomaly of the column decoder 10 causes a non-selection abnormality in the case where no plurality of column selection lines Y are selected, a multi-selection abnormality in the case where a plurality of column selection lines Y are selected, or an erroneous selection abnormality in the case where an erroneous column selection line Y is selected from a plurality of column selection lines Y. If the anomaly occurs, it is set to the abnormal signal FLAG ("H" level) according to the output of NAND circuitry 352 ("H" level).

When both the row decoder 4 and the column decoder 10 are normal, the error signal FLAG is set to "L" level.

Figure 56:
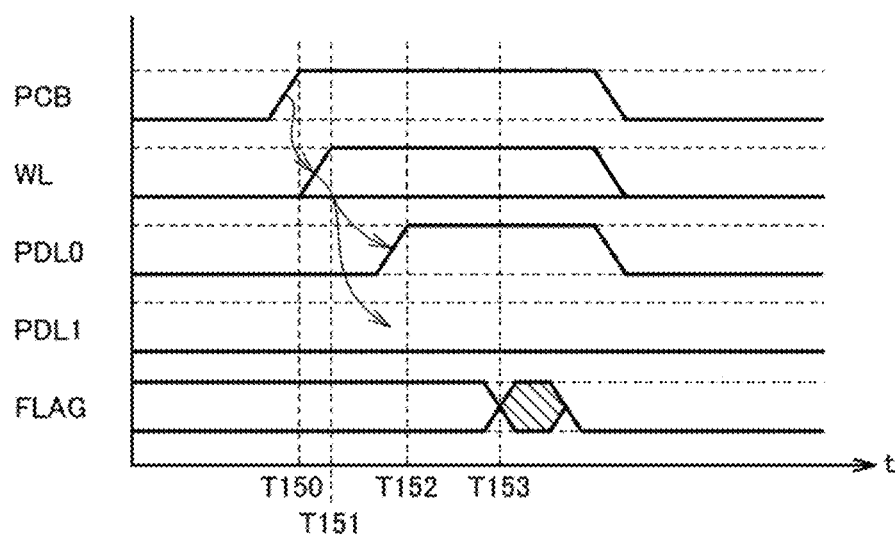
FIG. 56 is a first part of a timing chart diagram explaining the operation of the semiconductor device 100 according to embodiment 5.

FIG. 56 is a first timing chart illustrating the operation of the semiconductor device 100 according to the fifth embodiment.

In the present example, a case of normal operation will be described.

As shown in FIG. 56, at time T150, the control-signal PCBs are set to a "H" level. The detection circuit 132 is operated in accordance with this. The precharge transistor is set to non-conductive with this, the precharge operation for the data line 145,146 is completed.

In time T151, the row decoder 4 selects one of the plurality of word lines WL based on the input row address information RAD. The sub-row decoder 4 # selects one of a plurality of dummy word lines DWL based on the input row address information RAD. Along with this, the gate transistor GT0,GT2 is conducted.

Therefore, the data lines 145 and 146 are set to the "L" level and the "H" level, respectively.

In time T152, the control signal PDL0,PDL1 is amplified to "H" level and "L" level, respectively.

Next, at time T153, the detecting circuit 132, the control signal PDL0 ("H" level), and outputs an abnormal signal FLAG ("L" level) based on PDL1 ("L" level).

Although the word line WL has been described in this example, the same applies to the column selection line Y.

Figure 57:
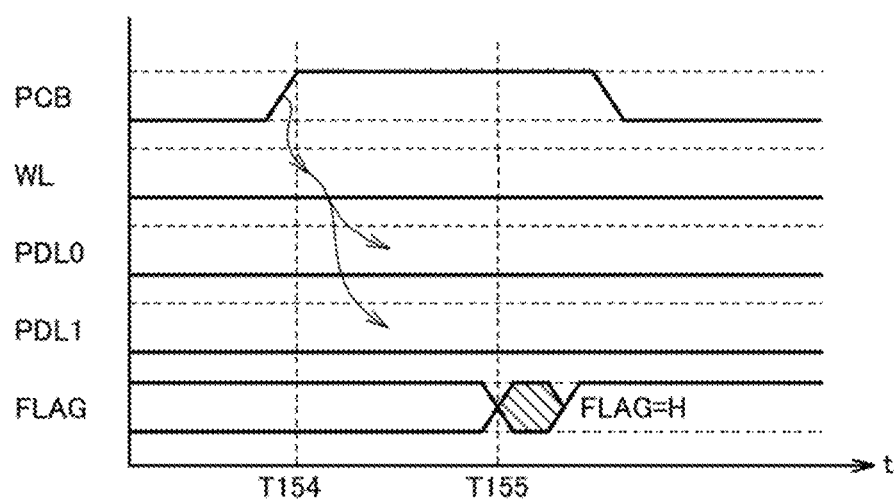
FIG. 57 is a second part of the timing chart diagram illustrating the operation of the semiconductor device 100 according to the fifth embodiment.

FIG. 57 is a timing chart diagram illustrating the operation of the semiconductor device 100 according to the fifth embodiment (Part 2).

In this example, a case where there is no operation of selecting the word line WL will be described.

As shown in FIG. 57, at time T154, the control-signal PCBs are set to "H" level. The detection circuit 132 is operated in accordance with this. The precharge transistor is set to non-conductive with this, the precharge operation for the data line 145,146 is completed.

In this example, the row decoder 4 and the sub-row decoder 4 # do not select one of a plurality of word lines WL and a plurality of dummy word lines DWL based on the input row address information RAD due to an error. In this instance, the gate-transistor GT0,GT2 will not conduct. Also, the gate transistor GT1,GT3 is not conductive.

The data lines 145 and 146 both maintain the "H" level.

Next, at time T155, the determination circuit 132, the control signal PDL0 ("L" level), and outputs an abnormal signal FLAG ("H" level) based on PDL1 ("L" level).

Therefore, when an unselected anomaly occurs in which one of the plurality of word lines WL is not selected, it is possible to detect the abnormality.

Although the word line WL has been described in this example, the same applies to the column selection line Y.

Figure 58:
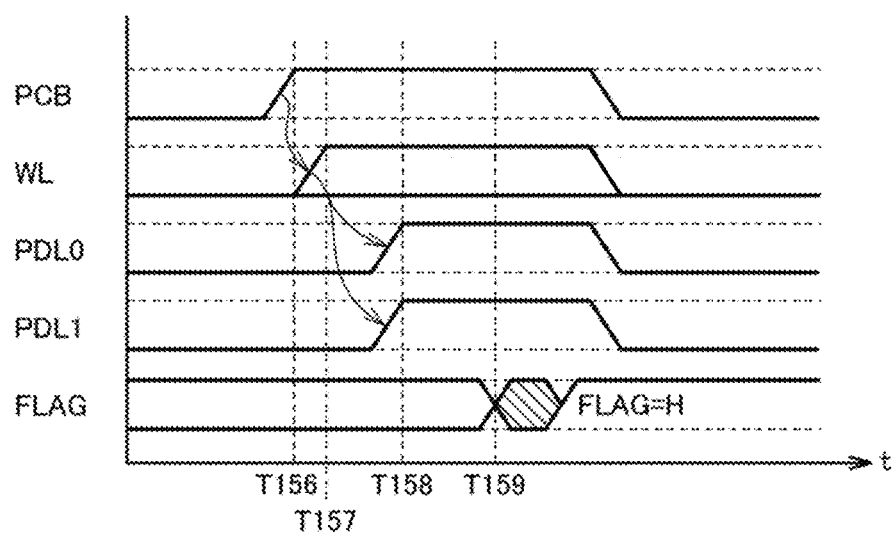
FIG. 58 is a third part of the timing chart diagram illustrating the operation of the semiconductor device 100 according to the fifth embodiment.

FIG. 58 is a timing chart diagram illustrating the operation of the semiconductor device 100 according to the fifth embodiment (Part 3).

In this example, a case where a plurality of word lines WL among a plurality of word lines WL is selected will be described.

As shown in FIG. 58, at time T156, the control-signal PCBs are set to a "H" level. The detection circuit 132 is operated in accordance with this. The precharge transistor is set to non-conductive with this, the precharge operation for the data line 145,146 is completed.

In time T157, the row decoder 4 selects a plurality of word lines WL based on the input row address information RAD. The sub-row decoder 4 # selects a plurality of dummy word line DWL based on the input row address information RAD. Along with this, the gate transistor GT0,GT2 of the detecting unit 140 is conducted. Also, the gate transistor GT1,GT3 of another detection unit 140 is conductive.

Accordingly, the data lines 145 and 146 are both set to the "L" level.

Next, at time T158, the control signal PDL0,PDL1 are both amplified to "H" level.

Next, at time T159, the determination circuit 132, the control signal PDL0 ("H" level), and outputs an abnormal signal FLAG ("H" level) based on PDL1 ("H" level).

When a multi-selection anomaly occurs in which a plurality of word lines WL are selected among the plurality of word lines WL, the abnormality can be detected.

Although the word line WL has been described in this example, the same applies to the column selection line Y.

Figure 59:
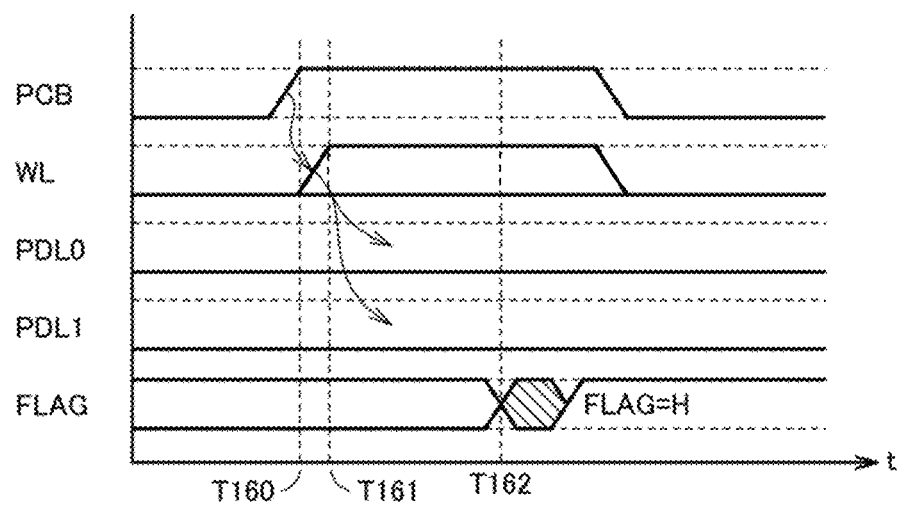
FIG. 59 is fourth part of a timing chart diagram illustrating the operation of the semiconductor device 100 according to the fifth embodiment.

FIG. 59 is a timing chart diagram illustrating the operation of the semiconductor device 100 according to the fifth embodiment (Part 4).

In this example, a case where the wrong word line WL among the plurality of word lines WL is selected will be described.

As shown in FIG. 59, at time T160, the control-signal PCBs are set to a "H" level. The detection circuit 132 is operated in accordance with this. The precharge transistor is set to non-conductive with this, the precharge operation for the data line 145,146 is completed.

In time T161, the row decoder 4 selects an incorrect word line among the plurality of word lines WL based on the input row address information RAD. The sub-row decoder 4 # selects an incorrect dummy word line among a plurality of dummy word lines DWL based on the input row address information RAD. Along with this, the gate transistor GT0, GT2 of the detecting unit 140 is not conductive. Also, the gate transistor GT1,GT3 of another sensing unit 140 is not conductive.

Accordingly, both of the data lines 145 and 146 maintain the "H" level.

Next, at time T162, the determination circuit 132, the control signal PDL0 ("H" level), and outputs an abnormal signal FLAG ("H" level) based on PDL1 ("H" level).

When an erroneous selection anomaly occurs in which an erroneous word line WL is selected from a plurality of word lines WL, the abnormality can be detected.

Although the word line WL has been described in this example, the same applies to the column selection line Y.

Embodiment 6

Figure 60:
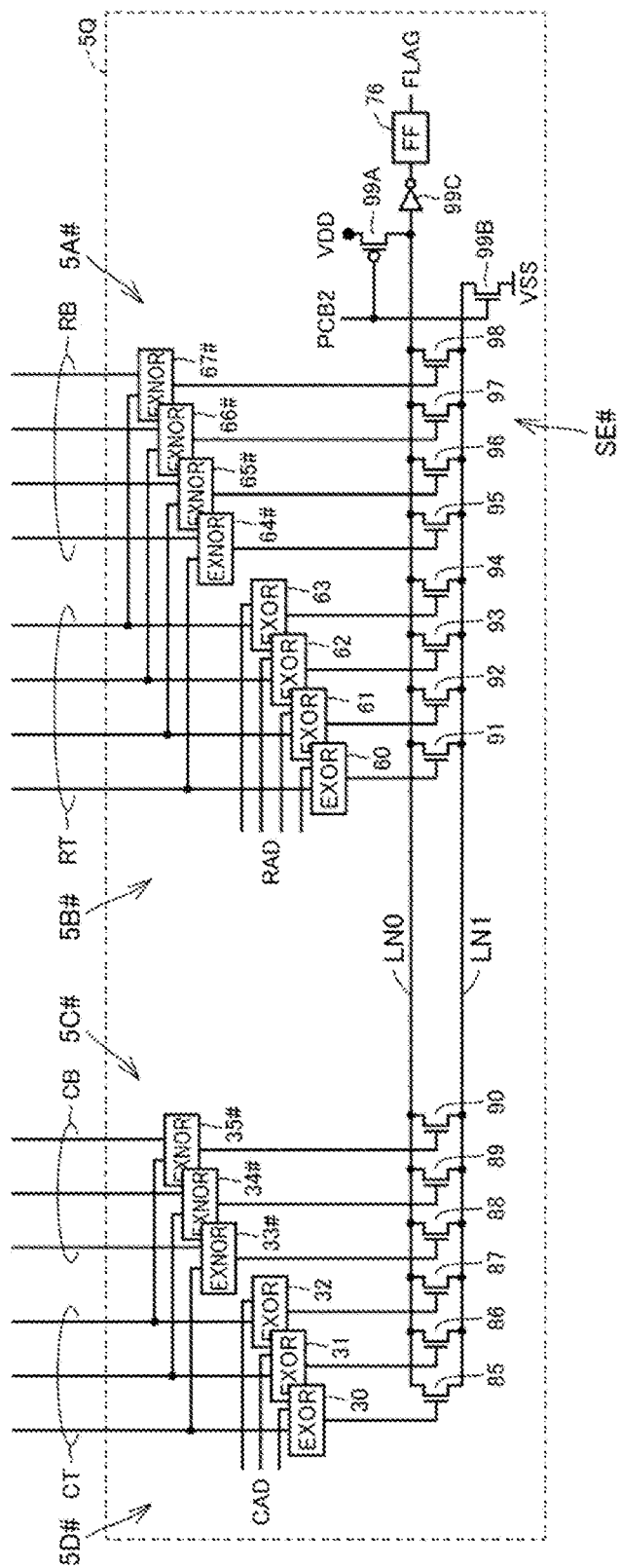
FIG. 60 is a diagram for explaining a circuit configuration of a detection circuit 5Q according to the sixth embodiment.

FIG. 60 is a diagram illustrating a circuit configuration of the detecting circuit 5Q according to the sixth embodiment.

Referring to FIG. 60, the detection circuit 5Q is a diagram illustrating a configuration that can be replaced with the detection circuit 5 of the first embodiment.

The detection circuit 5Q includes a first row determination circuit 5A #, a second row determination circuit 5B #, a first column determination circuit 5C #, a second column determination circuit 5D #, and a synthesis circuit 5E #.

The first row determination circuit 5A # includes EXNOR circuitry 64 # to 67 #.

The second row determination circuit 5B # includes EXOR circuitry 60-63.

The first column determination circuit 5C # includes EXNOR circuitry 33 # to 35 #.

The second column determination circuit 5D # includes EXOR circuitry 30-32.

The synthesizer OOB # includes N-channel MOS transistors 85 to 98, precharge transistors 99A and 99B, inverters 99C, flip-flops 76, and a data line LN0,LN1. Precharge transistor 99A is a P-channel MOS transistor. Precharge transistor 99B is an N-channel MOS transistor.

N-channel MOS transistors 85-98 are connected in parallel between the data-line LN0 and LN1. Precharge transistor 99A is provided between the power supply voltage VDD and the data line LN0, the gate receives the input of the control signal PCB2. Precharge transistor 99B is provided between the fixed voltage VSS and the data line LN1, the gate receives the input of the control signal PCB2.

The control signal PCB2 is set to "L" level before the detection operation and to "H" level during the detection operation. Accordingly, the data line LN0 is precharged to the "H" level. In the detecting operation, the data line LN1 is set to the "L" level.

Inverter 99C stores the data in the flip-flop (FF) by inverting the signal of the data line LN0.

The outputs of EXNOR circuitry 64 # to 67 # are connected to the gates of the N-channel MOS transistors 95 to 98, respectively.

The outputs of EXOR circuitry 60-63 are connected to the gates of the N-channel MOS transistors 91-94, respectively.

The outputs of EXNOR circuitry 33 # to 35 # are connected to the gates of the N-channel MOS transistors 88 to 90, respectively.

EXOR circuitry 30-32 is connected to the gates of the N-channel MOS transistors 85-87, respectively.

The first row determination circuit 5A # compares the first row address information RT and the second row address information RB to conduct the N-channel MOS transistors 95 to 98 based on the comparison result.

EXNOR circuits 64 # to 67 # receive respective one-bit inputs of the first row address information RT and the second row address information RB, and outputs a EXNOR logical operation result RBO.

The first row address information RT and the second row address information RB are complementary to each other when they are normal.

Therefore, when the first row address information RT and the second row address information RB are complementary to each other (normal), EXNOR logical operation results RBO of EXNOR circuits 64 # to 67 # are all outputted at "L" levels. In this case, the N-channel MOS transistors 95-98 all do not conduct. Therefore, the data line LN0 maintains the "H" level.

On the relationship hand, when the first row address information RT and the second row address information RB are not complementary to each other (when they are not normal), at least one of EXNOR logical operation results RBO of EXNOR circuits 64 # to 67 # outputs "H" levels. In this case, any one of the N-channel MOS transistors 95-98 is conductive. Therefore, the data line LN0 is connected to the data line LN1 and is set to the "L" level.

By data line LN0 is set to "L" level, the first row address information RT and the second row address information RB is not complementary (if not normal) is determined. That is, it is determined that the row decoder 4 has an anomaly and is not normally decoded.

Specifically, due to the anomaly of the row decoder 4, a multi-selection abnormality when a plurality of word lines WL is not selected and a multi-selection abnormality when a plurality of word lines WL among a plurality of word lines WL is selected are determined.

The second row determination circuit 5B # compares the input low address information RAD with the first low address information RT and conducts the N-channel MOS transistors 91 to 94 based on the comparison result.

EXOR circuits 60 to 63 receive the input of the input row address information RAD and the first row address information RT bit by bit, respectively, and outputs EXOR logical operation result RTO.

The input row address information RAD and the first row address information RT have the same relationship when they are normal.

Therefore, when the input low-address information RAD and the first low-address information RT are in the same relationship (when they are normal), all EXOR logical operation results RTO of EXOR circuitry 60 to 63 output the "L" level. In this case, the N-channel MOS transistors 91-94 all do not conduct. Therefore, the data line LN0 maintains the "H" level.

On the other hand, when the input row address information RAD and the first row address information RT do not have the same relation (when the input row address information RAD and the first row address information RT are not normal), at least one of EXOR logical operation results RTO of EXOR circuits 60 to 63 outputs "H" levels. In this case, at least one of the N-channel MOS transistors 91-94 is conductive. Therefore, the data line LN0 is connected to the data line LN1 and is set to the "L" level.

By data line LN0 is set to "L" level, it is determined that the input row address information RAD and the first row address information RT is not in the same relationship (if not normal). That is, it is determined that the row decoder 4 has an anomaly and is not normally decoded.

Specifically, an erroneous selection anomaly in which an erroneous word line WL is selected among the plurality of word lines WL is determined by an abnormality in the row decoder 4.

The first column determination circuit 5C # compares the first column address information CT and the second column address information CB to conduct the N-channel MOS transistors 88 to 90 based on the comparison result.

EXNOR circuits 33 # to 35 # receive respective one-bit inputs of the first column address information CT and the second column address information CB, and outputs a EXNOR logical operation result CBO.

The first column address information CT and the second column address information CB are complementary to each other when they are normal.

Therefore, when the first column address information CT and the second column address information CB are complementary to each other (normal), EXNOR logical operation results CBO of EXNOR circuits 33 # to 35 # all output "L" levels. In this case, the N-channel MOS transistors 88-90 all do not conduct. Therefore, the data line LN0 maintains the "H" level.

On the relationship hand, when the first column address information CT and the second column address information CT are not complementary to each other (when they are not normal), at least one of EXNOR logical operation results CBO of EXNOR circuits 33 # to 35 # outputs "H" levels. In this case, any one of the N-channel MOS transistors 88-90 is conductive. Therefore, the data line LN0 is connected to the data line LN1 and is set to the "L" level.

By the data line LN0 is set to the "L" level, it is determined that the first column address information CT and the second column address information CB are not complementary (if not normal). That is, it is determined that the column decoder 10 has an anomaly and is not normally decoded.

Specifically, a non-selection anomaly in the case where no plurality of column selection lines Y are selected and a multi-selection abnormality in the case where a plurality of column selection lines Y are selected among the plurality of column selection lines Y are determined by an abnormality of the column decoder 10.

The second column determination circuit 5D # compares the input column address information CAD with the first column address information CT to conduct the N-channel MOS transistors 85-87 based on the comparison result.

Each of EXOR circuits 30 to 32 receives one-bit input of the input column address information CAD and the first column address information CT, and outputs a EXOR logical operation result CTO.

The input column address information CAD and the first column address information CT have the same relationship when they are normal.

Therefore, when the input column address information CAD and the first column address information CT are in the same relationship (when they are normal), all EXOR logical operation result CTO of EXOR circuitry 30 to 32 outputs the "L" level. In this case, the N-channel MOS transistors 85-87 all do not conduct. Therefore, the data line LN0 maintains the "H" level.

On the other hand, when the input column address information CAD and the first column address information CT do not have the same relation (when the input column address information CAD and the first column address information CT are not normal), at least one of EXOR logical operation results CTO of EXOR circuits 30 to 32 outputs "H" levels. In this case, any one of the N-channel MOS transistors 85-87 is conductive. Therefore, the data line LN0 is connected to the data line LN1 and is set to the "L" level.

When the data line LN0 is set to the "L" level, it is determined that the input column address information CAD and the first column address information CT are not in the same relationship (when not normal). That is, it is determined that the column decoder 10 has an anomaly and is not normally decoded.

More specifically, an erroneous selection anomaly in which an erroneous column selection line Y is selected among the plurality of column selection lines Y is determined by an abnormality in the column decoder 10.

When the data line LN0 is "L" level in the synthesis circuit 5E #, the "H" level is stored in the flip-flop 76. When the data line LN0 is at the "H" level, the data line stores the "L" level in the flip-flop 76.

The flip-flop 76 outputs abnormal signals FLAG based on the stored data.

With this configuration, it is possible to reduce the number of parts of the logic circuit as compared with the configuration of the first embodiment. That is, it is possible to realize the same detection circuit 5Q as the detection circuit 5 described in the first embodiment in a simple method by reducing the number of N-channel MOS transistors or the like. As a result, the layout area can also be reduced.

Embodiment 7

In the seventh embodiment, a description will be given of a configuration of a test circuit of a semiconductor device.

Figure 61:
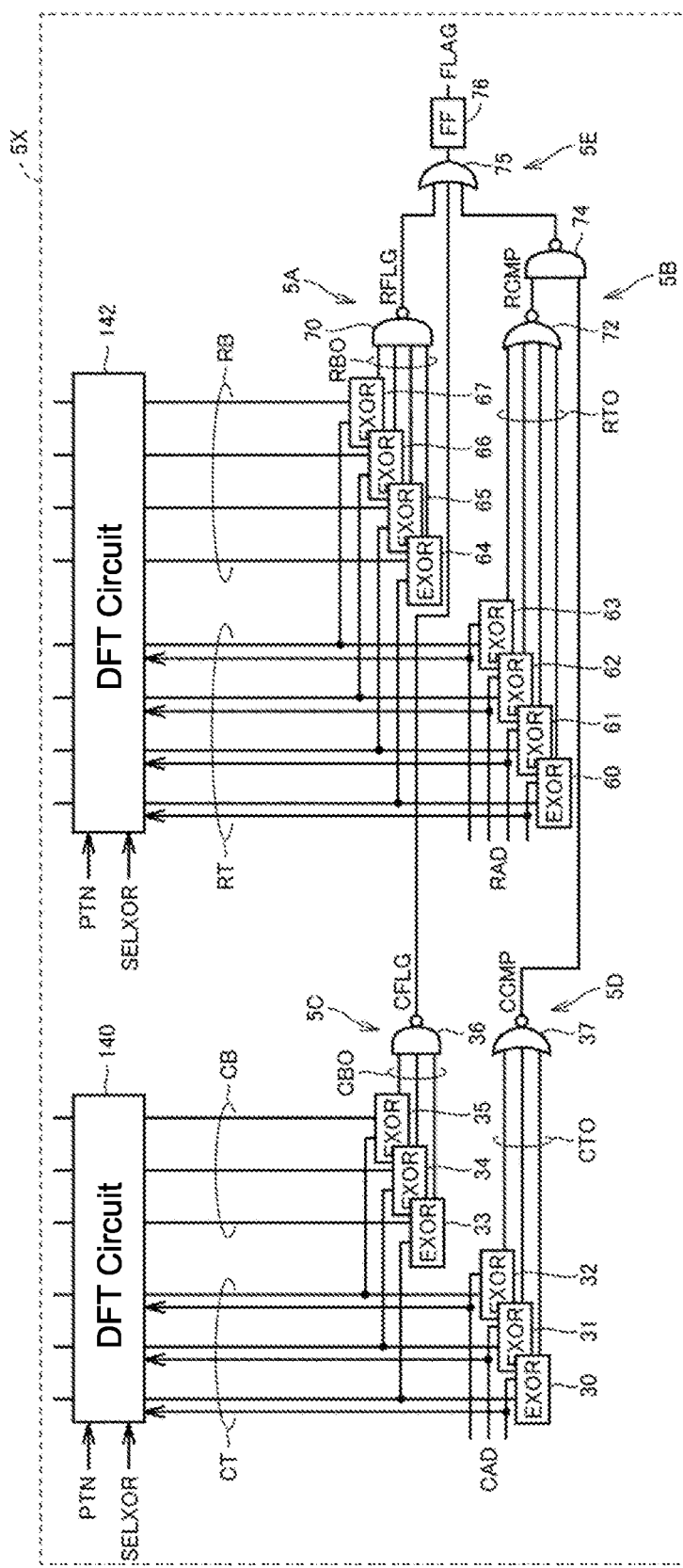
FIG. 61 is a diagram for explaining a configuration of a detector 5X according to the seventh embodiment.

FIG. 61 is a diagram illustrating a configuration of a detecting circuit 5X according to the seventh embodiment.

Referring to FIG. 61, the detection circuit 5X differs in that further added DFT (Design For Test) circuit 140,142 as compared to the detection circuit 5 detected in FIG. 3.

Since the other configurations are the same, detailed description thereof will not be repeated.

DFT circuit 142 sets the control signal PTN, the first row address information RT and the second row address information RB based on the control signal SELXOR and the input row address information RAD.

DFT circuit 140 sets the first column address information CT and the first column address information RB based on the control signal PTN, the control signal SELXOR and the input column address information CAD.

Therefore, it is possible to perform a test operation for the detection circuit 5 without operating the row decoder 4 and column decoder 10.

Figure 62:
FIG. 62 is a diagram illustrating a test pattern of the DFT circuit 140, 142 according to the seventh embodiment.

FIG. 62 is a diagram illustrating a test pattern of the DFT circuit 140,142 according to the seventh embodiment.

As shown in FIG. 62, the DFT circuit 140,142, the control signal PTN, the control signal SELXOR, is set to output various test patterns based on the input row address information RAD and the input column address information CAD.

As an example, the second row address information RB and the second column address information are set in accordance with the control signal PTN.

For example, the DFT circuits 140 and 142 have the second row address information RB[0] to RB[3] and the second column address information CB[0] in accordance with the control signal PTN ("L" level).

Set all]-CB[2] to "H" level.

The DFT circuits 140 and 142 set the second row address information RB[0] to RB[3] and the second column address information CB[0] to CB[2] to the "L" level in accordance with the control signal PTN ("H" level).

Further, the DFT circuit 142 sets the first low address information RT [0] to RT [3] based on the combination of the control signal SELXOR and the input low address information RAD.

Further, the DFT circuit 140 sets the first column address information CT [0] to CT [2] based on the combination of the control signal SELXOR and the input column address information CAD.

In the present embodiment, the output of EXOR circuits and the setting results of the control signals FLAG based on the setting of the second row address information RB, the second column address information CB, the first row address information RT, and the first column address information CT are shown.

The second row address information RB, the second column address information CB, the first row address information RT, and the first column address information CT are set based on the test pattern, and when the output of EXOR circuit and the control signal FLAG based on the setting differ from the expected result, the anomaly of the target EXOR circuit can be determined.

By providing the DFT circuit 140,142 as in the present method, EXOR circuits 30 to 35 and 60 to 67 provided in the detection circuit 5 can be tested one by one, and it is possible to confirm whether or not EXOR circuit operates normally.

Modification 1 of Embodiment 7

Figure 63:
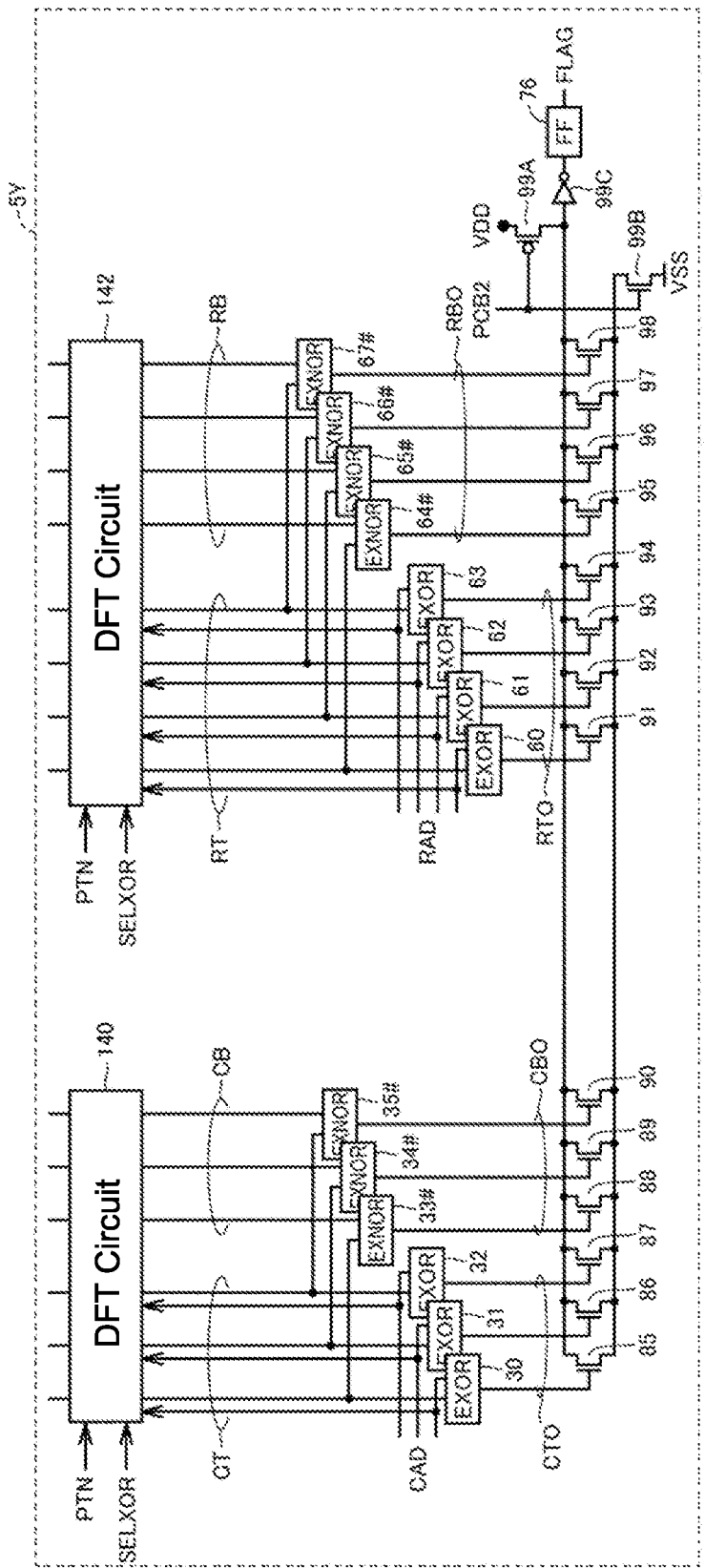
FIG. 63 is a diagram for explaining a configuration of a detector 5Y according to a modification 1 of the seventh embodiment.

FIG. 63 is a diagram illustrating a configuration of a detector 5Y according to a first modification of the seventh embodiment.

Referring to FIG. 63, the detection circuit 5Y is DFTs (Design) to the detection circuit 5Q detected in FIG. 60 For Test) The difference is that circuits 140 and 142 are further added.

Since the other configurations are the same, detailed description thereof will not be repeated.

DFT circuit 142 sets the control signal PTN, the first row address information RT and the second row address information RB based on the control signal SELXOR and the input row address information RAD.

DFT circuit 140 sets the first column address information CT and the first column address information RB based on the control signal PTN, the control signal SELXOR and the input column address information CAD.

Therefore, it is possible to perform a test operation for the detection circuit 5 without operating the row decoder 4 and column decoder 10.

Figure 64:
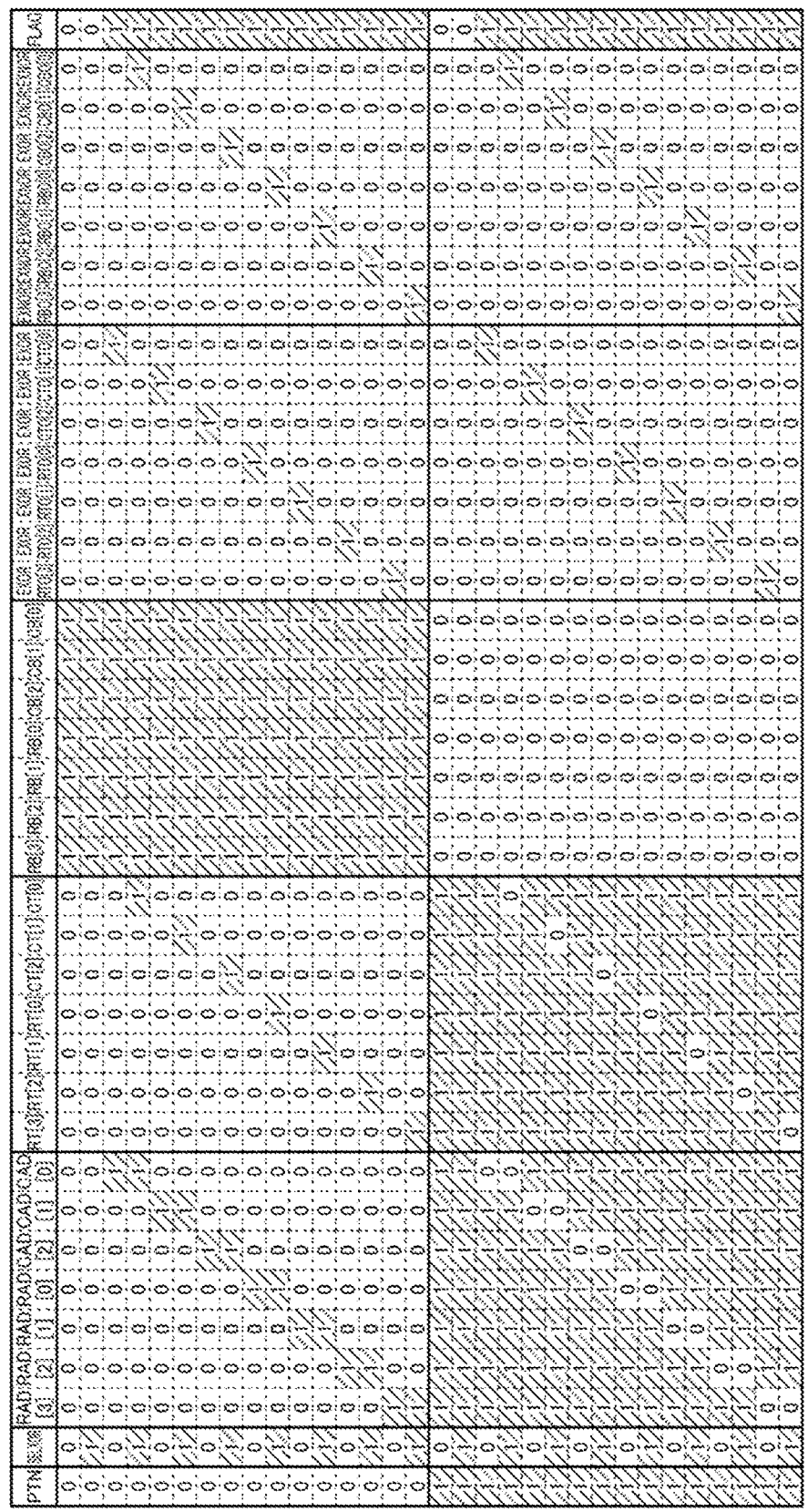
FIG. 64 is a diagram illustrating a test pattern of the DFT circuit 140, 142 according to a modification 1 of the seventh embodiment.

FIG. 64 is a diagram illustrating a test pattern of the DFT circuit 140,142 according to a modification 1 of the seventh embodiment.

As shown in FIG. 64, the DFT circuit 140,142, the control signal PTN, the control signal SELXOR, is set to output various test patterns based on the input row address information RAD and the input column address information CAD.

As an example, the second row address information RB and the second column address information are set in accordance with the control signal PTN.

For example, the DFT circuits 140 and 142 set the second row address information RB[0] to RB[3] and the second column address information CB[0] to CB[2] to the "H" level in accordance with the control signal PTN ("L" level).

The DFT circuits 140 and 142 set the second row address information RB[0] to RB[3] and the second column address information CB[0] to CB[2] to the "L" level in accordance with the control signal PTN ("H" level).

Further, the DFT circuit 142 sets the first low address information RT [0] to RT [3] based on the combination of the control signal SELXOR and the input low address information RAD.

Further, the DFT circuit 140 sets the first column address information CT [0] to CT [2] based on the combination of the control signal SELXOR and the input column address information CAD.

In the present embodiment, the output of EXOR circuits and the setting results of the control signals FLAG based on the setting of the second row address information RB, the second column address information CB, the first row address information RT, and the first column address information CT are shown.

When the second row address information RB, the second column address information CB, the first row address information RT, and the first column address information CT are set based on the test pattern, and the outputs of EXOR circuit and EXNOR circuit and the control signal FLAG based on the setting differ from the expected result, the abnormalities of EXOR circuit and EXNOR circuit 2 can be determined.

By providing the DFT circuit 140,142 as in the present method, EXOR circuits 30 to 32, 60 to 63 and EXNOR circuits 33 to #35 and #64 to #67 # provided in the detection circuit 5 can be tested one by one, and it is possible to confirm whether EXNOR circuit and the circuit operate normally or not.

Modification 2 of Embodiment 7

Figure 65:
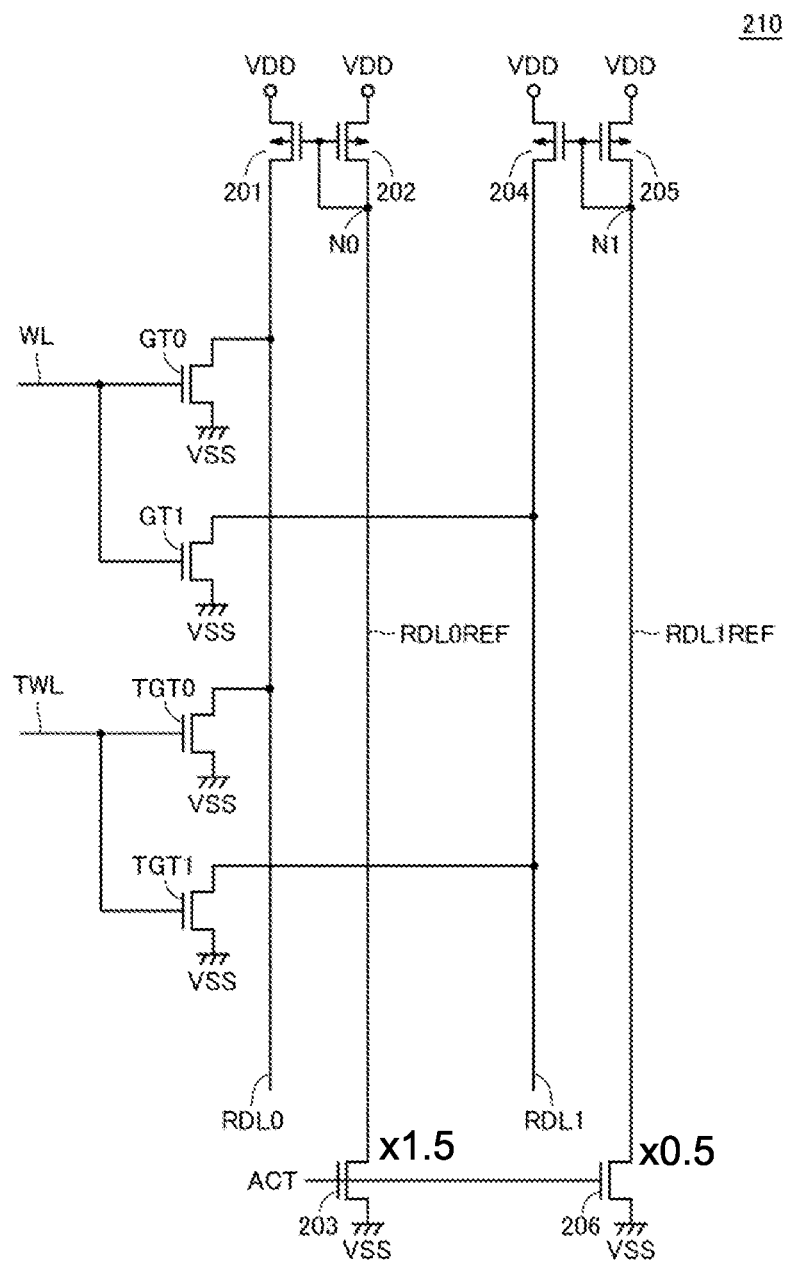
FIG. 65 is a diagram illustrating a decoder failure detection circuit 210 of the row side according to a modification 2 of the seventh embodiment.

FIG. 65 is a diagram illustrating a decoder failure detection circuit 210 on the row side according to a modification 2 of the seventh embodiment. In this example, a case where a test circuit is provided in the decoder failure detection circuit will be described.

Referring to FIG. 65, compared to the decoder fault detection circuitry 200 on the row side of FIG. 36, differs in that the word line TWL for testing and the gate transistor TGT0,TGT1 for testing are further added.

A gate transistor TGT0 for testing is provided between a data line RDL0 and a fixed voltage VSS, the gate of which is connected to a word line TWL for testing.

A gate transistor TGT1 for testing is provided between a data line RDL1 and a fixed voltage VSS, the gate of which is connected to a word line TWL for testing.

With this configuration, the test operation can be performed by driving the word line TWL for testing without driving the row decoder 4 to operate the gate transistor TGT0,TGT1 for testing to set the data line RDL0,RDL1.

Thus, it is possible to confirm whether the operation of the decoder failure detection circuit 210 on the row side operates normally.

It is also possible to confirm whether the operation of the decoder failure detection circuit on the column side operates normally by providing a test circuit in the decoder failure detection circuit on the column side, not limited to the row side.

Modification 3 of Embodiment 7

Figure 66:
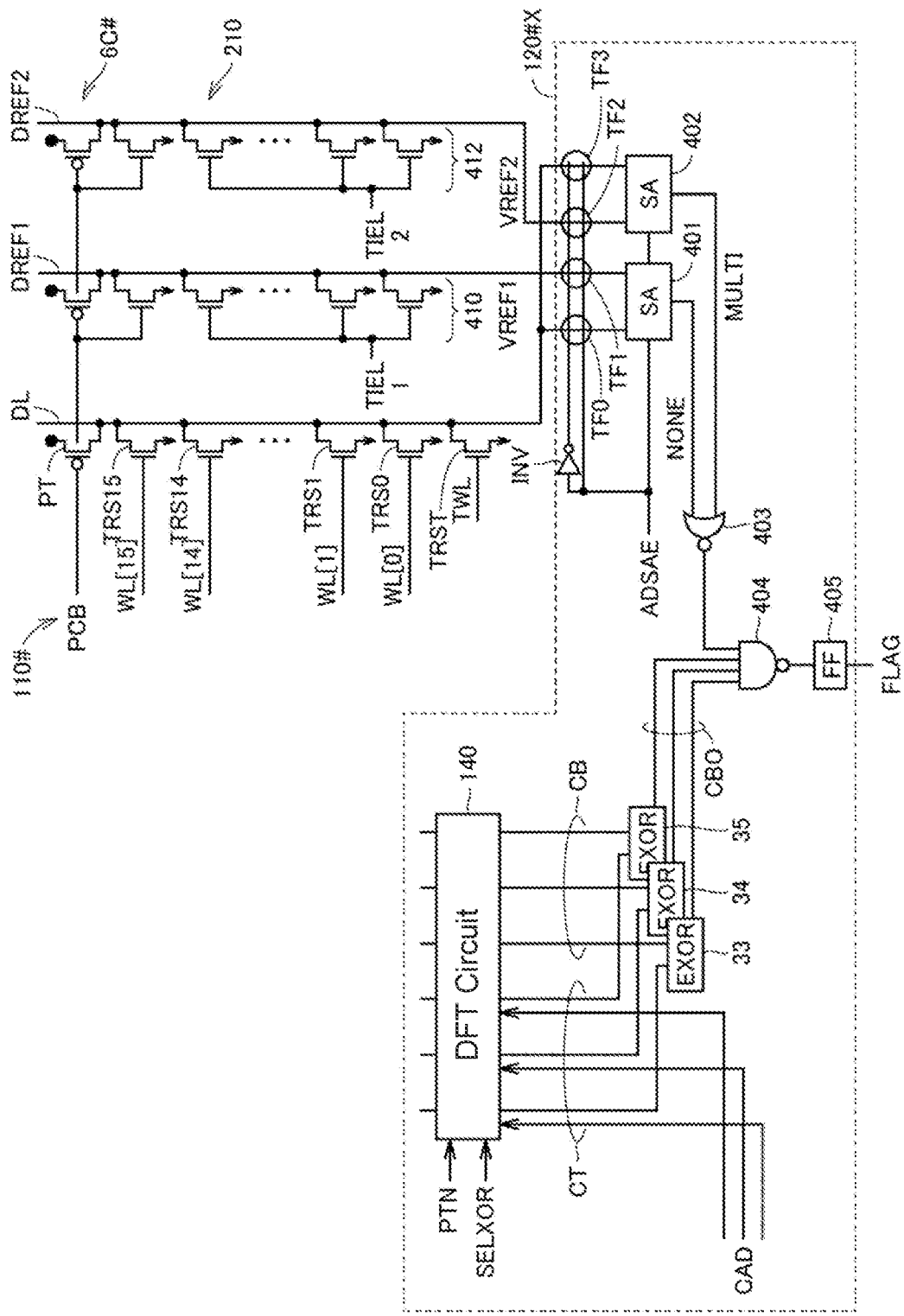
FIG. 66 is a diagram illustrating a circuit configuration of a decoder failure detection circuit 110 #X and the determination circuit 120 #X according to a modification 3 of the seventh embodiment.

FIG. 66 is a diagram illustrating a circuit configuration of a decoder failure detection circuit 110 #X and a determination circuit 120 #X according to a third modification of the seventh embodiment. In this example, a case will be described in which a test circuit is provided in the decoder failure detection circuit 110 #X and the determination circuit 120 #X.

Referring to FIG. 66, compared to the configuration described in FIG. 43, it differs in that a DFT circuit 140 is provided in the determination circuit 120 #X, a word line TWL for testing is further added to the decoder failure detection circuit 110 #, and a gate transistor TRST for testing is further added.

A gate transistor TRST for testing is provided between the data line DL and the fixed voltage VSS, the gate of which is connected to the word line TWL for testing.

The DFT circuit 140 is the same as that described above, and therefore a detailed description thereof will not be repeated.

Further, by driving the word line TWL for testing, the gate transistor TRST can be operated to set the data line DL.

With this configuration, without driving the row decoder 4 and the column decoder 10, it is possible to perform a test operation by using the word lines TWL and DFT circuit 140 for testing to confirm whether the operation of the decoder failure detection circuit 110 #X and the determination circuit 120 #X operates normally.

Modification 4 of Embodiment 7

Figure 67:
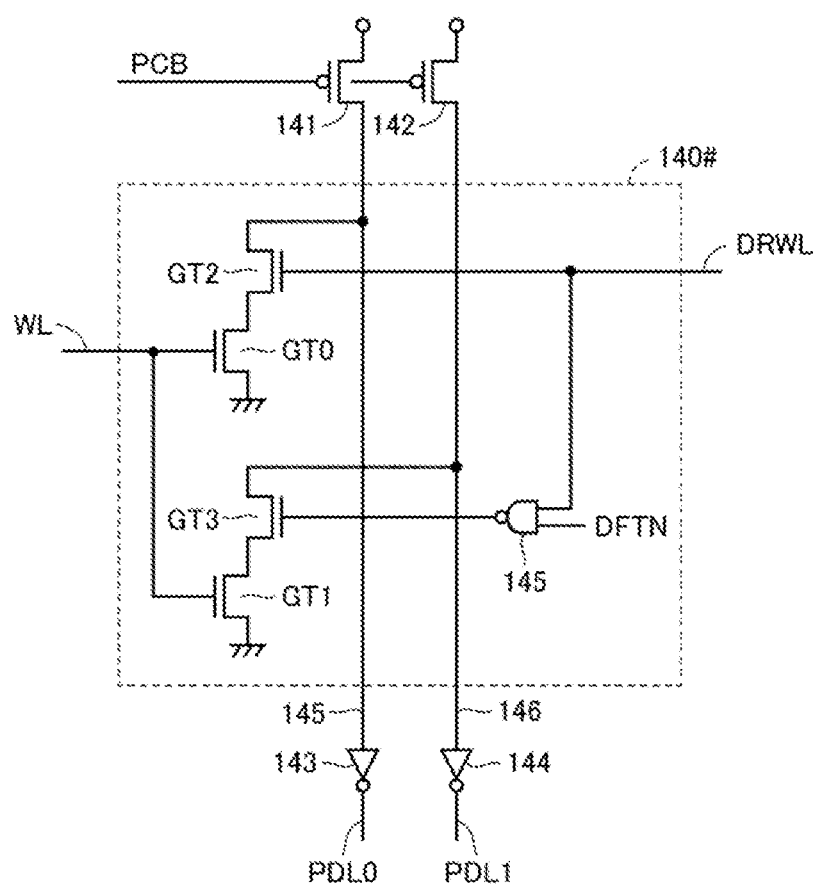
FIG. 67 It is a diagram for explaining a detection unit 140 # of the detection circuit 132 according to a modification 4 of the seventh embodiment.

FIG. 67 is a diagram illustrating the detection unit 140 # of the detection circuit 132 according to the fourth modification of the seventh embodiment.

Referring to FIG. 67, the detection unit 140 # differs from the detection unit 140 in that a NAND circuitry 145 is provided in place of the inverter-INV.

NAND circuitry 145 receives the input of the signal and the control signal DFTN of the low selection war DRWL of the dummy, and outputs NAND logical operation result to the gate transistor GT3.

If the control signal DFTN is set to "H" level, NAND circuitry 145 functions as an inverter. That is, the configuration is the same as that of the detection unit 140 described in FIG. 52.

Further, when the control signal DFTN is set to "L" level, the gate transistor GT3 is conductive. Therefore, by setting the word line WL to the "H" level, it is possible to intentionally set the voltage signal of any combination of the data lines 145,146.

With this configuration, it is possible to execute the test operation of the detection circuit 132, the detection circuit 132 to confirm whether or not to operate normally.

Although the present disclosure has been specifically described based on the embodiments described above, the present disclosure is not limited to the embodiments, and it is needless to say that various modifications can be made without departing from the gist thereof.

What is claimed is:

1. A semiconductor device comprising:
   a memory cell array arranged in a matrix;
   a plurality of word lines provided corresponding to each row of the matrix of the memory cell array;
   a word driver configured to drive one of the word lines;
   a plurality of row selecting lines coupled to the word driver;
   a first row encoder coupled to the word lines and configured to generate first row address information based on signal levels of the word lines;
   a second row encoder coupled to the word lines and configured to generate second row address information which is complementary to the first row address information;
   a first row determination circuit configured to output a first row determination signal based on a comparison between the first row address information and the second row address information;
a plurality of bit lines provided corresponding to each column of the matrix of the memory cell array;
a column selecting circuit configured to select one of the bit lines;
a plurality of column selecting lines coupled to the column selecting circuit;
a column decoder configured to output column selecting signals to the column selecting lines based on input column address information;
a first column encoder coupled to the column selecting lines and configured to output first column address information based on signal levels of the column selecting lines;
a second column encoder coupled to the column selecting lines and configured to output second column address information which is complementary to the first column address information based on signal levels of the column selecting lines;
a first column determination circuit configured to output a first column determination signal based on a comparison between the first column address information and the second column address information;
a second row determination circuit configured to output a second row determination signal based on a comparison between input row address information and the first row address information;
a second column determination circuit configured to output a second column determination signal based on a comparison between the input column address information and the first column address information;
an output row address information generating circuit configured to generate output row address information based on the first column determination signal and the first row address information; and
an output column address information generating circuit configured to generate output column address information based on the first row determination signal and the first column address information.

2. The semiconductor device according to claim 1 further comprising an address comparison circuit configured to compare input address information and output address information,
wherein the input address information includes the input row address information and the input column address information, and
wherein the output address information includes the output row address information and the output column address information.

3. The semiconductor device according to claim 1, further comprising a first test circuit configured to output a first test pattern signal to the first row encoder and the second row encoder when in a test state.

4. The semiconductor device according to claim 1, further comprising a second test circuit configured to output a second test pattern signal to the first column encoder and the second column encoder when in a test state.

5. A semiconductor device comprising:
a memory cell array arranged in a matrix;
a plurality of word lines provided corresponding to each row of the matrix of the memory cell array;
a word driver configured to drive one of the word lines;
a plurality of row selecting lines coupled to the word driver;
a first row encoder coupled to the word lines and configured to generate first row address information based on signal levels of the word lines;
a second row encoder coupled to the word lines and configured to generate second row address information which is complementary to the first row address information;
a first row determination circuit configured to output a first row determination signal based on a comparison between the first row address information and the second row address information;
a plurality of bit lines provided corresponding to each column of the matrix of the memory cell array;
a column selecting circuit configured to select one of the bit lines;
a plurality of column selecting lines coupled to the column selecting circuit;
a column decoder configured to output column selecting signals to the column selecting lines based on input column address information;
a first column encoder coupled to the column selecting lines and configured to output first column address information based on signal levels of the column selecting lines;
a second column encoder coupled to the column selecting lines and configured to output second column address information which is complementary to the first column address information based on signal levels of the column selecting lines;
a first column determination circuit configured to output a first column determination signal based on a comparison between the first column address information and the second column address information;
a comparison result determination circuit configured to generate a comparison result signal based on the first row determination signal and the first column determination signal;
an output row address information generating circuit configured to generate output row address information based on the comparison result signal and the first row address information; and
an output column address information generating circuit configured to output output column address information based on the comparison result signal and the first column address information.

* * * * *